US012432921B2

(12) United States Patent
Wang et al.

(10) Patent No.: US 12,432,921 B2
(45) Date of Patent: Sep. 30, 2025

(54) THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventors: Di Wang, Wuhan (CN); Zhong Zhang, Wuhan (CN); Wenxi Zhou, Wuhan (CN); Zhiliang Xia, Wuhan (CN); Zongliang Huo, Wuhan (CN); Wei Xie, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 420 days.

(21) Appl. No.: 17/968,595

(22) Filed: Oct. 18, 2022

(65) Prior Publication Data

US 2024/0107761 A1    Mar. 28, 2024

Related U.S. Application Data

(63) Continuation of application No. PCT/CN2022/120958, filed on Sep. 23, 2022.

(51) Int. Cl.
*H10B 43/40*    (2023.01)
*H01L 23/528*    (2006.01)
(Continued)

(52) U.S. Cl.
CPC ......... *H10B 43/27* (2023.02); *H01L 23/5283* (2013.01); *H10B 41/10* (2023.02);
(Continued)

(58) Field of Classification Search
CPC ......... H10B 43/40; H10B 41/40; H10B 43/50
See application file for complete search history.

(56) References Cited

U.S. PATENT DOCUMENTS 9,425,391 B1    8/2016   Lai et al.
2014/0162420 A1  6/2014   Oh et al.
(Continued)

FOREIGN PATENT DOCUMENTS

CN    102956641 A    3/2013
CN    113519056 A    10/2021
(Continued)

OTHER PUBLICATIONS

International Search Report issued in corresponding International Application No. PCT/CN2022/120955, mailed Jan. 12, 2023, 4 pages.
(Continued)

*Primary Examiner* — Christopher A Johnson
(74) *Attorney, Agent, or Firm* — BAYES PLLC

(57) ABSTRACT

In certain aspects, a method for forming a three-dimensional (3D) memory device is disclosed. A stack structure including interleaved first dielectric layers and second dielectric layers is formed. Channel structures extending through the first dielectric layers and the second dielectric layers in a first region of the stack structure are formed. All the second dielectric layers in the first region and parts of the second dielectric layers in a second region of the stack structure are replaced with conductive layers. Word line pick-up structures extending through the first dielectric layers and remainders of the second dielectric layers in the second region of the stack structure are formed at different depths, such that the word line pick-up structures are electrically connected to the conductive layers, respectively, in the second region of the stack structure.

20 Claims, 43 Drawing Sheets

(51) Int. Cl.
  *H10B 41/10* (2023.01)
  *H10B 41/27* (2023.01)
  *H10B 41/35* (2023.01)
  *H10B 43/10* (2023.01)
  *H10B 43/27* (2023.01)
  *H10B 43/35* (2023.01)

(52) U.S. Cl.
  CPC ............ *H10B 41/27* (2023.02); *H10B 41/35* (2023.02); *H10B 43/10* (2023.02); *H10B 43/35* (2023.02)

(56) References Cited

U.S. PATENT DOCUMENTS

| | | |
|---|---|---|
| 2014/0175365 A1 | 6/2014 | Chang et al. |
| 2015/0311209 A1 | 10/2015 | Whang et al. |
| 2016/0093524 A1 | 3/2016 | Izumi et al. |
| 2020/0105783 A1 | 4/2020 | Baek |
| 2020/0119042 A1 | 4/2020 | Chen et al. |
| 2021/0066297 A1 | 3/2021 | Matsumoto et al. |
| 2021/0225872 A1 | 7/2021 | Sun et al. |
| 2021/0287991 A1 | 9/2021 | Sun et al. |
| 2021/0296334 A1 | 9/2021 | Zhang et al. |
| 2022/0077236 A1 | 3/2022 | Fantini et al. |
| 2022/0148971 A1 | 5/2022 | Lamborn et al. |
| 2022/0173118 A1 | 6/2022 | Kang et al. |
| 2023/0080606 A1* | 3/2023 | Lee ................. H10B 41/27 257/314 |

FOREIGN PATENT DOCUMENTS

| | | |
|---|---|---|
| CN | 114420185 A | 4/2022 |
| CN | 114730770 A | 7/2022 |
| JP | 2022501828 A | 1/2022 |
| JP | 2022529163 A | 6/2022 |
| KR | 10-2021-0141561 A | 11/2021 |
| TW | 202209631 A | 3/2022 |
| WO | 2020177049 A1 | 9/2020 |

OTHER PUBLICATIONS

Extended European Search Report issued in corresponding European Application No. 22 81 7508, mailed Oct. 26, 2023, 9 pages.
Communication pursuant to Article 94(3) EPC issued in corresponding European Application No. 22817508.9, mailed on Jan. 21, 2025.
International Search Report issued in corresponding International Application No. PCT/CN2022/120958, mailed May 24, 2023, 4 pages.
Supplementary European Search Report issued in corresponding European Application No. 22 81 4281, mailed on Apr. 24, 2024, 8 pages.

* cited by examiner

THREE-DIMENSIONAL MEMORY DEVICES AND METHODS FOR FORMING THE SAME

CROSS-REFERENCE TO RELATED APPLICATIONS

This application is a continuation of International Application No. PCT/CN2022/120958, filed on Sep. 23, 2022, entitled "THREE-DIMENSIONAL MEMORY DEVICES AND METHODS FOR FORMING THE SAME," which is hereby incorporated by reference in its entirety. This application is also related to U.S. application Ser. No. 17/968,577, filed on Oct. 18, 2022, entitled "THREE-DIMENSIONAL MEMORY DEVICES AND METHODS FOR FORMING THE SAME," which is hereby incorporated by reference in its entirety.

BACKGROUND

The present disclosure relates to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

In one aspect, a method for forming a 3D memory device is disclosed. A stack structure including interleaved first dielectric layers and second dielectric layers is formed. Channel structures extending through the first dielectric layers and the second dielectric layers in a first region of the stack structure are formed. All the second dielectric layers in the first region and parts of the second dielectric layers in a second region of the stack structure are replaced with conductive layers. Word line pick-up structures extending through the first dielectric layers and remainders of the second dielectric layers in the second region of the stack structure are formed at different depths, such that the word line pick-up structures are electrically connected to the conductive layers, respectively, in the second region of the stack structure.

In some implementations, dummy channel structures extending through the first dielectric layers and the second dielectric layers in the second region of the stack structure are formed in a same process of forming the channel structures.

In some implementations, to replace, a slit extending through the first dielectric layers and the second dielectric layers and across the first region and the second region of the stack structure is formed before forming the word line pick-up structures.

In some implementations, to replace, the slit in the second region of the stack structure is covered, all the second dielectric layers in the first region of the stack structure in the first region of the stack structure are removed through the slit, the slit in the second region of the stack structure is opened, the parts of the second dielectric layers in the second region of the stack structure are removed through the slit in the second region of the stack structure, and the conductive layers are deposited through the slit in the first region and the second region of the stack structure.

In some implementations, to replace, the slit in the first region of the stack structure is covered, the parts of the second dielectric layers in the second region of the stack structure in the second region of the stack structure are removed through the slit, the slit in the first region of the stack structure is opened, the slit in the second region of the stack structure is covered, all the second dielectric layers in the first region of the stack structure are removed through the slit in the first region of the stack structure, the slit in the second region of the stack structure is opened, and the conductive layers are deposited through the slit in the first region and the second region of the stack structure.

In some implementations, a first spacer is formed in the slit before forming the word line pick-up structures.

In some implementations, to form the word line pick-up structures, word line pick-up openings extending through the first dielectric layers and the remainders of the second dielectric layers in the second region of the stack structure are formed at different depths to expose the remainders of the second dielectric layers in the second regions of the stack structure, respectively, parts of the remainders of the second dielectric layers in the second region of the stack structure are replaced, through the word line pick-up openings, with interconnect lines, respectively, such that the interconnect lines are in contact with the conductive layers, respectively, in the second region of the stack structure, and vertical contacts in the word line pick-up openings are formed in contact with the interconnect lines, respectively.

In some implementations, to form the word line pick-up structures, a second spacer is formed on sidewalls and a bottom of each of the word line pick-up openings, the second spacer on the bottom of the word line pick-up opening is removed to expose the respective part of the remainder of the second dielectric layer, and a filler is formed in the word line pick-up opening after forming the respective vertical contact.

In some implementations, to replace the parts of the second dielectric layers with the interconnect lines, the exposed part of the remainder of the second dielectric layer is etched through the word line pick-up opening to expose the respective conductive layer in the second region of the stack structure, and the respective interconnect line is deposited through the word line pick-up opening to be in contact with the exposed respective conductive layer in the second region of the stack structure.

In some implementations, to replace all the second dielectric layers and the parts of the second dielectric layers with the conductive layers, high dielectric constant (high-k) gate dielectric layers are deposited, such that the conductive layers are surrounded by the high-k gate dielectric layers, respectively. In some implementations, to replace the parts of the second dielectric layers with the interconnect lines, the exposed part of the remainder of the second dielectric layer is etched to expose the respective high-k gate dielectric layer, the exposed high-k gate dielectric layer is etched to expose the respective conductive layer, and the respective interconnect line is deposited to be in contact with the exposed respective conductive layer.

In another aspect, a 3D memory device includes a first stack structure including interleaved conductive layers and first dielectric layers, a second stack structure including interleaved second dielectric layers and the first dielectric layers, dummy channel structures extending through the first stack structure, and word line pick-up structures extending into the second stack structure at different depths. Each of the word line pick-up structures includes a vertical contact, and an interconnect line in contact with the vertical contact and a respective one of the conductive layers in the first stack structure.

In some implementations, dummy channel structures extending through the first dielectric layers and the second dielectric layers in the second region of the stack structure are formed in a same process of forming the channel structures.

In some implementations, to form the word line pick-up structures, word line pick-up openings extending through the first dielectric layers and the second dielectric layers in the second region of the stack structure are formed at different depths to expose the second dielectric layers in the second regions of the stack structure, respectively, parts of the second dielectric layers in the second region of the stack structure are replaced, through the word line pick-up openings, with interconnect lines, respectively, and vertical contacts in the word line pick-up openings are formed in contact with the interconnect lines, respectively.

In some implementations, to form the word line pick-up structures, a second spacer is formed on sidewalls and a bottom of each of the word line pick-up openings, the second spacer on the bottom of the word line pick-up opening is removed to expose the respective part of the second dielectric layer, and a filler is formed in the word line pick-up opening after forming the respective vertical contact.

In some implementations, to replace the parts of the second dielectric layers with the interconnect lines, the exposed part of the remainder of the second dielectric layer is etched through the word line pick-up opening, and the respective interconnect line is deposited through the word line pick-up opening.

In some implementations, to replace all the second dielectric layers and the parts of the second dielectric layers with the conductive layers, a slit extending through the first dielectric layers and the second dielectric layers and across the first region and the second region of the stack structure is formed after forming the word line pick-up structures.

In some implementations, to replace all the second dielectric layers and the parts of the second dielectric layers with the conductive layers, the slit in the second region of the stack structure is covered, all the second dielectric layers in the first region of the stack structure in the first region of the stack structure are removed through the slit, the slit in the second region of the stack structure is opened, the parts of the second dielectric layers in the second region of the stack structure are removed through the slit in the second region of the stack structure to expose the interconnect lines of the word line pick-up structures, and the conductive layers are deposited through the slit in the first region and the second region of the stack structure to be in contact with the interconnect lines of the word line pick-up structures, respectively, in the second region of the stack structure.

In some implementations, to replace all the second dielectric layers and the parts of the second dielectric layers with the conductive layers, the slit in the first region of the stack structure is covered, the parts the second dielectric layers in the second region of the stack structure in the second region of the stack structure are removed through the slit to expose the interconnect lines of the word line pick-up structures, the slit in the first region of the stack structure is opened, the slit in the second region of the stack structure is covered, all the second dielectric layers in the first region of the stack structure are removed through the slit in the first region of the stack structure, the slit in the second region of the stack structure is opened, and the conductive layers are deposited through the slit in the first region and the second region of the stack structure to be in contact with the interconnect lines of the word line pick-up structures, respectively, in the second region of the stack structure.

In some implementations, a first spacer is formed in the slit before forming the word line pick-up structures.

In some implementations, to form the channel structures, a high-k gate dielectric layer, a memory layer, and a channel layer are sequentially formed.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
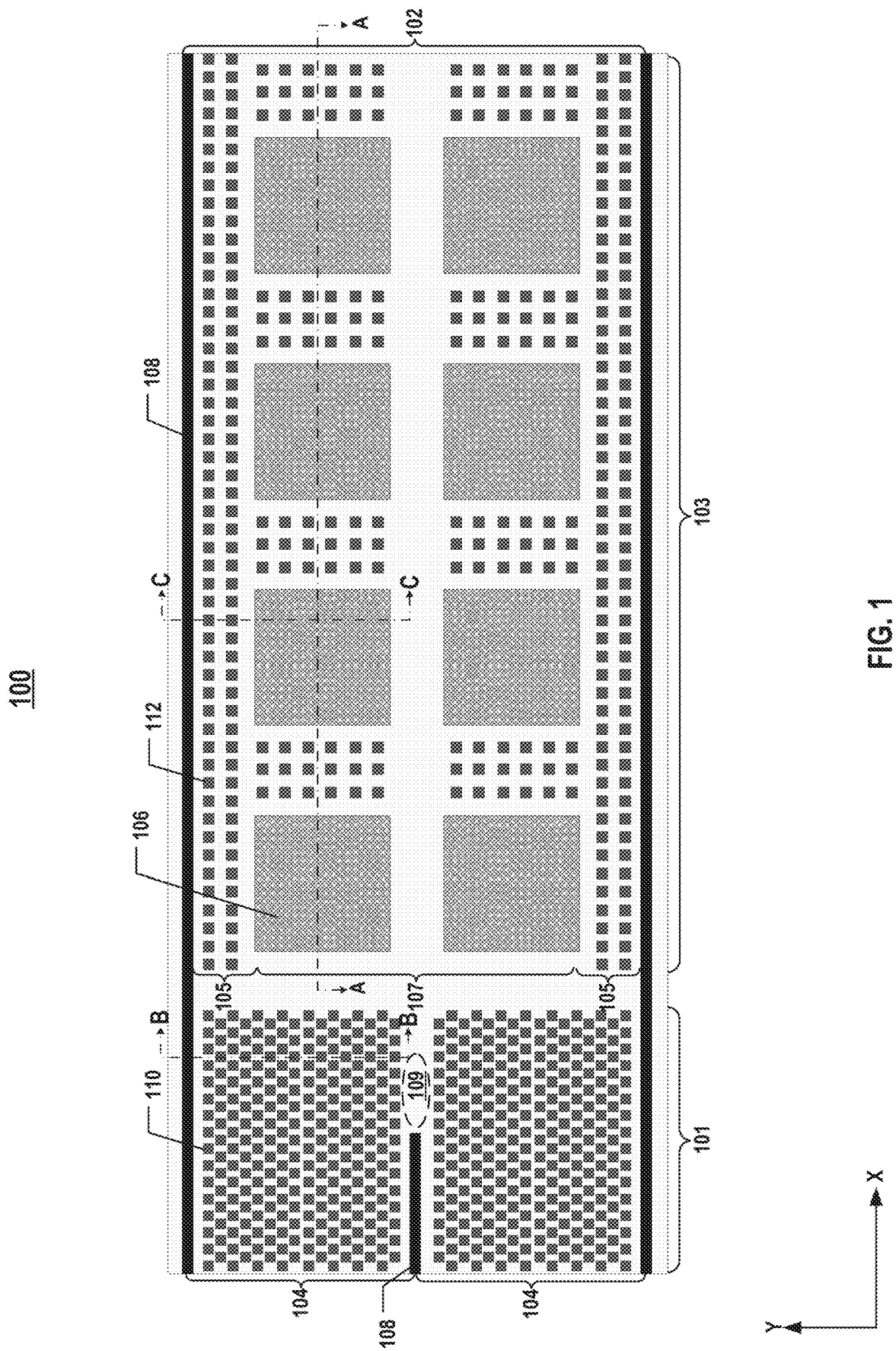
FIG. 1 illustrates a plan view of a 3D memory device having word line pick-up structures, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical contacts are formed) and one or more dielectric layers.

In some 3D memory devices, such as 3D NAND memory devices, memory cells for storing data are vertically stacked through a stack structure (e.g., a memory stack) in vertical channel structures. 3D memory devices usually include staircase structures formed on one or more sides (edges), or at the center, of the stacked storage structure for purposes such as word line pick-up/fan-out using word line contacts landed onto different steps/levels of a staircase structure. Dummy channel structures are usually formed through the memory stack in regions outside of the core array region in which the channel structures of 3D NAND memory devices are formed, such as staircase regions having the staircase structures, to provide mechanical support to the stack structure, in particular, during the gate replacement process that temporarily removes some layers of the stack structure through slit openings across the core array region and staircase regions of the stack structure.

The integration of the various structures, such as dummy channel structures, word lien contacts, staircase structures, slit openings, etc., from both the device design perspective and the fabrication process perspective, has become more and more challenging as the memory cell density of the 3D NAND memory devices continues increasing.

To address one or more of the aforementioned issues, the present disclosure introduces a solution that achieves the word line pick-up/fan-out functions without using staircase structures and word line contacts. The present disclosure can use a relatively simple single process of making word line pickup structures to replace the relatively complicated multiple processes of making staircase structures and word line contacts. That is, the two structures-staircase structure and word line contact, as well as their separate processes, can be merged into a single word line pick-structure in one process, thereby reducing the manufacturing cost and simplifying the process. Moreover, by replacing staircase structures and word line contacts with word line pick-structures, the scope of the gate replacement process can be reduced, such that at least some of the dummy channel structures can be eliminated as well to further reduce the cost and simplify the process.

FIG. 1 illustrates a plan view of a 3D memory device 100 having word line pick-up structures 106, according to some aspects of the present disclosure. In some implementations, 3D memory device 100 is a NAND Flash memory device in which memory cells are provided in the form of an array of NAND memory strings. It is noted that x and y axes are included in FIG. 1 to illustrate two orthogonal (perpendicular) directions in the wafer plane. The x-direction is the word line direction of 3D memory device 100, and the y-direction is the bit line direction of 3D memory device 100.

As shown in FIG. 1, 3D memory device 100 can include one or more blocks 102 arranged in the y-direction (the bit line direction) separated by parallel slit structures 108, such as gate line slits (GLSs). In some implementations in which 3D memory device 100 is a NAND Flash memory device, each block 102 is the smallest erasable unit of the NAND Flash memory device. Each block 102 can further include multiple fingers 104 in the y-direction separated by some of slit structures 108 with "H" cuts 109.

As shown in FIG. 1, 3D memory device 100 can be divided into at least a core array region 101 in which an array of channel structures 110 are formed, as well as a word line pick-up region 103 in which word line pick-up structures 106 are formed. Core array region 101 and word line pick-up region 103 are arranged in the x-direction (the word line direction), according to some implementations. It is understood that although one core array region 101 and one word line pick-up region 103 are illustrated in FIG. 1, multiple core array regions 101 and/or multiple word line pick-up regions 103 may be included in 3D memory device 100, for example, one word line pick-up region 103 between two core array regions 101 in the x-direction, in other examples. It is also understood that FIG. 1 only illustrates portions of core array region 101 that are adjacent to word line pick-up region 103.

As described below in detail, word line pick-up region 103 can include conductive portions 105 and dielectric portions 107 arranged in the y-direction. As shown in FIG. 1, word line pick-up structures 106 are disposed in dielectric portion 107, while dummy channel structures 112 are disposed in conductive portion 105 of word line pick-up region 103 to provide mechanical support and/or load balancing, according to some implementations. In some implementations (e.g., as shown in FIG. 1), dummy channel structures 112 are disposed in dielectric portion 107 of word line pick-up region 103 as well, for example, between word line pick-up structures 106 in the x-direction. In some implementations, dummy channel structures 112 are not disposed in dielectric portion 107 of word line pick-up region 103, i.e., only in conductive portion 105 of word line pick-up region 103. As shown in FIG. 1, each finger 104 of 3D memory device 100 can include one row of word line pick-up structures 106 disposed in dielectric portion 107 of word line pick-up region 103. It is understood that the layout and arrangement of word line pick-up structures 106, as well as the shape of each word line pick-up structure 106, may vary in different examples.

Figure 2:
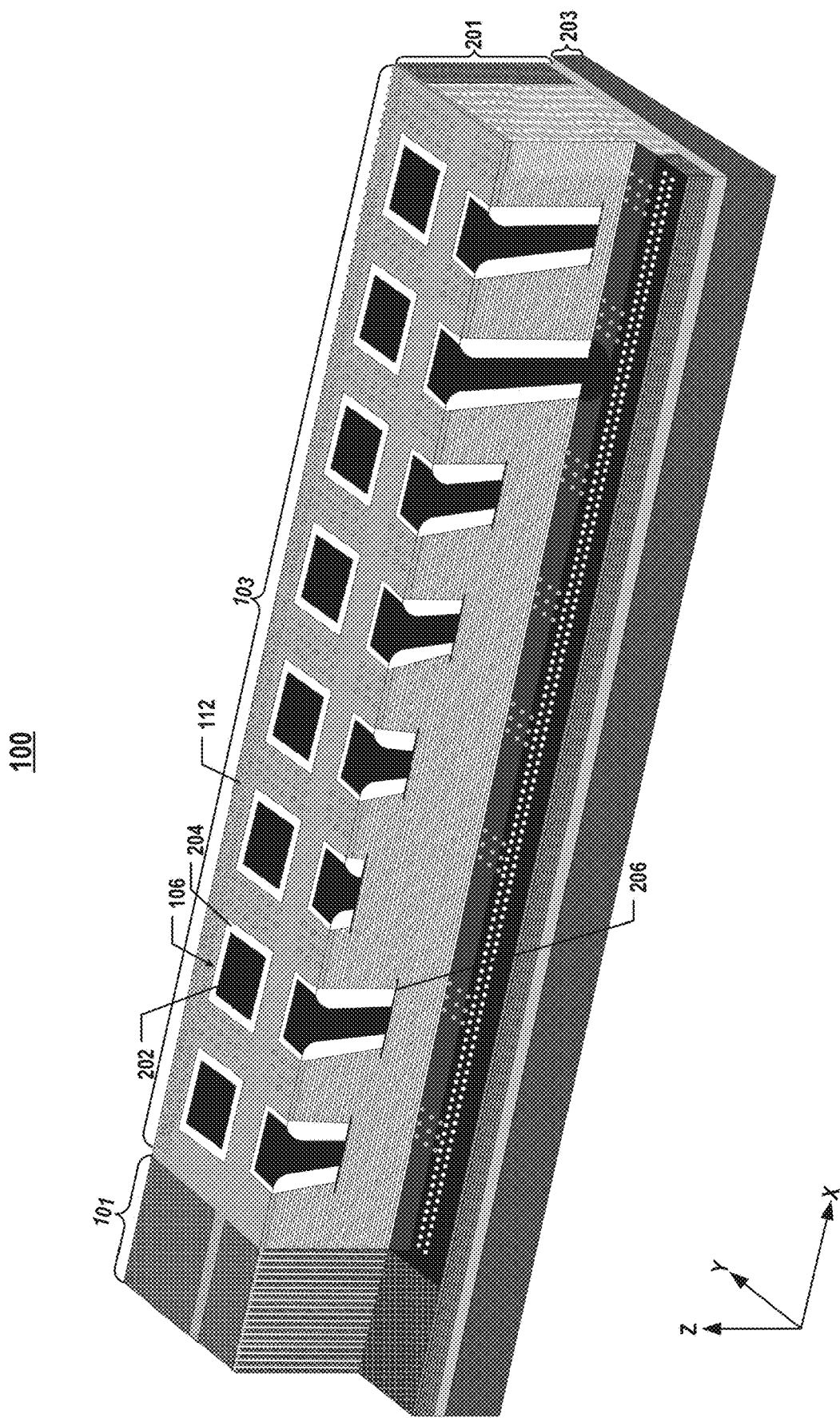
FIG. 2 illustrates a top perspective view of a 3D memory device having word line pick-up structures, according to some aspects of the present disclosure.
Figure 3:
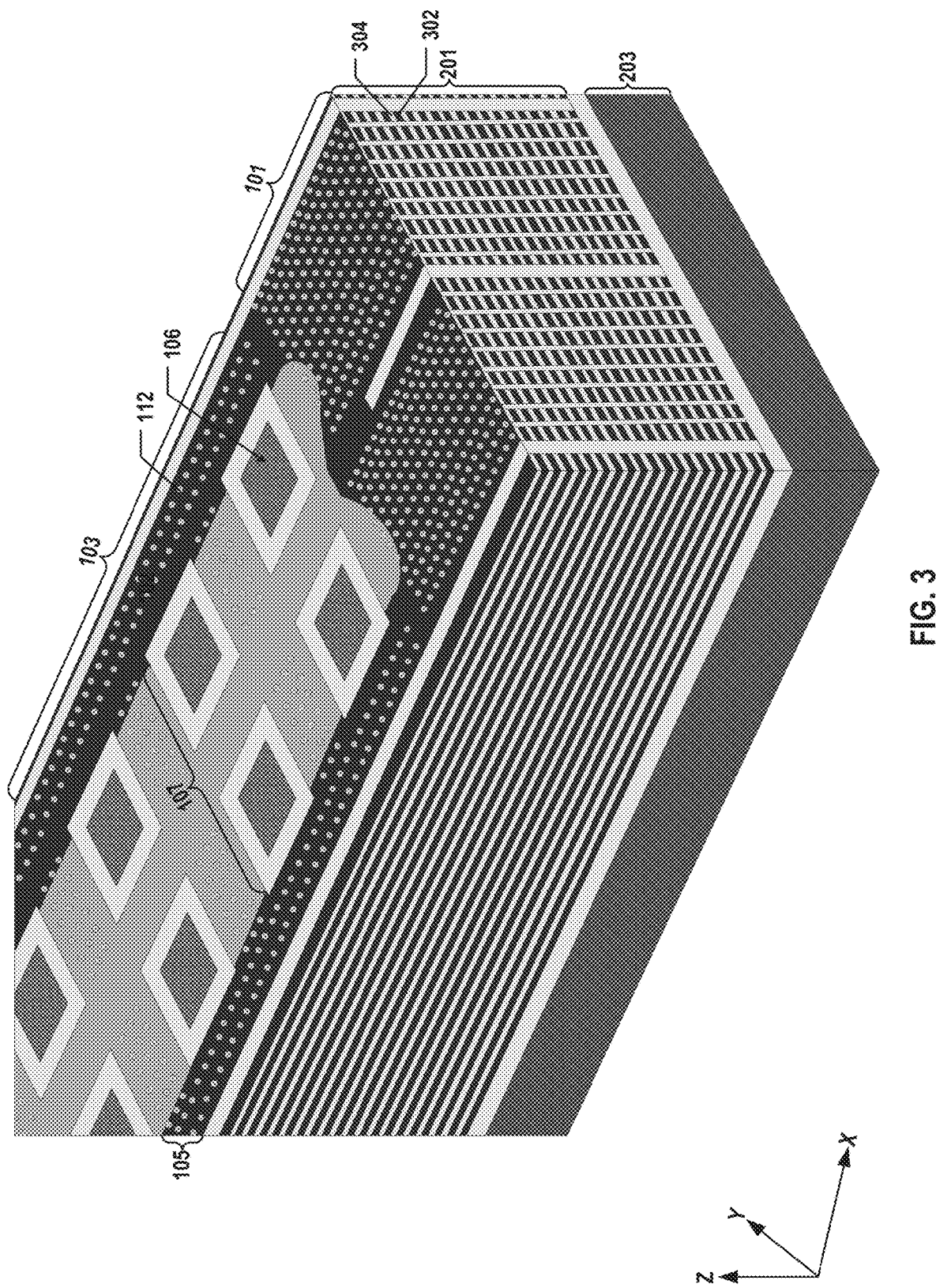
FIG. 3 illustrates an enlarged top perspective view of a 3D memory device having word line pick-up structures, according to some aspects of the present disclosure.

FIG. 2 illustrates a top perspective view of 3D memory device 100 having word line pick-up structures 106, according to some aspects of the present disclosure. FIG. 3 illustrates an enlarged top perspective view of 3D memory device 100 having word line pick-up structures 106, according to some aspects of the present disclosure. As shown in FIGS. 2 and 3, a stack structure 201 can be formed on a substrate 203, which can include silicon (e.g., single crystalline silicon), silicon germanium (SiGe), gallium arsenide (GaAs), germanium (Ge), silicon on insulator (SOI), or any other suitable materials. In some implementations, substrate 203 includes single crystalline silicon, which is part of the wafer on which 3D memory device 100 is fabricated, either in its native thickness or being thinned. In some implementations, substrate 203 includes, for example, polysilicon, which is a semiconductor layer replacing the part of wafer on which 3D memory device 100 is fabricated. It is noted that x, y, and z axes are included in FIGS. 2 and 3 to further illustrate the spatial relationship of the components in 3D memory device 100. Substrate 203 of 3D memory device 100 includes two lateral surfaces extending laterally in the x-y plane: a top surface on the front side of the wafer on which stack structure 201 can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of 3D memory device 100 is determined relative to substrate 203 of 3D memory device 100 in the z-direction (the vertical direction perpendicular to the x-y plane) when substrate 203 is positioned in the lowest plane of 3D memory device 100 in the z-direction. The same notion for describing the spatial relationship is applied throughout the present disclosure.

As shown in FIG. 3, stack structure 201 can include vertically interleaved first material layers 302 and second material layers 304 that are different from first material layers 302. First material layers 302 and second material layers 304 can alternate in the vertical direction (the z-direction). In some implementations, stack structure 201 can include a plurality of material layer pairs stacked vertically in the z-direction, each of which includes first material layer 302 and second material layer 304. The number of the material layer pairs in stack structure 201 can determine the number of memory cells in 3D memory device 100.

In some implementations, 3D memory device 100 is a NAND Flash memory device, and stack structure 201 is a stacked storage structure through which NAND memory strings are formed. As shown in FIG. 3, second material layers 304 can have different materials in different regions/portions of 3D memory device 100. Thus, stack structure 201 may be viewed as having a number of stack structures with different materials of second material layers 304 for ease of description in the present disclosure. In some implementations, core array region 101 and conductive portion 105 of word line pick-up region 103 include a conductive stack structure having interleaved conductive layers and first dielectric layers. That is, second material layers 304 of stack structure 201 may be conductive layers in core array region 101 and conductive portion 105 of word line pick-up region 103. In some implementations, dielectric portion 107 of word line pick-up region 103 includes a dielectric stack structure having interleaved second dielectric layers and the first dielectric layers. That is, second material layers 304 of stack structure 201 may be the second dielectric layers in dielectric portion 107 of word line pick-up region 103. First material layers 302 of stack structure may be the same—the first dielectric layers—in the conductive stack structure and the dielectric stack structure across core array region 101 and word line pick-up region 103. As described below in detail with respect to the fabrication process, the formation of stack structure 201 with different materials of second material layer 304 in different regions/portions can be achieved by controlling the different degrees and scopes of the gate replacement process in different regions/portions. For example, stack structure 201 may have undergone a complete gate replacement process in core array region 101 to replace all the second dielectric layers with the conductive layers, but a partial gate replacement process in word line pick-up region 103 to replace some of the second dielectric layers with the conductive layers in conductive portion 105, leaving the remainders of the second dielectric layers in dielectric portion 107.

In some implementations, each conductive layer in the conductive stack structure in core array region 101 and conductive portion 105 of word line pick-up region 103 functions as a gate line of the NAND memory strings (in the forms of channel structures 110) in core array region 101, as well as a word line extending laterally from the gate line and ending in conductive portion 105 of word line pick-up region 103 for word line pick-up/fan-out through word line pick-up structures 106. The word lines (i.e., the conductive layers) at different depths/level of the conductive stack structure each extends laterally in core array region 101 and conductive portion 105 of word line pick-up region 103, but are discontinuous (e.g., being replaced by the second dielectric layers) in dielectric portion 107 of word line pick-up region 103, according to some implementations.

The conductive layers can include conductive materials including, but not limited to, tungsten (W), cobalt (Co), copper (Cu), aluminum (Al), titanium nitride (TiN), polycrystalline silicon (polysilicon), doped silicon, silicides, or any combination thereof. The dielectric layers can include dielectric materials including, but not limited to, silicon oxide, silicon nitride, silicon oxynitride, or any combination thereof. The first dielectric layers and the second dielectric layers can have different dielectric materials, such as silicon oxide and silicon nitride. In some implementations, the conductive layers include metals, such as tungsten, the first dielectric layers include silicon oxide, and the second dielectric layers include silicon nitride. For example, first material layers 302 of stack structure 201 may include silicon oxide across core array region 101 and word line pick-up region 103, and second material layers 304 of stack structure 201 may include tungsten in core array region 101 and conductive portion 105 of word line pick-up region 103 and silicon nitride in dielectric portion 107 of word line pick-up region 103.

As shown in FIGS. 2 and 3, the heights of stack structure 201 (e.g., the conductive stack structure and the dielectric stack structure) are uniform in core array region 101 and in word line pick-up region 103, according to some implementations. Different from some 3D memory devices that include one or more staircase structures in a staircase region (corresponding to word line pick-up region 103 for word line pick-up/fan-out), which has uniform heights of the stack structure in the staircase region, 3D memory device 100 can eliminate the staircase structures while still achieving the word line pick-up/fan-out function using word line pick-up structures 106, as described below in detail.

Figure 4:
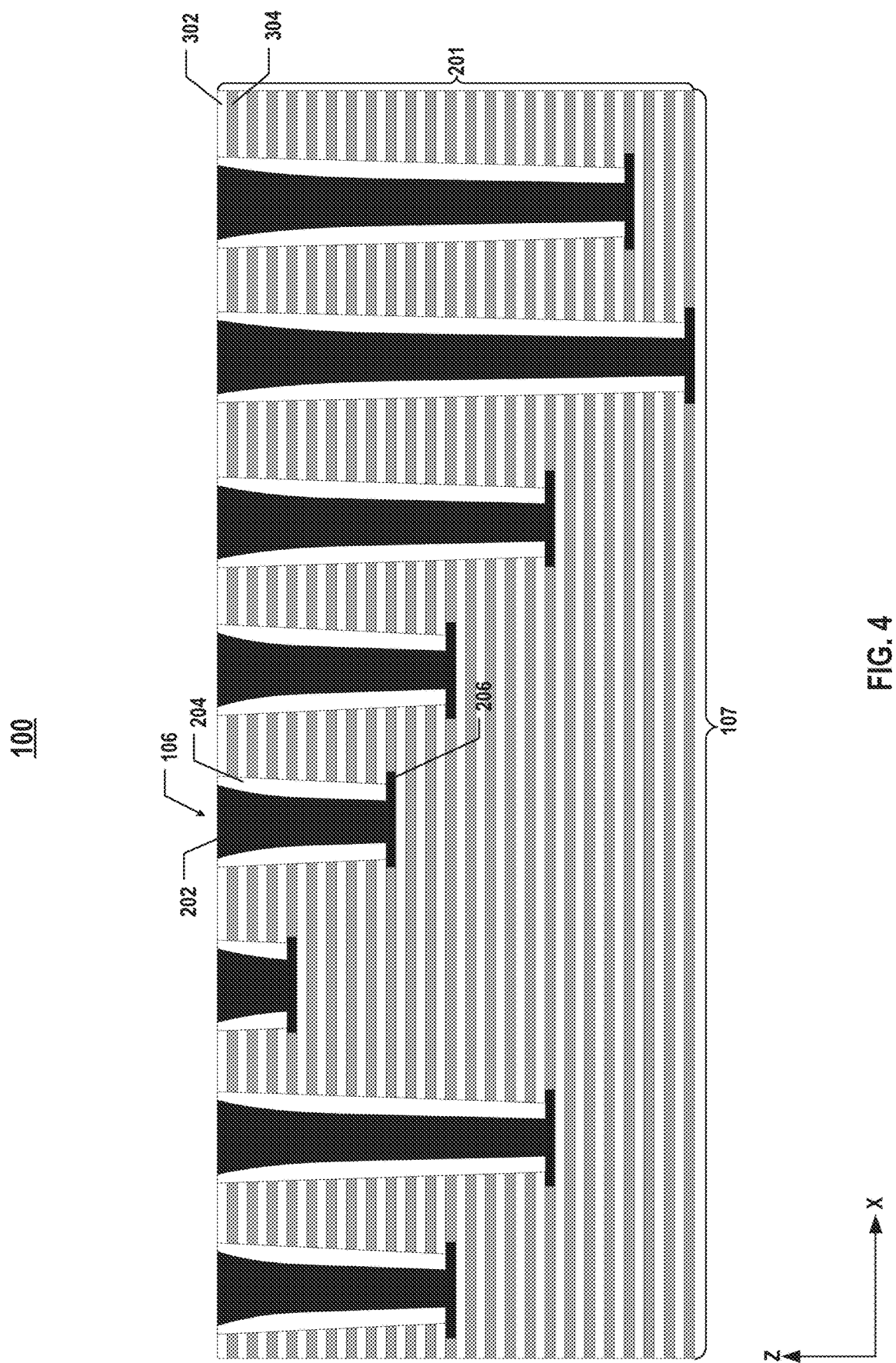
FIG. 4 illustrates a cross-sectional side view of a 3D memory device having word line pick-up structures, according to some aspects of the present disclosure.

FIG. 4 illustrates a cross-sectional side view of 3D memory device 100 having word line pick-up structures 106, according to some aspects of the present disclosure. The cross-section may be along the AA direction in dielectric portion 107 of word line pick-up region 103 in FIG. 1. As shown in FIG. 4, word line pick-up structures 106 extend vertically into stack structure 201 (the dielectric stack structure in dielectric portion 107 of word line pick-up region 103) at different depths in the z-direction, according to some implementations. The top surfaces of different word line pick-up structures 106 can be flush with one another, while the bottom surfaces of different word line pick-up structures 106 can extend to different levels, for example, different second material layers 304 of stack structure 201.

In some implementations, word line pick-up structure 106 includes a vertical contact 202, a contact spacer 204 circumscribing vertical contact 202, and an interconnect line 206 below and in contact with vertical contact 202. Vertical contact 202 and interconnect line 206 can include conductive materials including, but not limited to, W, Co, Cu, Al, TiN, polysilicon, doped silicon, silicides, or any combination thereof. Contact spacer 204 can include dielectric materials including, but not limited to, silicon oxide, silicon nitride, silicon oxynitride, or any combination thereof. In some implementations, vertical contact 202 and interconnect line 206 include TiN/W, and contact spacer 204 includes silicon oxide.

Figure 5:
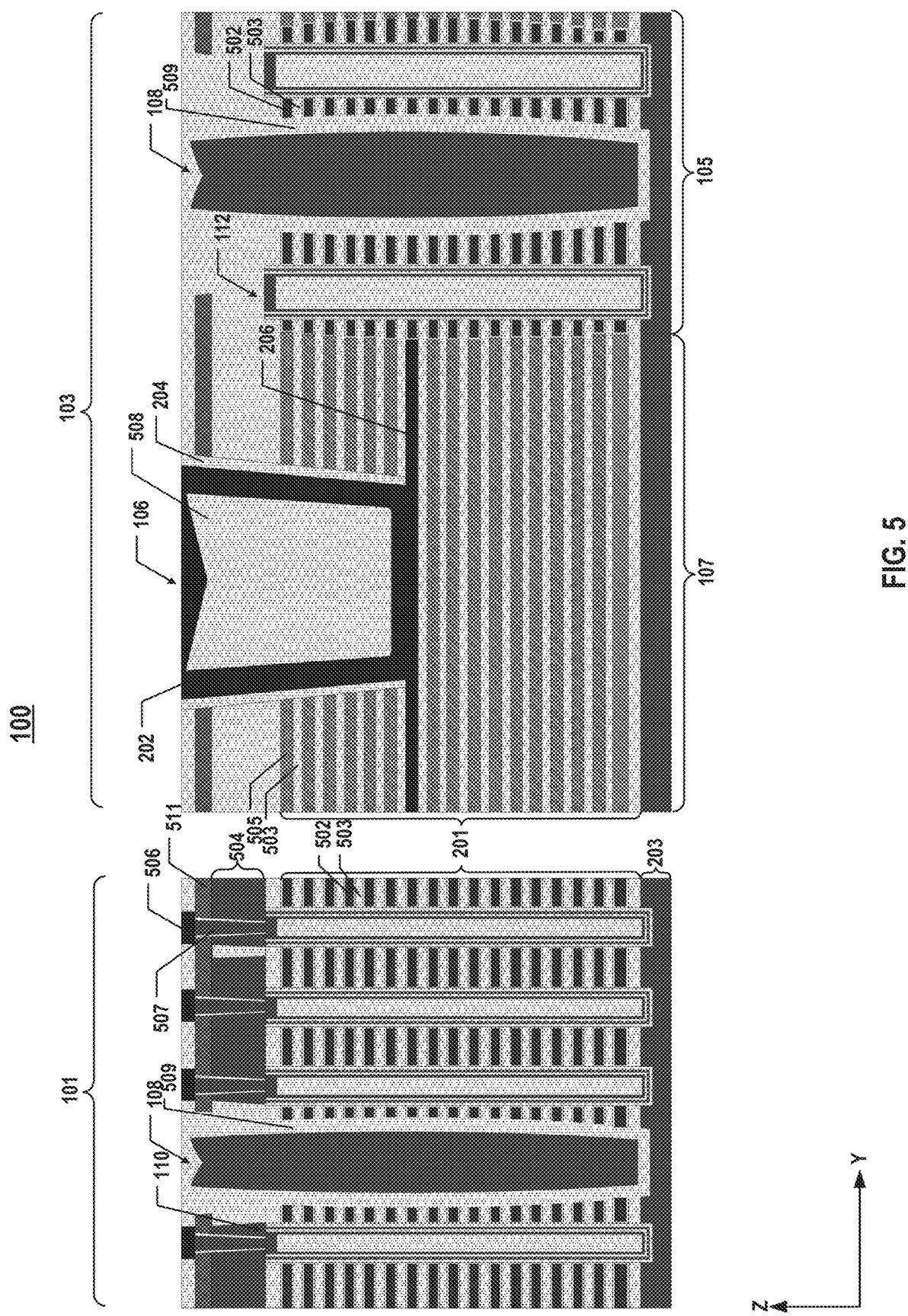
FIG. 5 illustrates cross-sectional side views of a 3D memory device having word line pick-up structures, according to some aspects of the present disclosure.

FIG. 5 illustrates cross-sectional side views of 3D memory device 100 having word line pick-up structures 106, according to some aspects of the present disclosure. One cross-section may be along the BB direction in core array region 101 in FIG. 1, and another cross-section may be along the CC direction in word line pick-up region 103 in FIG. 1. As shown in FIG. 5, 3D memory device 100 can include channel structures 110 in core array region 101. Each channel structure 110 can extend vertically through interleaved conductive layers 502 (word lines, e.g., tungsten) and first dielectric layers 503 (e.g., silicon oxide) of the conductive stack structure of stack structure 201 into substrate 203. 3D memory device 100 can also include dummy channel structures 112 in conductive portion 105 of word line pick-up region 103. Each dummy channel structure 112 can extend vertically through interleaved conductive layers 502 and first dielectric layers 503 of the conductive stack structure of stack structure 201 into substrate 203. 3D memory device 100 can further include slit structures 108 across core array region 101 and core array region 101. Each slit structure 108 can extend vertically through interleaved conductive layers 502 and first dielectric layers 503 of the conductive stack structure of stack structure 201 into substrate 203 as well.

As shown in FIG. 5, slit structure 108 can include a slit spacer 509 that separate conductive layers 502 (word lines) between different blocks 102. In some implementations, slit structure 108 is an insulating structure that does not include any contact therein (i.e., not functioning as the source contact) and thus, does not introduce parasitic capacitance and leakage current with conductive layers 502 (word lines). In some implementations, slit structure 108 is a front-side source contact further including a conductive portion (e.g., including W, polysilicon, and/or TiN) circumscribed by slit spacer 509. As described below in detail, during the gate replacement process, the slit in which slit structure 108 is formed can serve as the passageway and starting point for forming conductive layers 502. As a result, slit structure 108 is surrounded by conductive layers 502 in either core array region 101 or conductive portion 105 of word line pick-up region 103.

As shown in FIG. 5, in some implementations, 3D memory device 300 further includes a plurality of drain select gate (DSG) channel structures 507 above and in contact with the upper ends of channel structures 110, respectively. 3D memory device 300 can further includes a DSG layer 504 including a semiconductor layer (e.g., polysilicon layer) on stack structure 201 in core array region 101, but not in word line pick-up region 105, for example, as shown in FIG. 5. Each DSG channel structure 507 can extend vertically through DSG layer 504 to be in contact with the upper end of a corresponding channel structure 110. In some implementations, 3D memory device 300 further includes a stop layer 511 (e.g., silicon nitride layer) on DSG layer 504. DSG channel structure 507 can include a semiconductor layer (e.g., polysilicon) and a spacer surrounding the semiconductor layer. In some implementations, 3D memory device 300 includes a DSG stack including one or more DSG layers and one or more dielectric layers (e.g., silicon oxide layers) interleaved stacked above stack structure 201.

As shown in FIG. 5, 3D memory device 100 can further include a local contact layer above stop layer 511 and stack structure 201. In some implementations, the local contact layer includes various local contacts, such as channel contacts 506 (a.k.a. bit line contacts) above and in contact with DSG structures 507 in core array region 101. The local contact layer can further include one or more interlayer dielectric (ILD) layers (also known as "intermetal dielectric (IMD) layers") in which the local contacts can form. Channel contacts 506 in the local contact layer can include conductive materials including, but not limited to, W, Co, Cu, Al, silicides, or any combination thereof. The ILD layers the in local contact layer can include dielectric materials including, but not limited to, silicon oxide, silicon nitride, silicon oxynitride, low-k dielectrics, or any combination thereof.

Instead of having staircase structures and word line contacts landed on different levels/stairs of the staircase structures, 3D memory device 100 can include stack structure 201 with uniform heights and word line pick-up structures 106 in dielectric portion 107 of word line pick-up region 103 for word line pick-up/fan-out. As shown in FIG. 5, interconnect line 206 of each word line pick-up structure 106 in dielectric portion 107 can extend laterally in they-direction (the bit line direction) to be in contact with a corresponding conductive layer 502 (word line) in conductive portion 105 at the same level of stack structure 201. Since interconnect line 206 is in contact with vertical contact 202 of word line pick-up structure 106, each word line pick-up structure 106 is electrically connected to corresponding conductive layer 502 (word line) across conductive portion 105 in word line pick-up region 103 and core array region 101, according to some implementations. In other words, word line pick-up structures 106 can extend vertically through stack structure 201 at different depths to be electrically connected to the word lines at different levels, respectively, to achieve word line pick-up/fan-out.

As described below in detail, during the gate replacement process, some of second dielectric layers 505 (e.g., silicon nitride) remain intact, thereby forming the dielectric stack structure of stack structure 201 in dielectric portion 107 of word line pick-up region 103, and word line pick-up structure 106 is formed by etching first and second dielectric layers 503 and 505 in dielectric portion 107 of word line pick-up region 103. As a result, word line pick-up structures 106 extend into interleaved first and second dielectric layers 503 and 505 of the dielectric stack structure and are surrounded by first and second dielectric layers 503 and 505 in dielectric portion 107 of word line pick-up region 103. The bottom of each word line pick-up region 103 can be aligned with a corresponding second dielectric layer 505, as opposed to first dielectric layer 503, and the corresponding second dielectric layer 505 can be partially replaced with interconnect line 206 to form the electrical connection between vertical contact 202 of word line pick-up region 103 and the corresponding conductive layer 502 (word line). Thus, in some implementations, interconnect line 206 is sandwiched between two first dielectric layers 503, as opposed to two second dielectric layers 505, in the dielectric stack structure in dielectric portion 107 of word line pick-up region 103.

In some implementations as shown in FIG. 5, due to the relatively large critical dimension compared with the word line contacts in some 3D memory devices caused by its fabrication process as described below in detail, word line pick-up structure 106 further includes a filler 508 circumscribed by vertical contact 202. That is, the word line pick-up opening may not be fully filled with contact spacer 204 and vertical contact 202, and the remaining space of the word line pick-up opening may be filled with dielectric materials, including, but not limited to, silicon oxide, silicon nitride, silicon oxynitride, or any combination thereof, as filler 508.

Figure 6A:
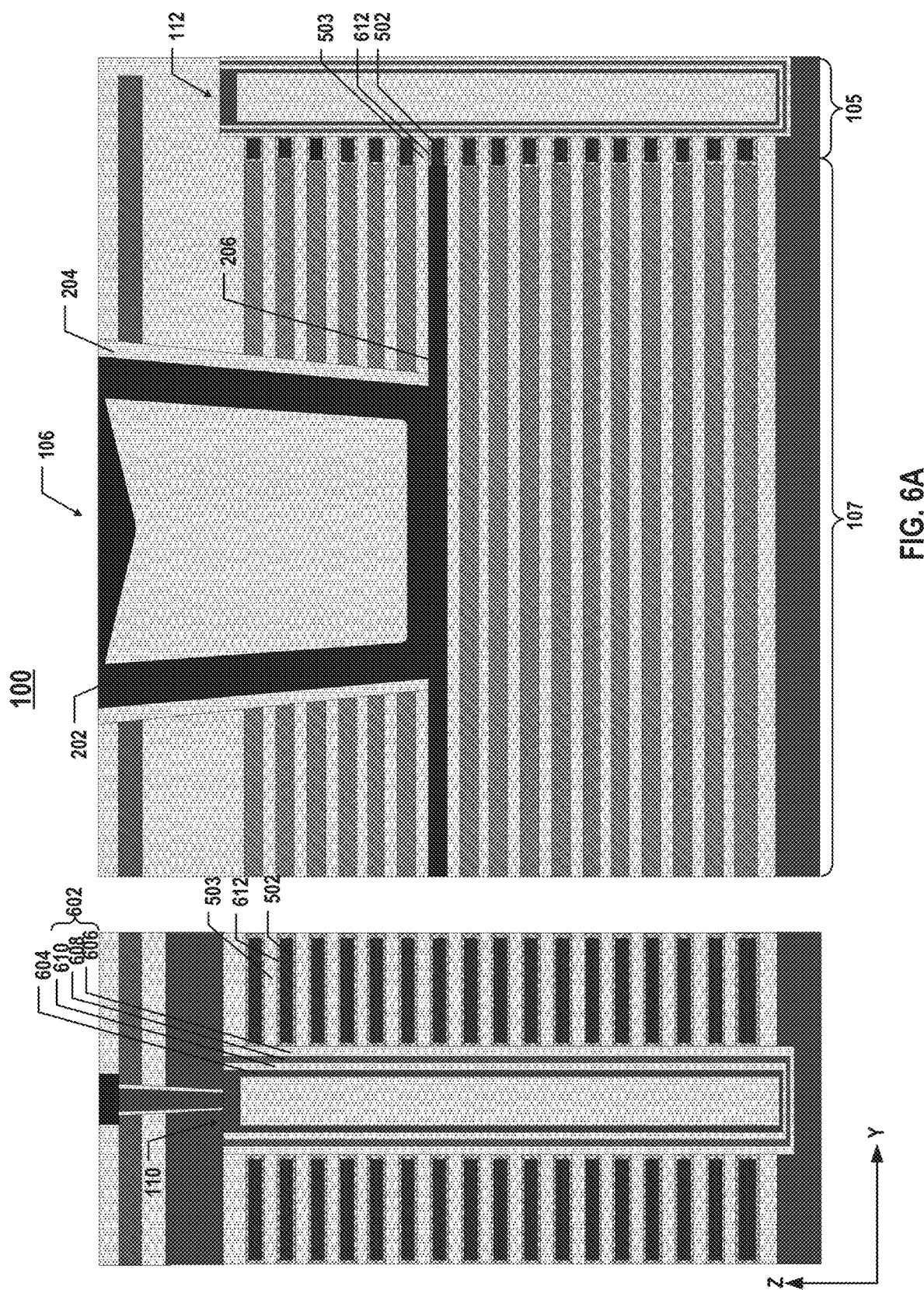
FIG. 6A illustrates enlarged cross-sectional side views of a 3D memory device having word line pick-up structures, according to some aspects of the present disclosure.

As shown in the enlarged view of FIG. 6A, in some implementations, channel structure 110 includes a channel hole filled with a semiconductor layer (e.g., as a channel layer 604) and a composite dielectric layer (e.g., as a memory layer 602). In some implementations, channel layer 604 includes silicon, such as amorphous silicon, polysilicon, or single crystalline silicon. For example, channel layer 604 may include polysilicon. In some implementations, memory layer 602 is a composite layer including a tunneling layer 610, a storage layer 608 (also known as a "charge trap layer"), and a blocking layer 606. The remaining space of the channel hole can be partially or fully filled with a filler including dielectric materials, such as silicon oxide, and/or an air gap. Channel structure 110 can have a cylinder shape (e.g., a pillar shape). The filler, channel layer 604, tunneling layer 610, storage layer 608, and blocking layer 606 of memory layer 602 are arranged radially from the center toward the outer surface of the pillar in this order, according to some implementations. Tunneling layer 610 can include silicon oxide, silicon oxynitride, or any combination thereof. Storage layer 608 can include silicon nitride, silicon oxynitride, silicon, or any combination thereof. Blocking layer 606 can include silicon oxide, silicon oxynitride, or any combination thereof. In one example, memory layer 602 can include a composite layer of silicon oxide/silicon oxynitride/silicon oxide (ONO).

As shown in FIG. 6A, 3D memory device 100 can further include high dielectric constant (high-k) gate dielectric layers 612 each sandwiched between adjacent conductive layer 502 and first dielectric layer 503 in the conductive stack structure in core array region 101 and conductive portion 105 of word line pick-up region 103. As described below in detail with respect to the fabrication process, high-k gate dielectric layers 612 may be formed prior to the formation of conductive layers 502, such that conductive layers 502 may be formed surrounded by high-k gate dielectric layers 612. Parts of high-k gate dielectric layers 612 that are laterally between memory layer 602 of channel structure 110 and conductive layers 502 can serve as the gate dielectrics of the memory cells. High-k gate dielectric layers 612 can include high-k dielectric materials, such as aluminum oxide (AlO), hafnium oxide (HfO), zirconium oxide (ZrO), or any combinations thereof.

As shown in FIG. 6A, compared with other high-k gate dielectric layers 612, part of high-k gate dielectric layer 612 surrounding conductive layer 502 (part of word line) that is in contact with interconnect line 206 of word line pick-up structure 106 is removed to expose conductive layer 502 such that interconnect line 206 can be electrically connected to conductive layer 502.

Figure 6B:
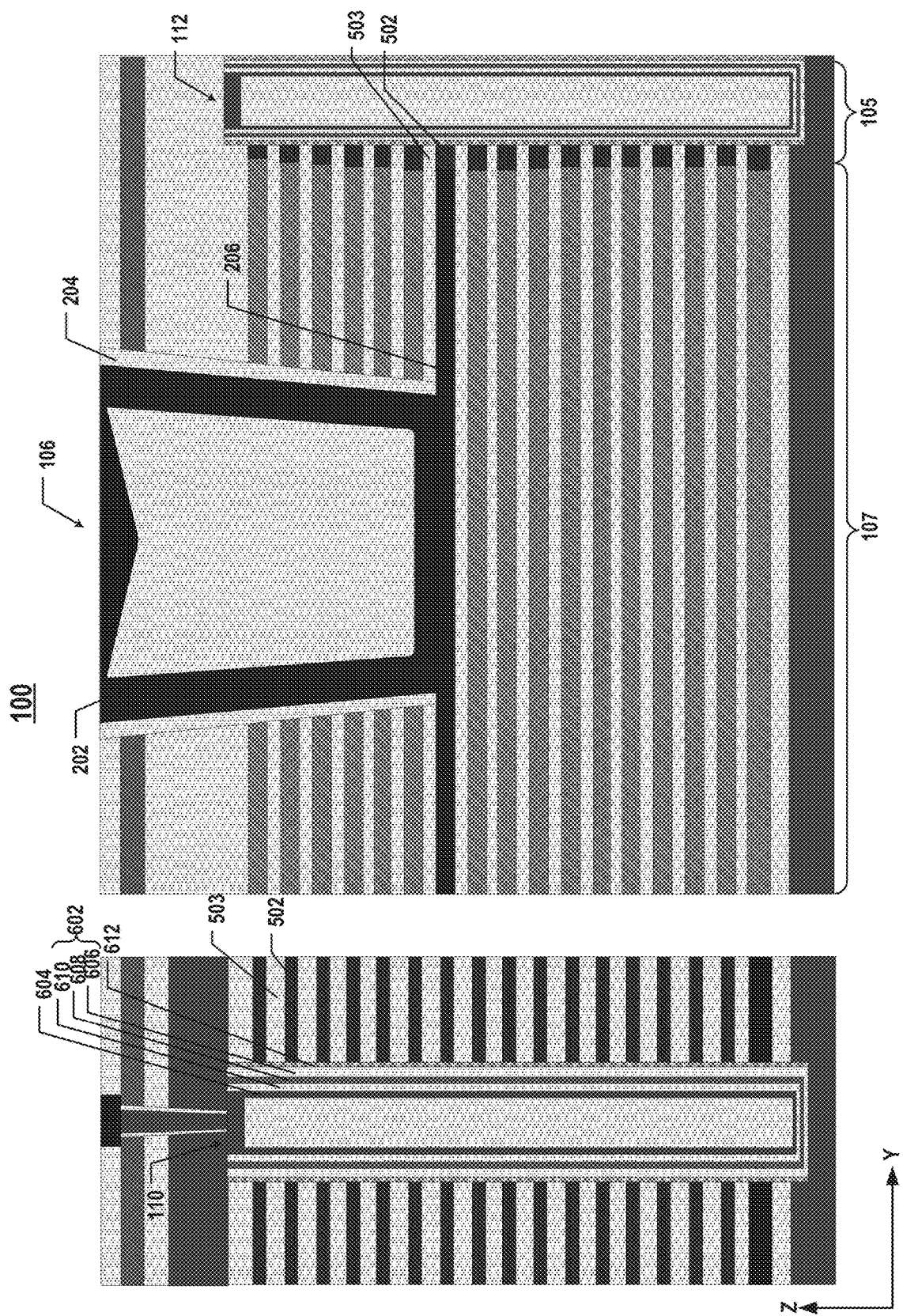
FIG. 6B illustrates enlarged cross-sectional side views of another 3D memory device having word line pick-up structures, according to some aspects of the present disclosure.

It is understood that high-k gate dielectric layers 612 may be formed in different locations in 3D memory device 100, for example, as shown in FIG. 6B. As shown in the enlarged view of FIG. 6B, in some implementations, channel structure 110 includes a channel hole filled with a semiconductor layer (e.g., as channel layer 604) and a composite dielectric layer (e.g., as memory layer 602 and high-k gate dielectric layer 612). In some implementations, channel layer 604 includes silicon, such as amorphous silicon, polysilicon, or single crystalline silicon. For example, channel layer 604 may include polysilicon. In some implementations, memory layer 602 is a composite layer including a tunneling layer 610, a storage layer 608 (also known as a "charge trap layer"), and a blocking layer 606. Different from the example in FIG. 6A, channel structure 110 in FIG. 6B can further include high-k gate dielectric layer 612 laterally between blocking layer 606 of memory layer 602 and the conductive stack structure of stack structure 201. The remaining space of channel structure 110 can be partially or fully filled with a filler including dielectric materials, such as silicon oxide, and/or an air gap. Channel structure 110 can have a cylinder shape (e.g., a pillar shape). The filler, channel layer 604, tunneling layer 610, storage layer 608, and blocking layer 606 of memory layer 602, and high-k gate dielectric layers 612 are arranged radially from the center toward the outer surface of the pillar in this order, according to some implementations. Tunneling layer 610 can include silicon oxide, silicon oxynitride, or any combination thereof. Storage layer 608 can include silicon nitride, silicon oxynitride, silicon, or any combination thereof. Blocking layer 606 can include silicon oxide, silicon oxynitride, or any combination thereof. In one example, memory layer 602 may include a composite layer of silicon oxide/silicon oxynitride/silicon oxide (ONO). high-k gate dielectric layer 612 can include aluminum oxide (AlO), hafnium oxide (HfO), zirconium oxide (ZrO), or any combinations thereof. In one example, high-k gate dielectric layer 612 may include AlO.

As shown in FIG. 6B, different from the example in FIG. 6A, high-k gate dielectric layers 612 are disposed only surrounding memory layer 602 of channel structures 110, but not being sandwiched between adjacent conductive layer 502 and first dielectric layer 503 in the conductive stack structure in core array region 101 and conductive portion 105 of word line pick-up region 103. As described below in detail with respect to the fabrication process, high-k gate dielectric layers 612 may be formed prior to the formation of memory layer 602, as opposed to conductive layers 502, such that memory layer 602, instead of conductive layers 502, may be formed surrounded by high-k gate dielectric layers 612.

In some implementations, dummy channel structure 112 has the same structure as channel structure 110, as described above with respect to FIGS. 6A and 6B, because they are formed in the same fabrication process. Dummy channel structure 112, however, cannot perform the same memory functions as channel structure 110 at least because dummy channel structures 112 are not in contact with any DSG channel structures 507 or any local contacts (e.g., channel contacts 506) in the local contact layer to pick-up/fan-out dummy channel structures 112, as shown in FIG. 5, according to some implementations. It is understood that in some examples, dummy channel structures 112 and channel structure 110 may have different structures and may be formed in different fabrication processes. For example, dummy channel structures 112 may be filled with dielectric material(s) without semiconductor materials (as channel layer 604). Nevertheless, both dummy channel structures 112 and channel structures 110 can perform the mechanical supporting functions to stack structure 201, in particular, during the gate replacement process, as described below in detail with respect to the fabrication processes.

Figure 13:
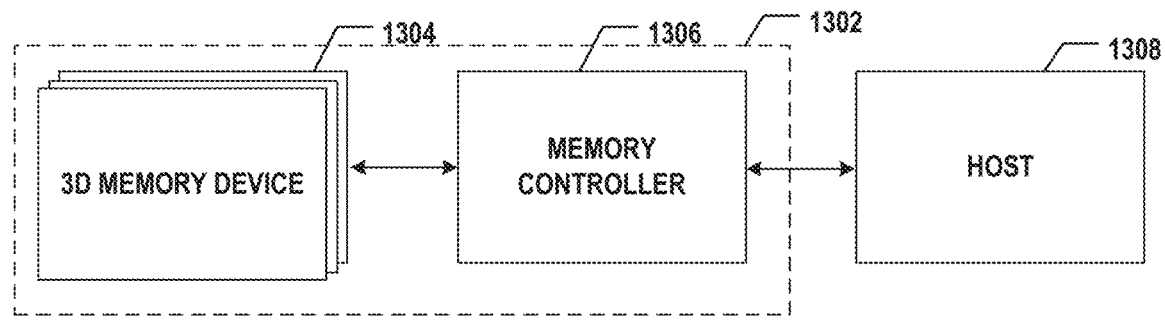
FIG. 13 illustrates a block diagram of an exemplary system having a 3D memory device, according to some aspects of the present disclosure.

FIG. 13 illustrates a block diagram of an exemplary system 1300 having a 3D memory device, according to some aspects of the present disclosure. System 1300 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 13, system 1300 can include a host 1308 and a memory system 1302 having one or more 3D memory devices 1304 and a memory controller 1306. Host 1308 can be a processor of an electronic device, such as a central processing unit (CPU), or a system-on-chip (SoC), such as an application processor (AP). Host 1308 can be configured to send or receive data to or from 3D memory devices 1304.

3D memory device 1304 can be any 3D memory device disclosed herein, such as 3D memory device 100 depicted in FIGS. 1-5, 6A, and 6B. In some implementations, each 3D memory device 1304 includes a NAND Flash memory. Consistent with the scope of the present disclosure, word line pick-up structures can replace the staircase structures and word line contacts to achieve word line pick-up/fan-out functions, thereby reducing the manufacturing cost and simplifying the fabrication process.

Memory controller 1306 (a.k.a., a controller circuit) is coupled to 3D memory device 1304 and host 1308 and is configured to control 3D memory device 1304, according to some implementations. For example, memory controller 1306 may be configured to operate the plurality of channel structures via the word lines. Memory controller 1306 can manage the data stored in 3D memory device 1304 and communicate with host 1308. In some implementations, memory controller 1306 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1306 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1306 can be configured to control operations of 3D memory device 1304, such as read, erase, and program operations. Memory controller 1306 can also be configured to manage various functions with respect to the data stored or to be stored in 3D memory device 1304 including, but not limited to bad-block management, garbage collection, logical-to-physical address conversion, wear leveling, etc. In some implementations, memory controller 1306 is further configured to process error correction codes (ECCs) with respect to the data read from or written to 3D memory device 1304. Any other suitable functions may be performed by memory controller 1306 as well, for example, formatting 3D memory device 1304. Memory controller 1306 can communicate with an external device (e.g., host 1308) according to a particular communication protocol. For example, memory controller 1306 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figures 14A, 14B:
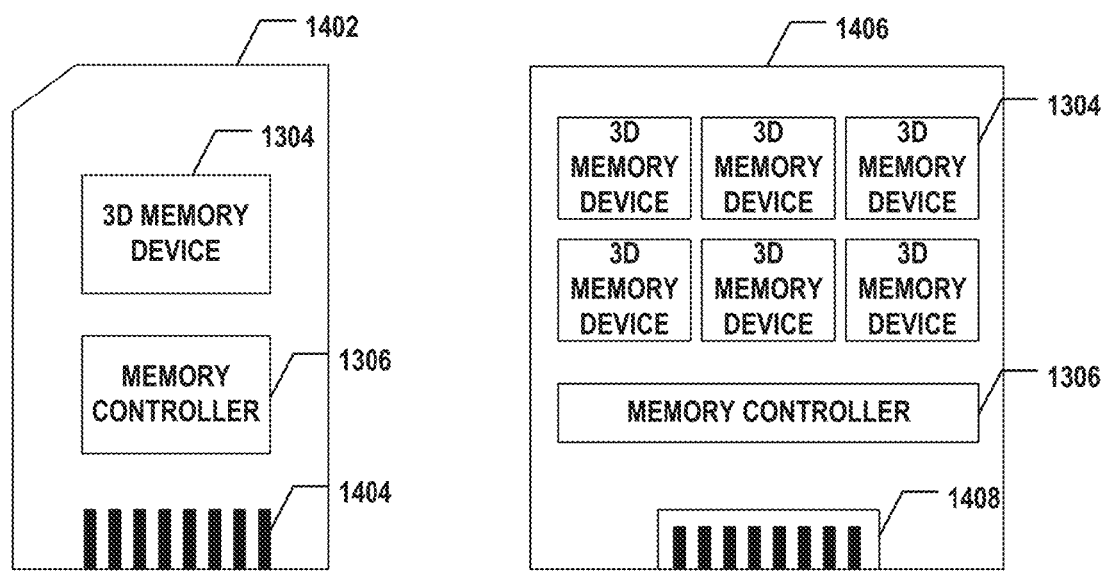
FIG. 14A illustrates a diagram of an exemplary memory card having a 3D memory device, according to some aspects of the present disclosure.
FIG. 14B illustrates a diagram of an exemplary solid-state drive (SSD) having a 3D memory device, according to some aspects of the present disclosure.

Memory controller 1306 and one or more 3D memory devices 1304 can be integrated into various types of storage devices, for example, be included in the same package, such as a universal Flash storage (UFS) package or an eMMC package. That is, memory system 1302 can be implemented and packaged into different types of end electronic products. In one example as shown in FIG. 14A, memory controller 1306 and a single 3D memory device 1304 may be integrated into a memory card 1402. Memory card 1402 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 1402 can further include a memory card connector 1404 electrically coupling memory card 1402 with a host (e.g., host 1308 in FIG. 13). In another example as shown in FIG. 14B, memory controller 1306 and multiple 3D memory devices 1304 may be integrated into an SSD 1406. SSD 1406 can further include an SSD connector 1408 electrically coupling SSD 1406 with a host (e.g., host 1308 in FIG. 13). In some implementations, the storage capacity and/or the operation speed of SSD 1406 is greater than those of memory card 1402.

Figure 7A:
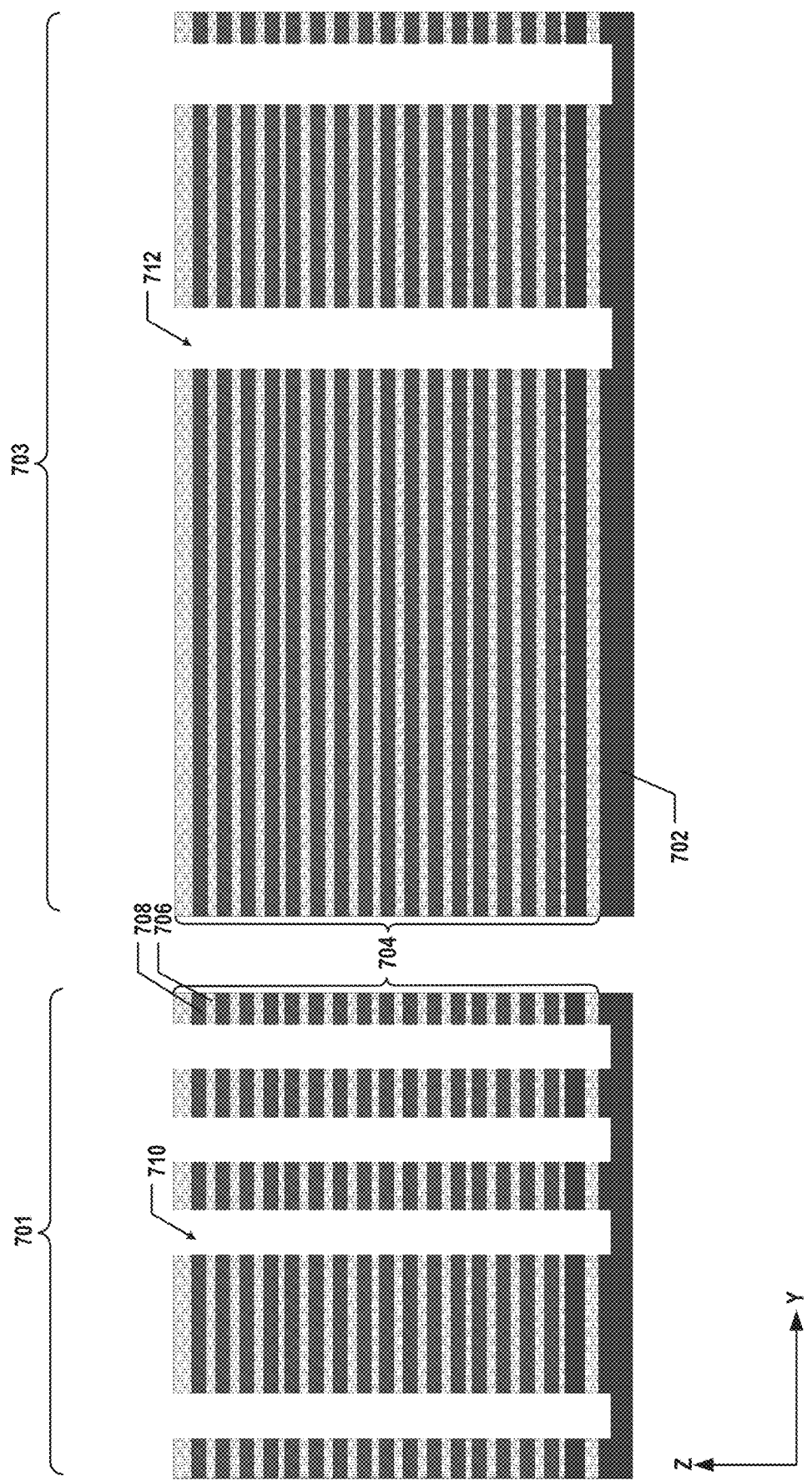
FIGS. 7A-7P illustrate a fabrication process for forming a 3D memory device having word line pick-up structures, according to some aspects of the present disclosure.
Figure 7B:
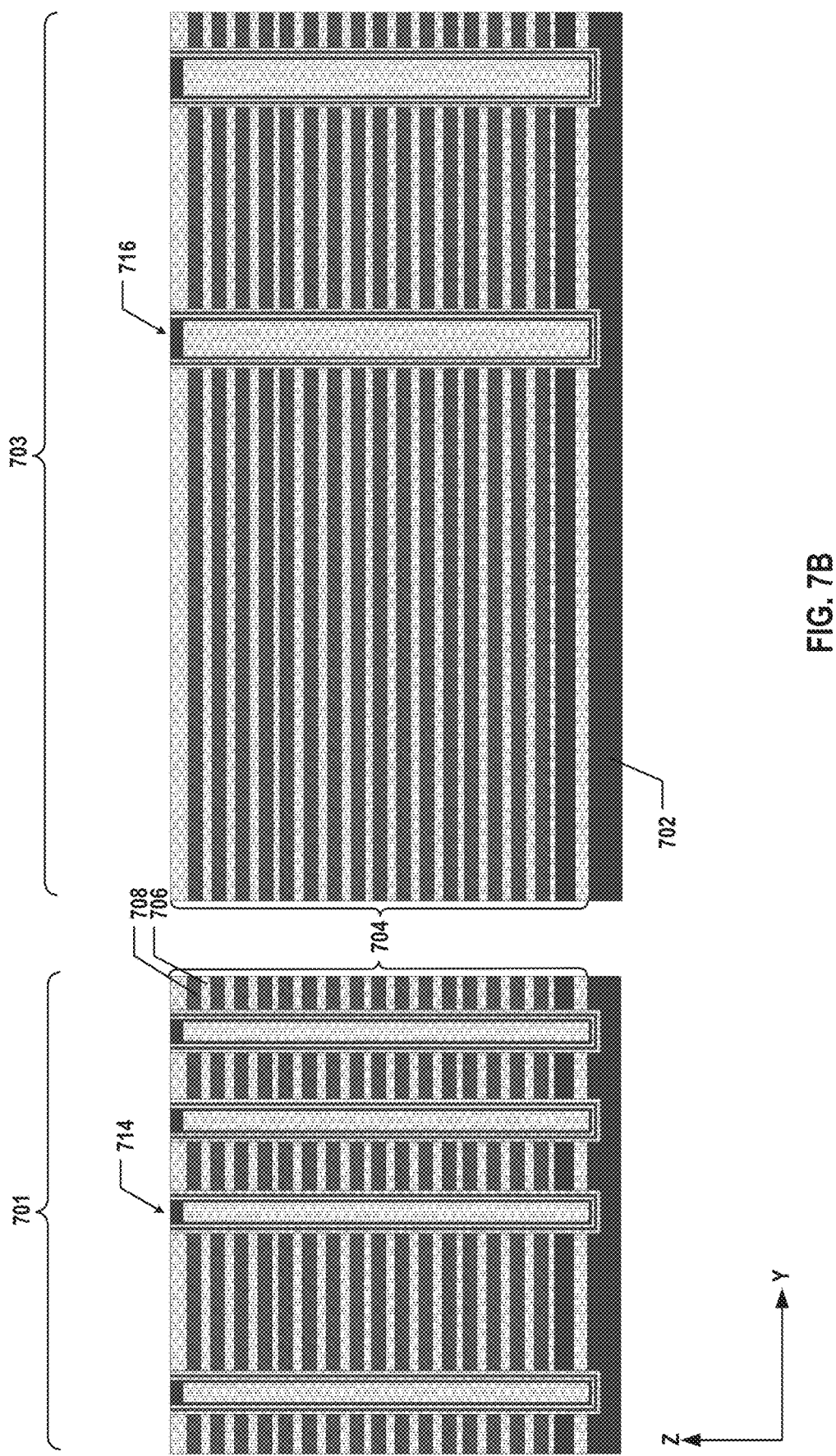
Figure 7C:
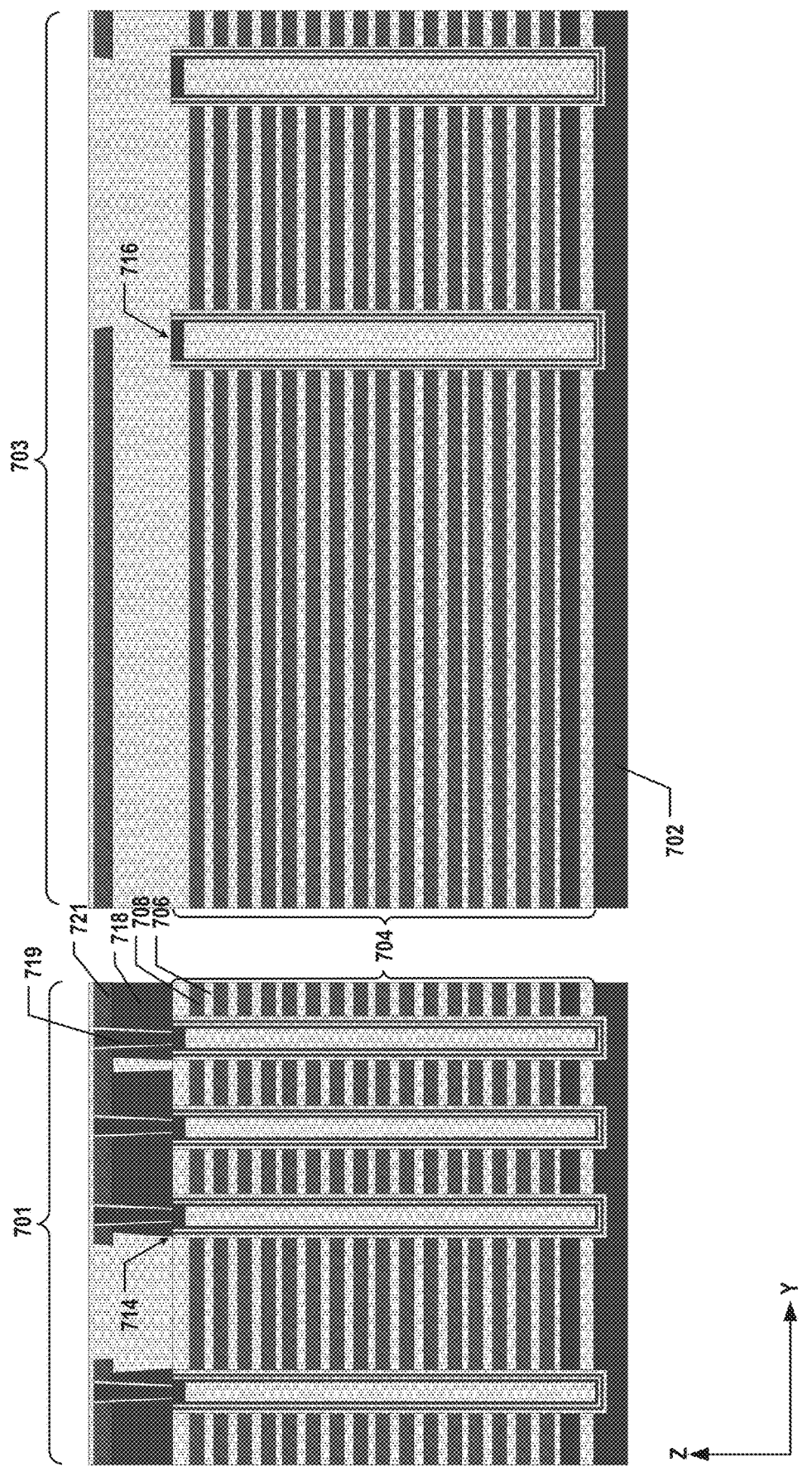
Figure 7D:
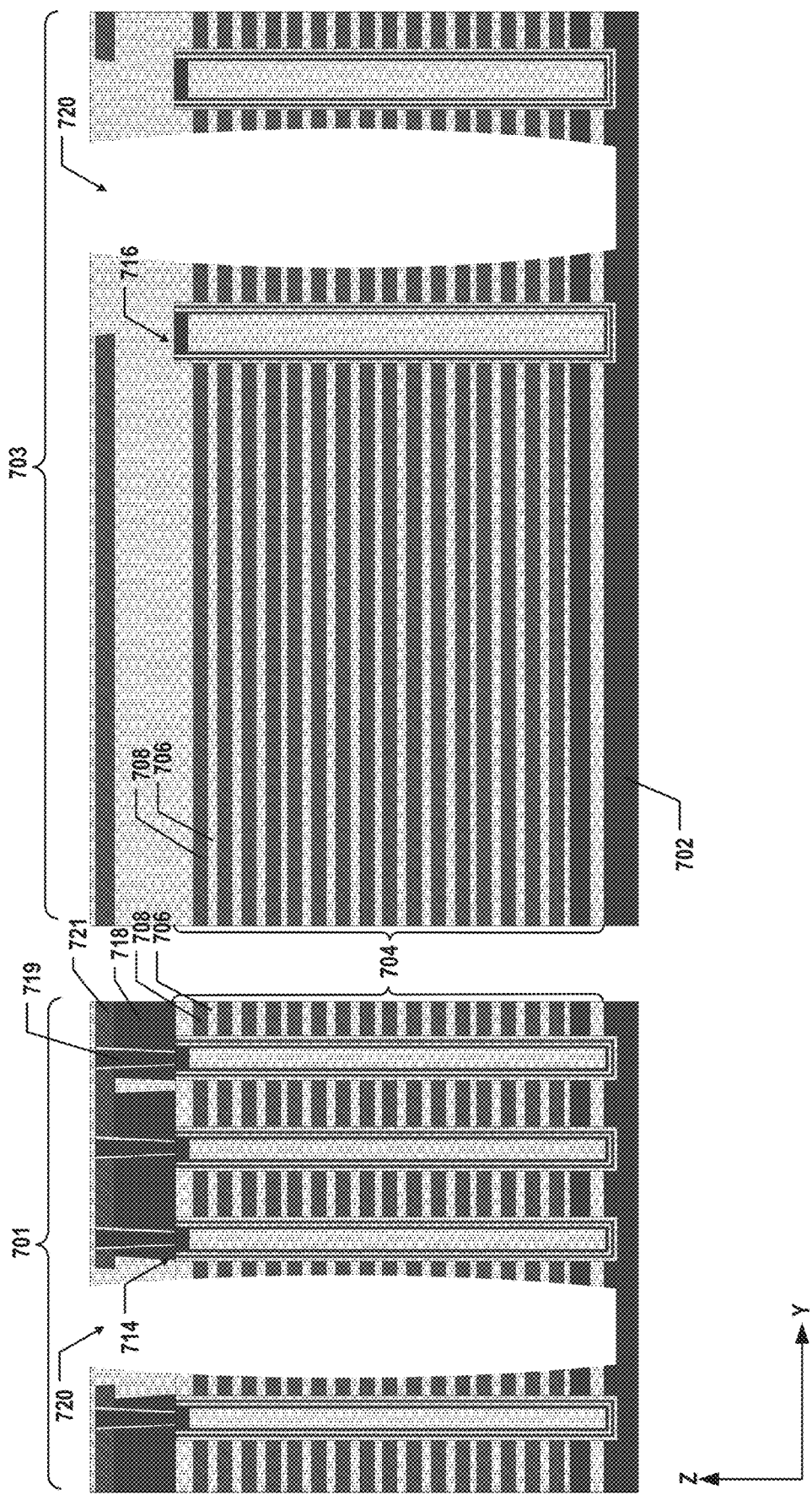
Figure 7E:
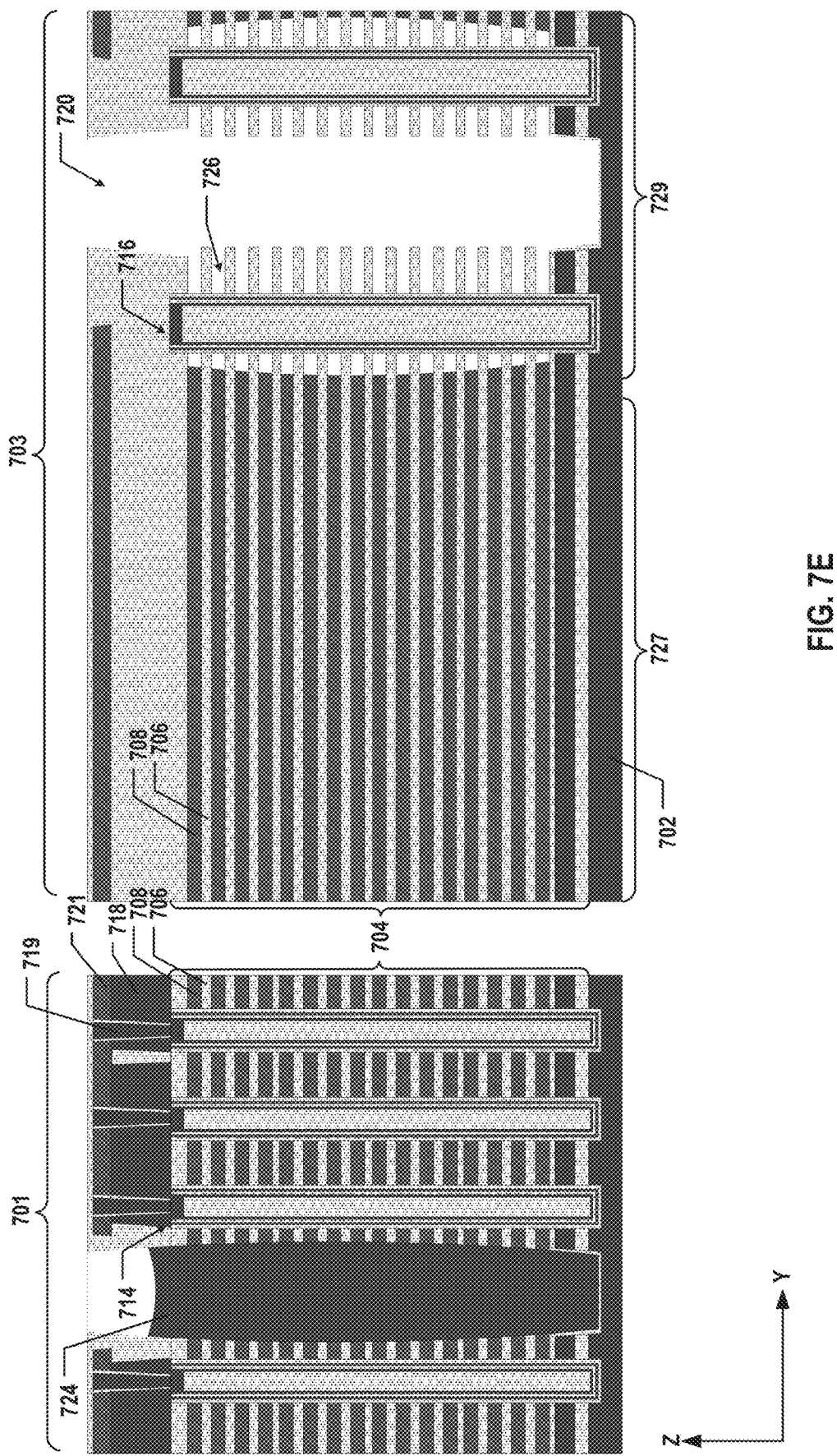
Figure 7F:
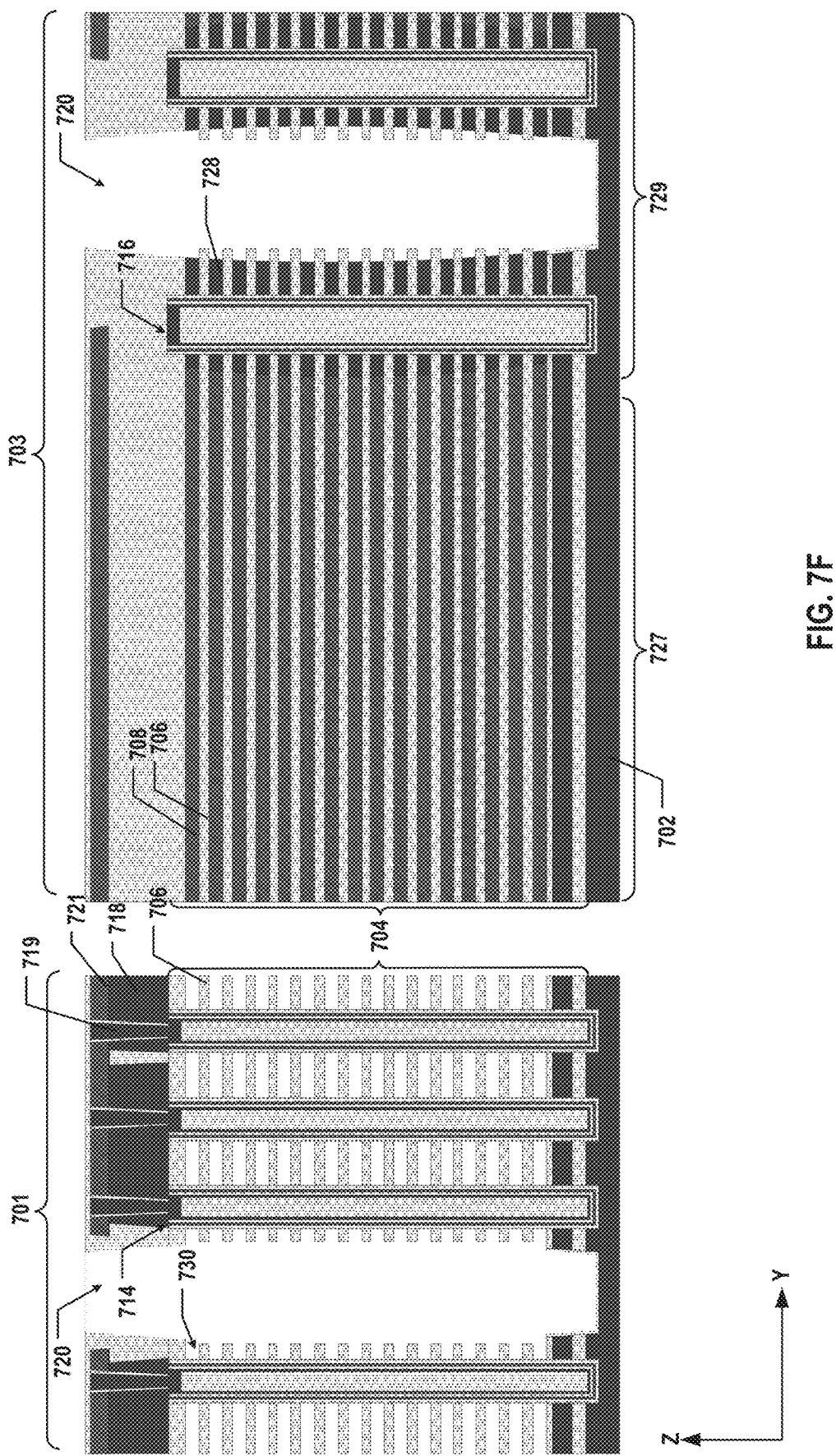
Figure 7G:
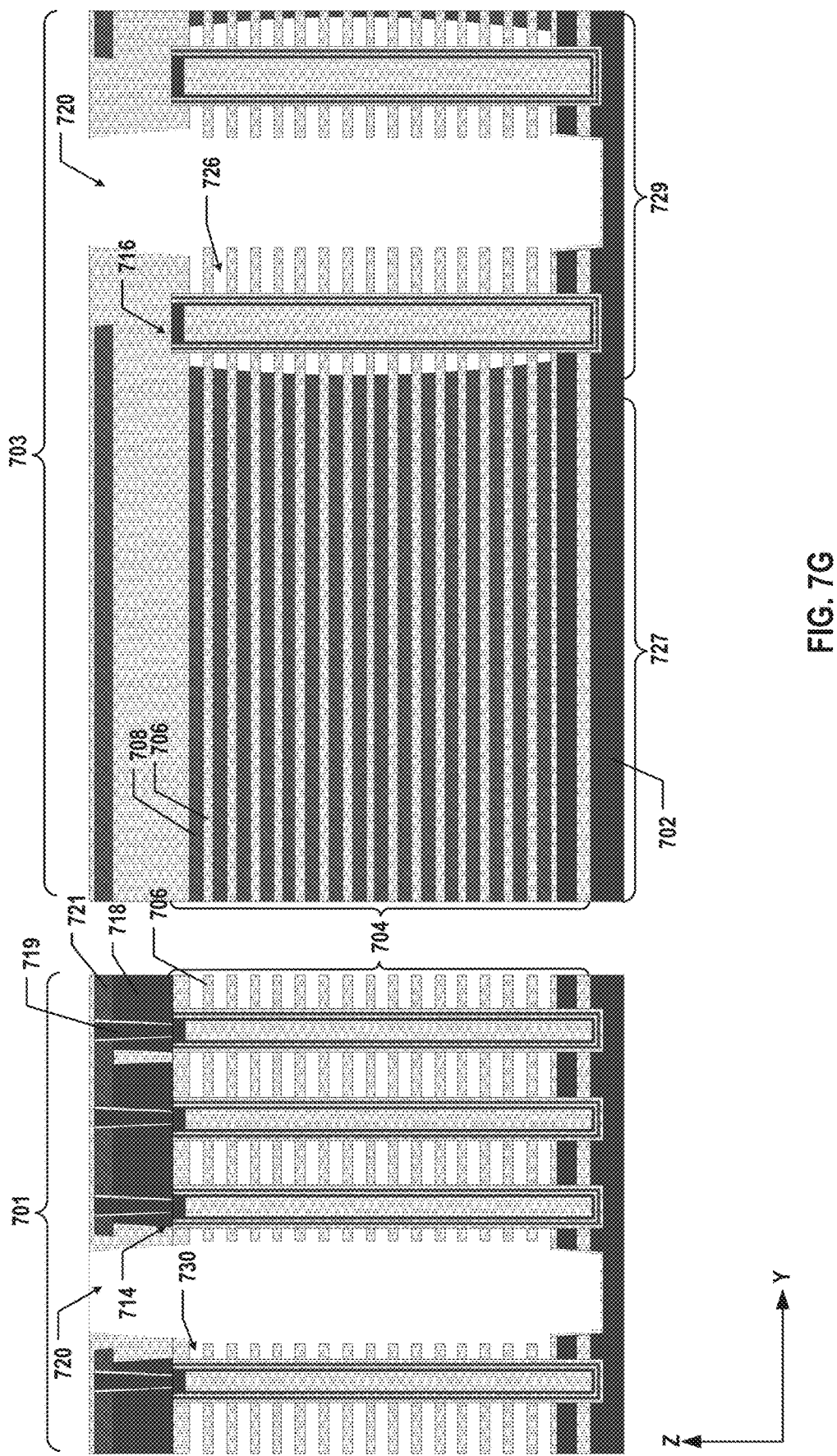
Figure 7H:
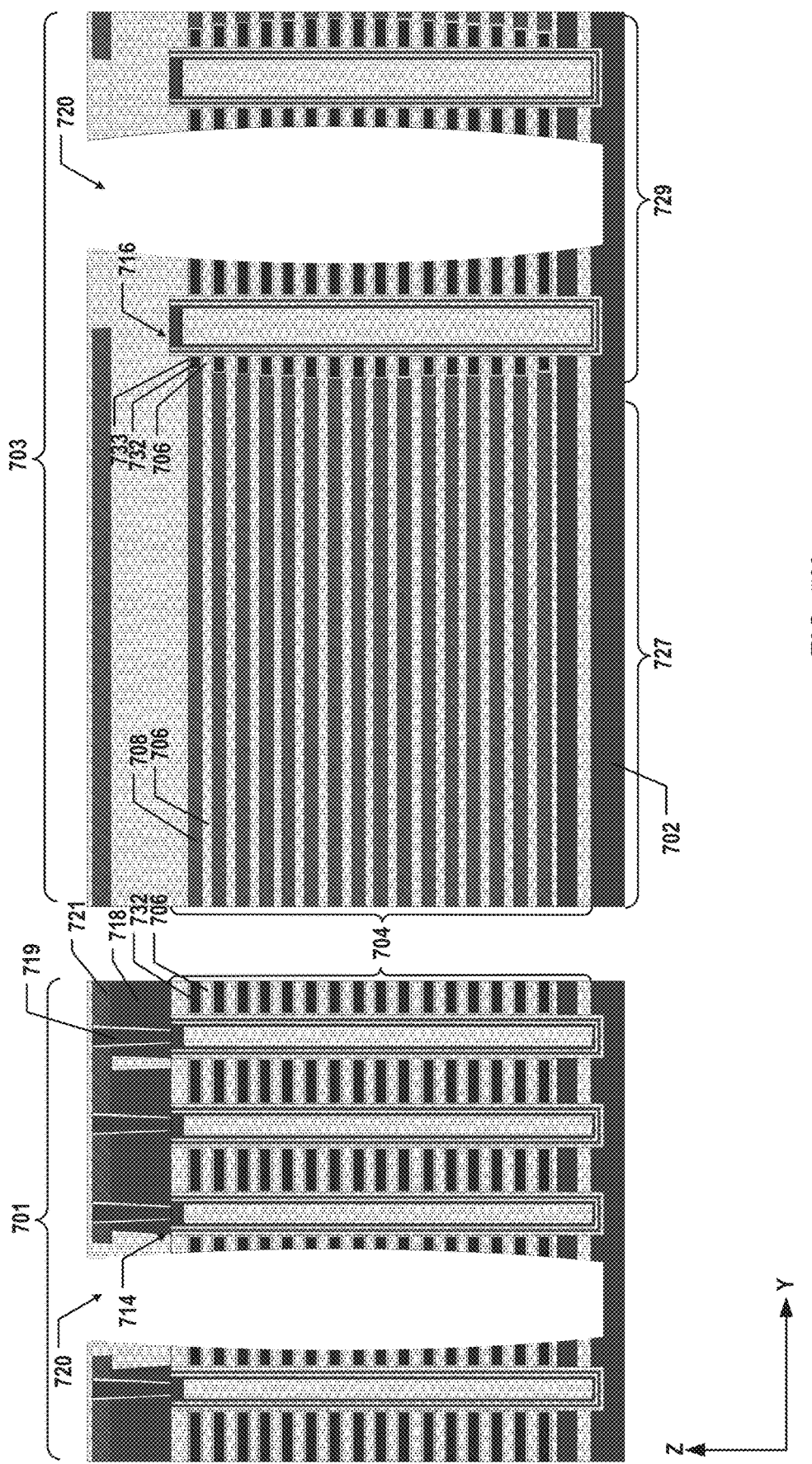
Figure 7I:
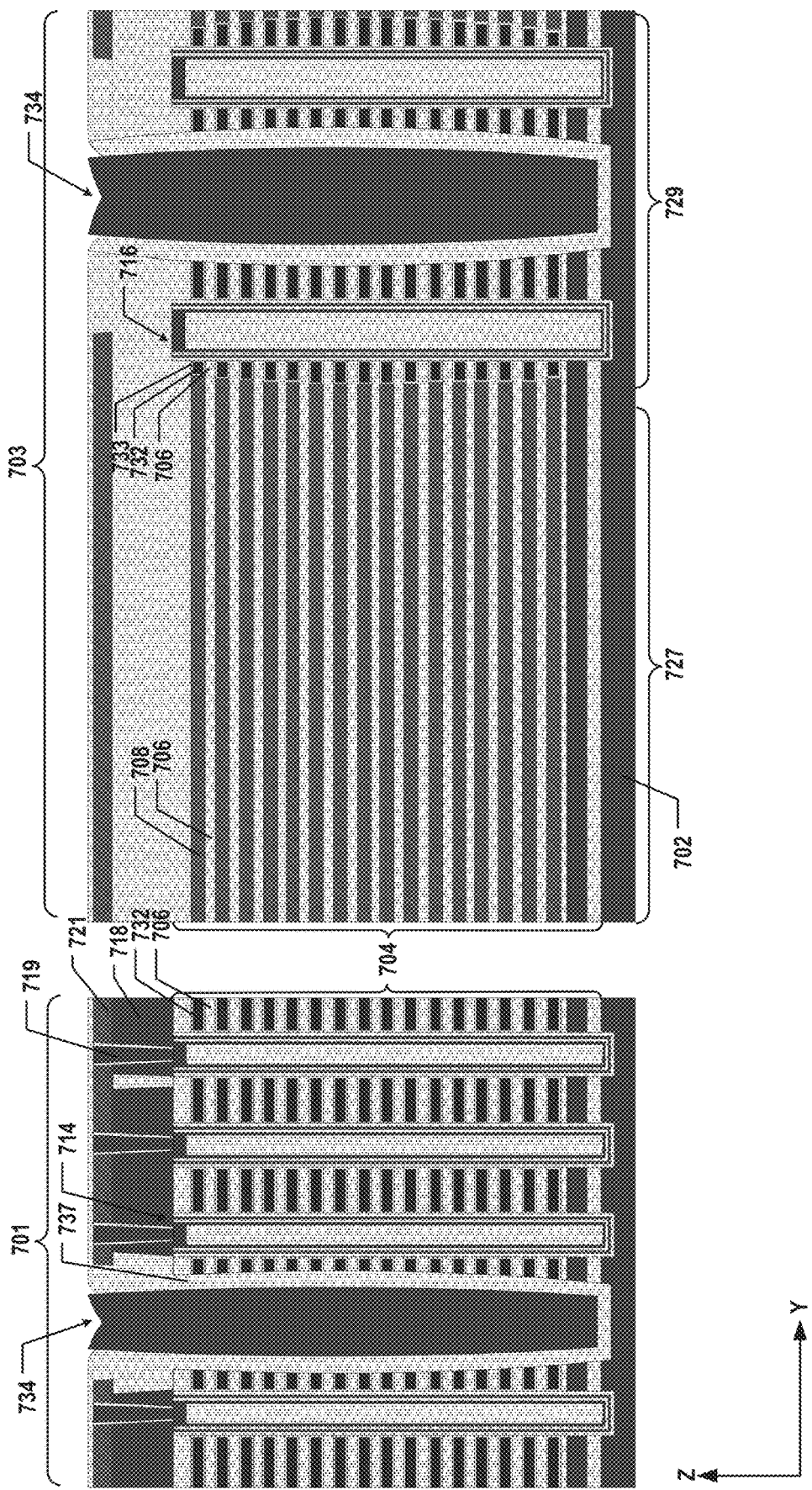
Figure 7J:
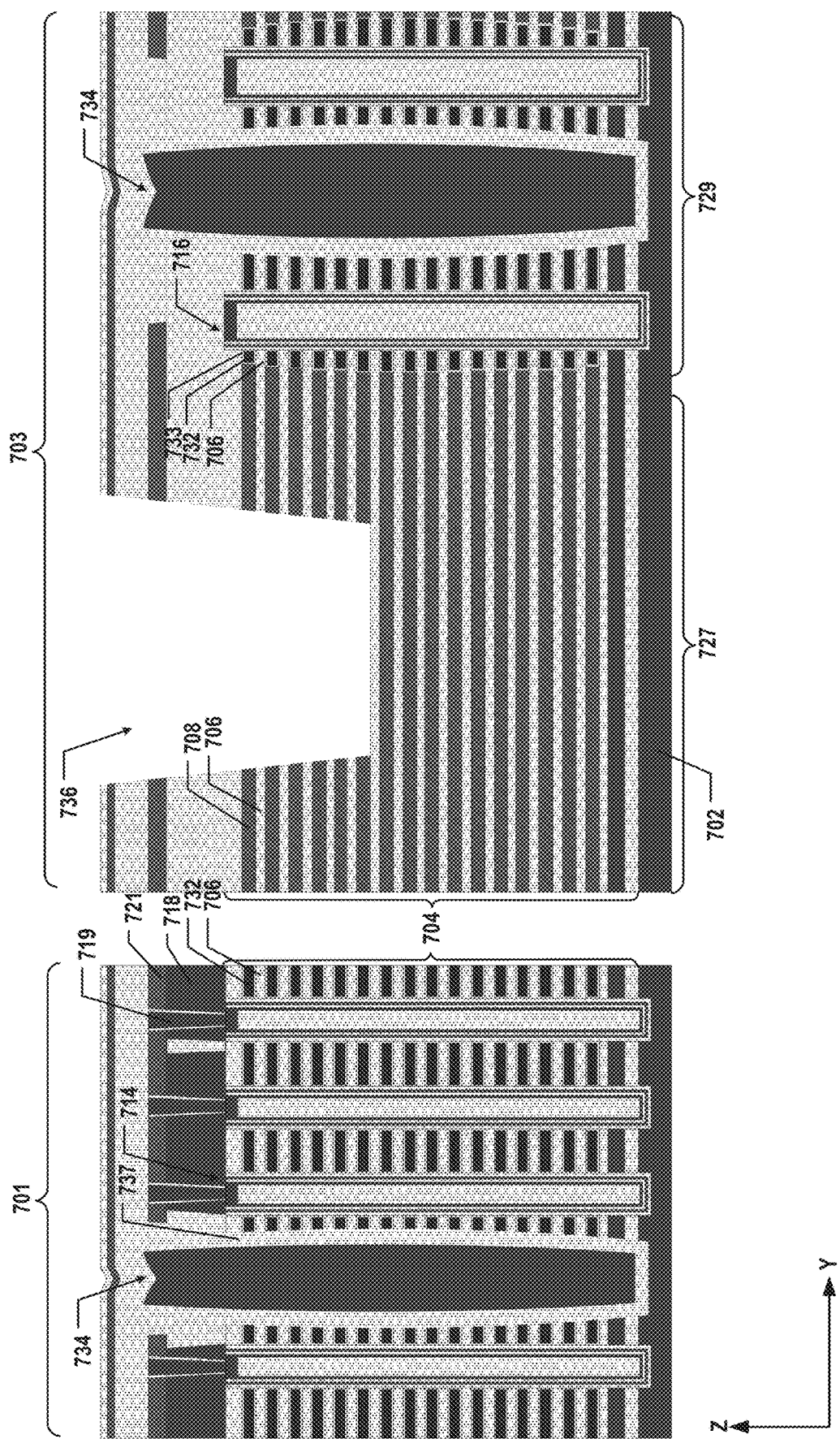
Figure 7K:
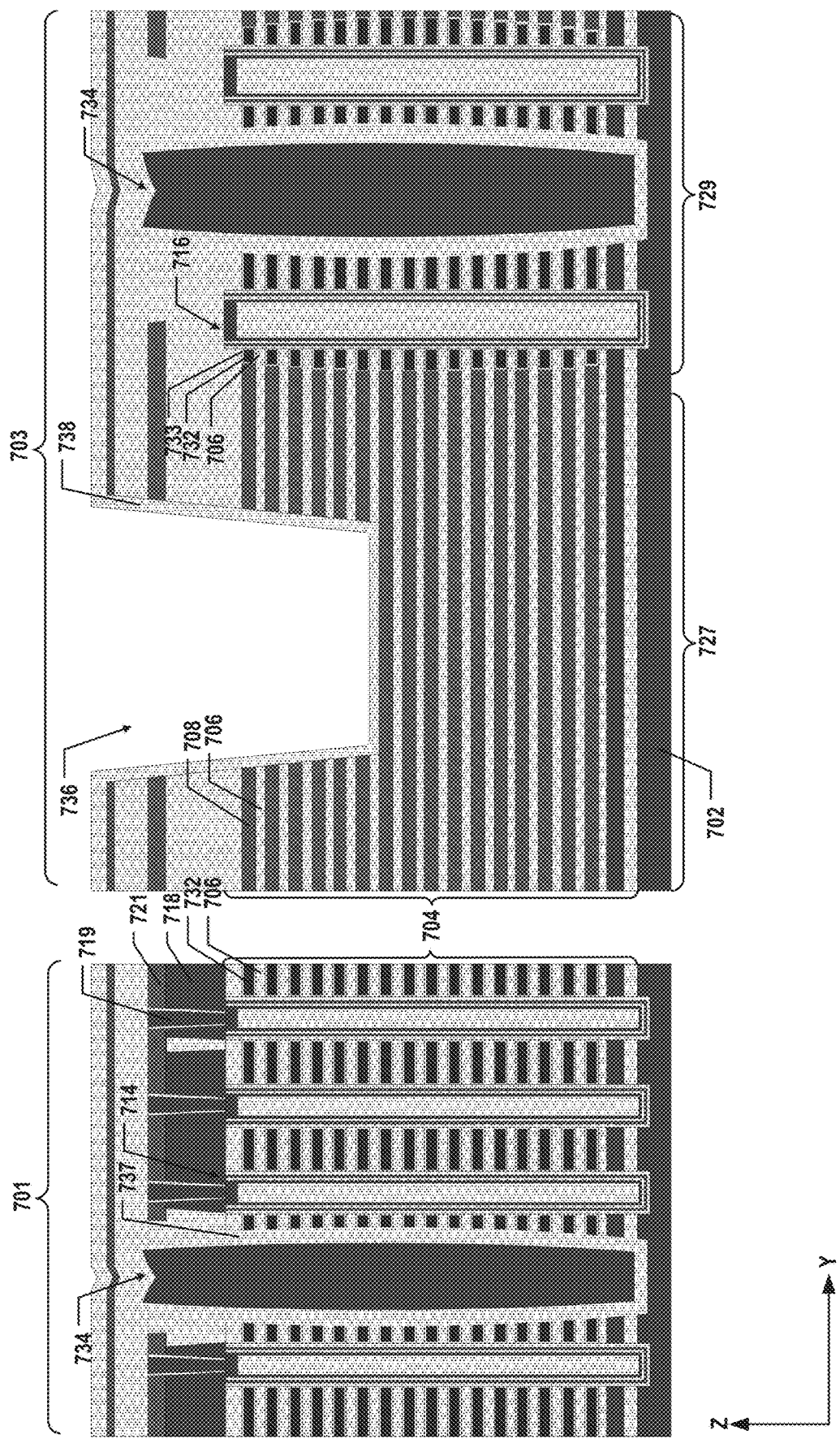
Figure 7L:
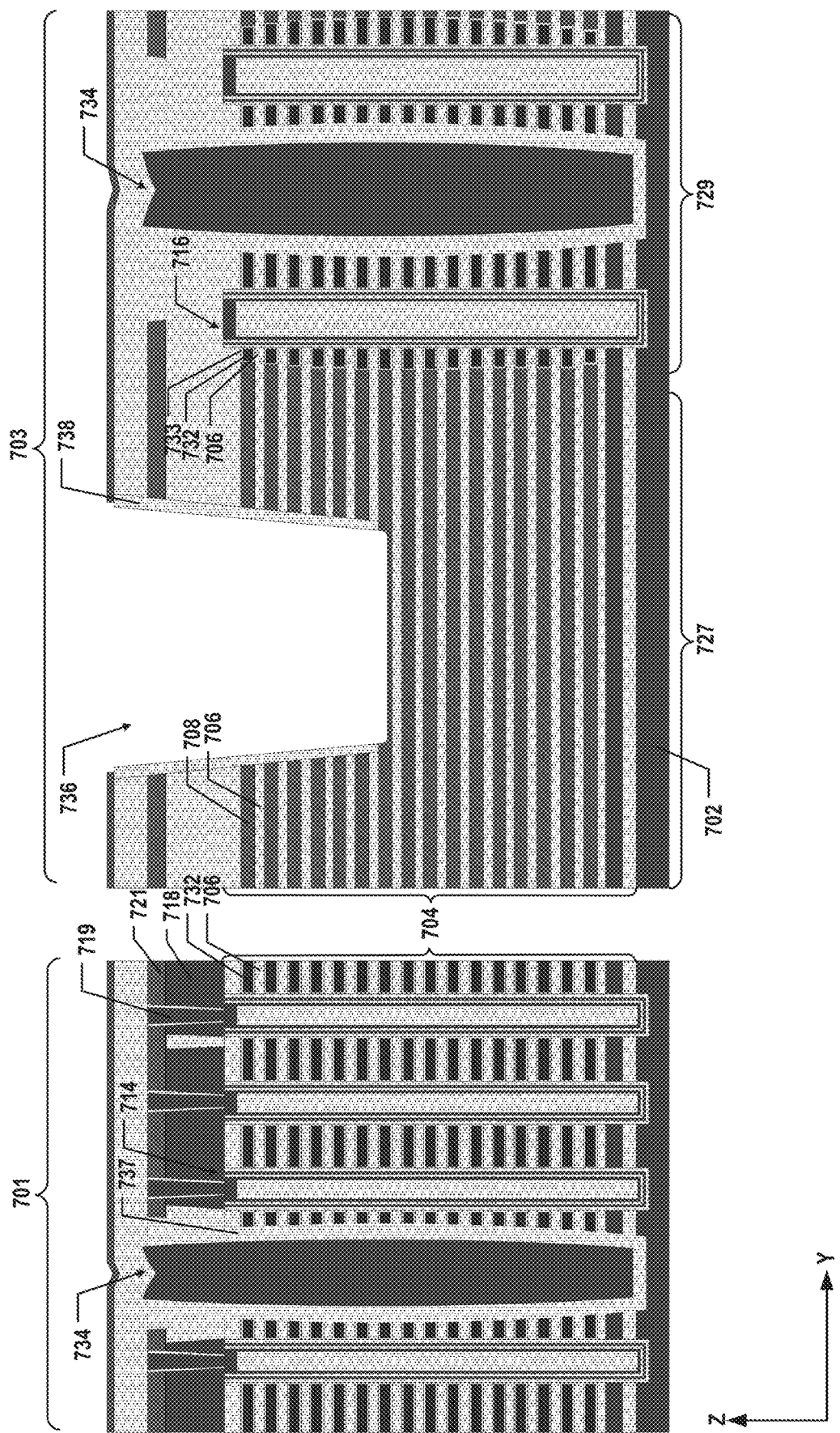
Figure 7M:
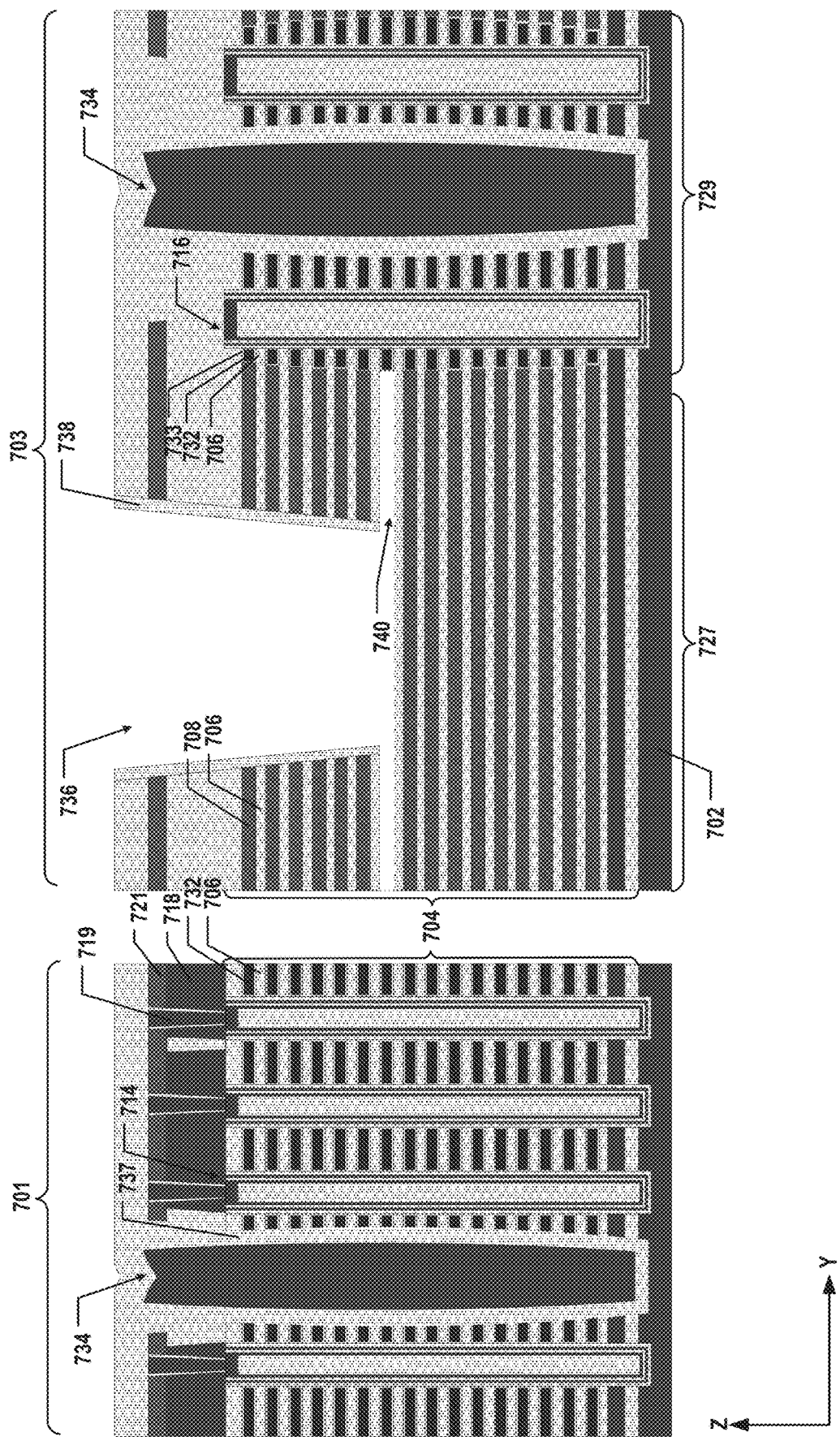
Figure 7N:
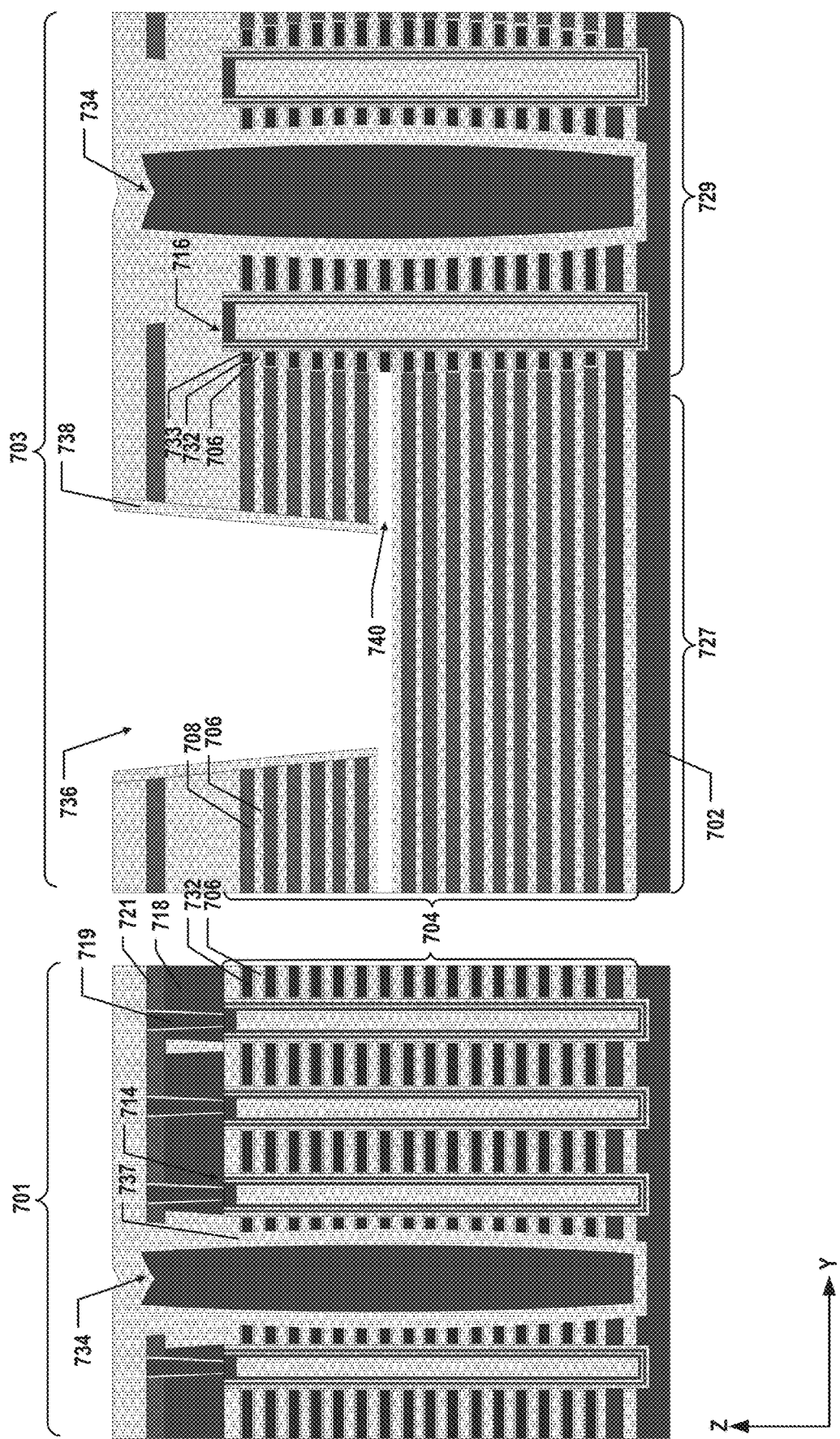
Figure 70:
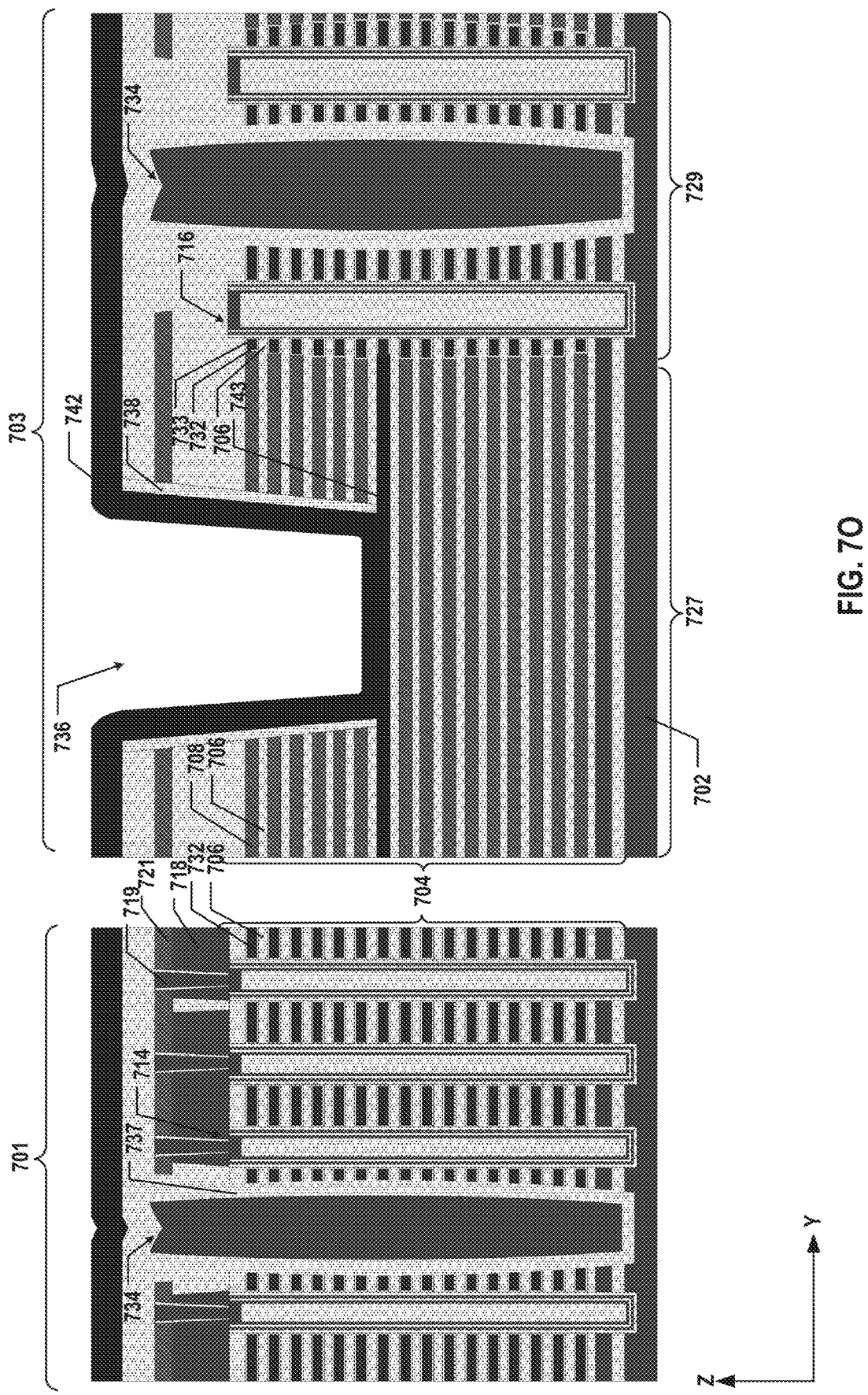
Figure 7P:
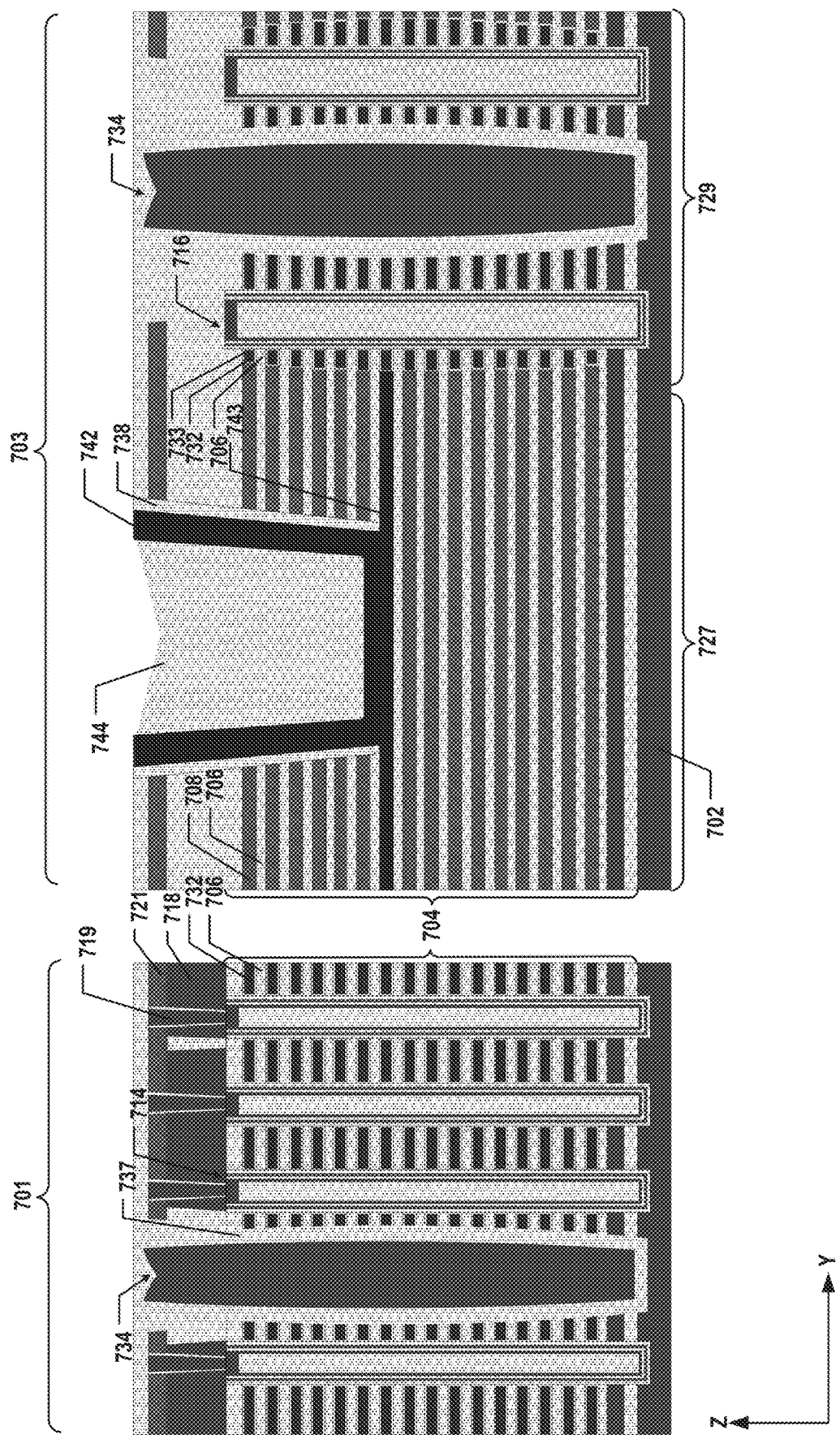
Figure 8A:
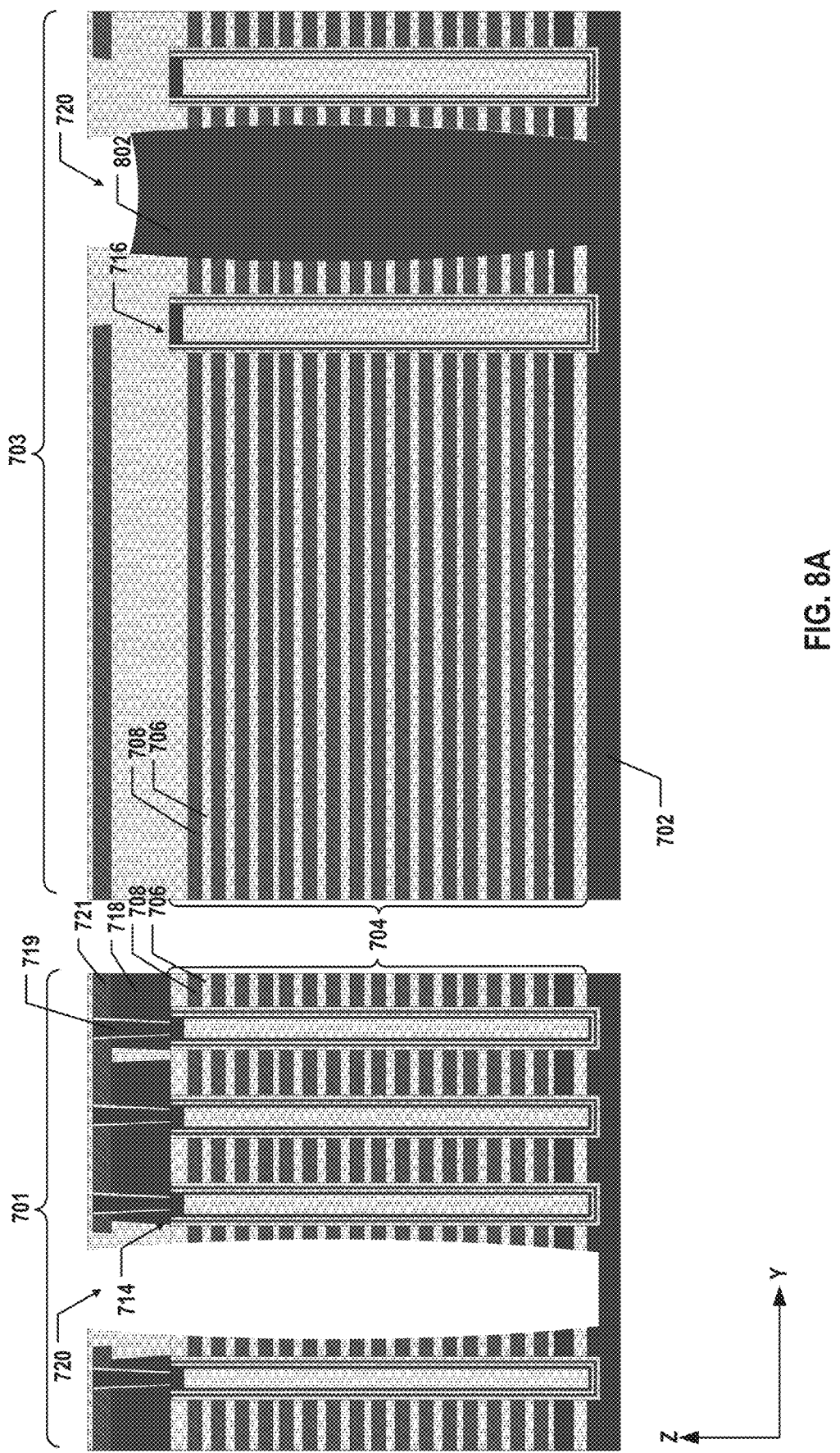
FIGS. 8A-8C illustrate a fabrication process for forming another 3D memory device having word line pick-up structures, according to some aspects of the present disclosure.
Figure 8B:
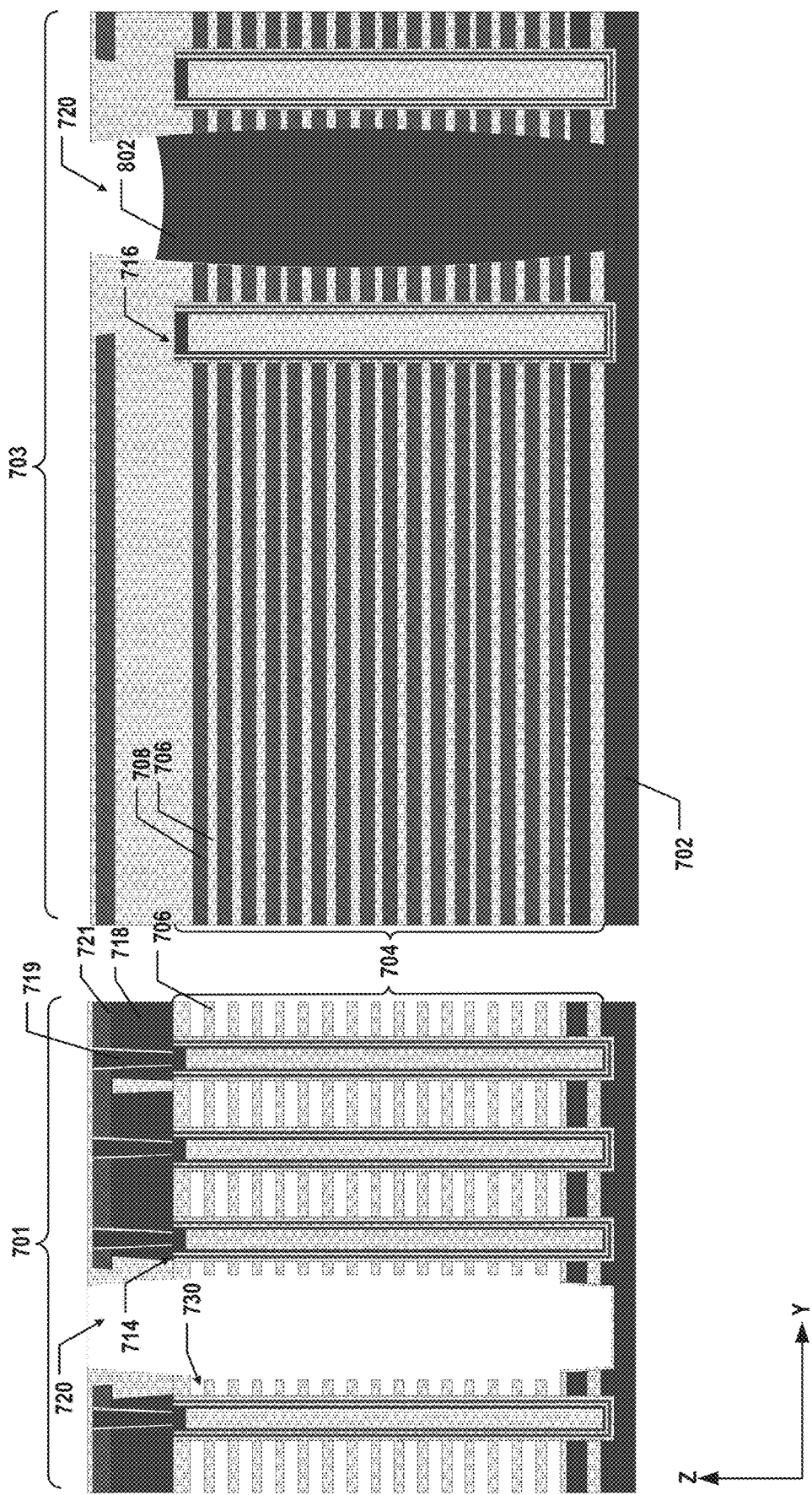
Figure 8C:
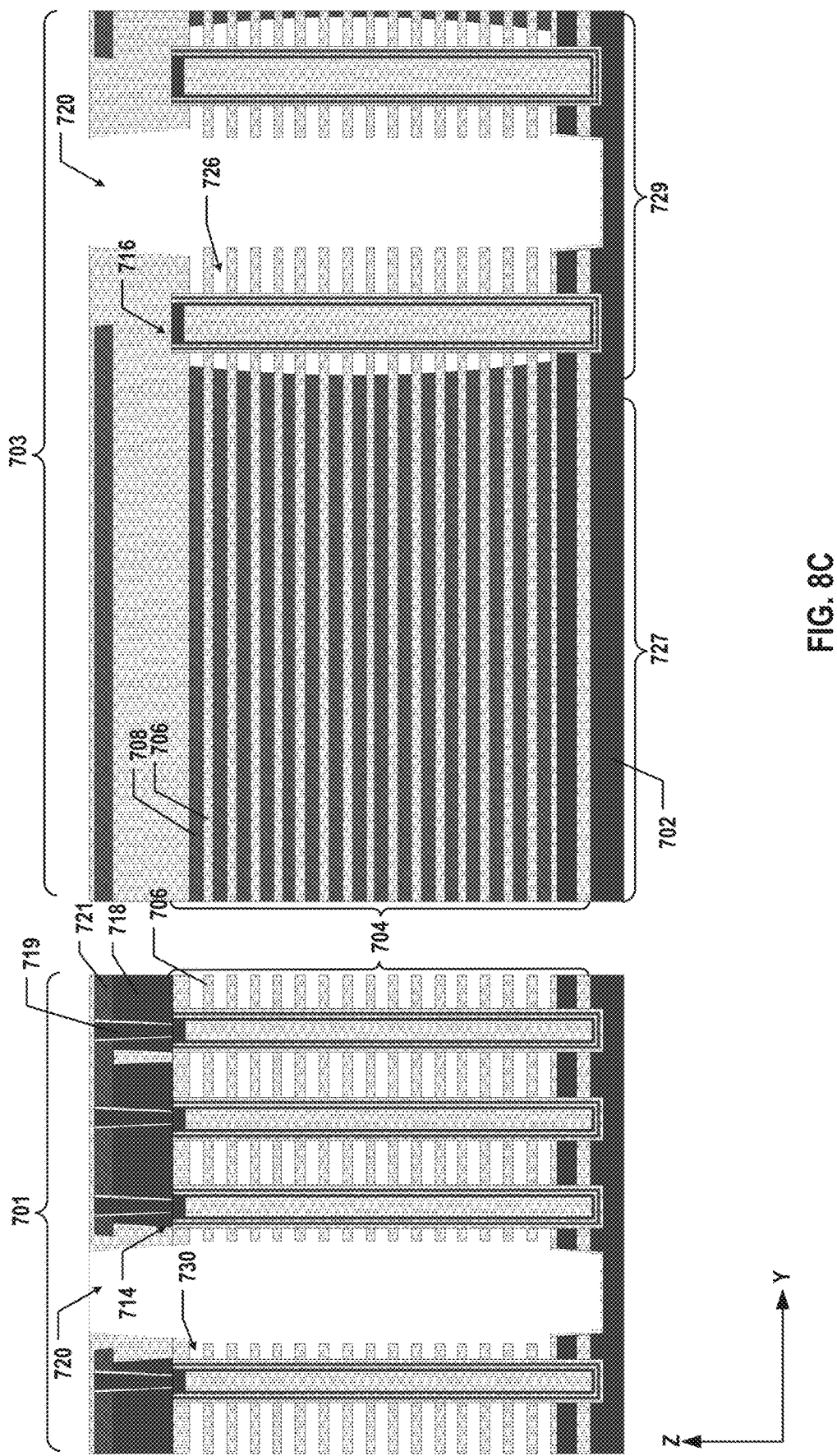
Figure 9:
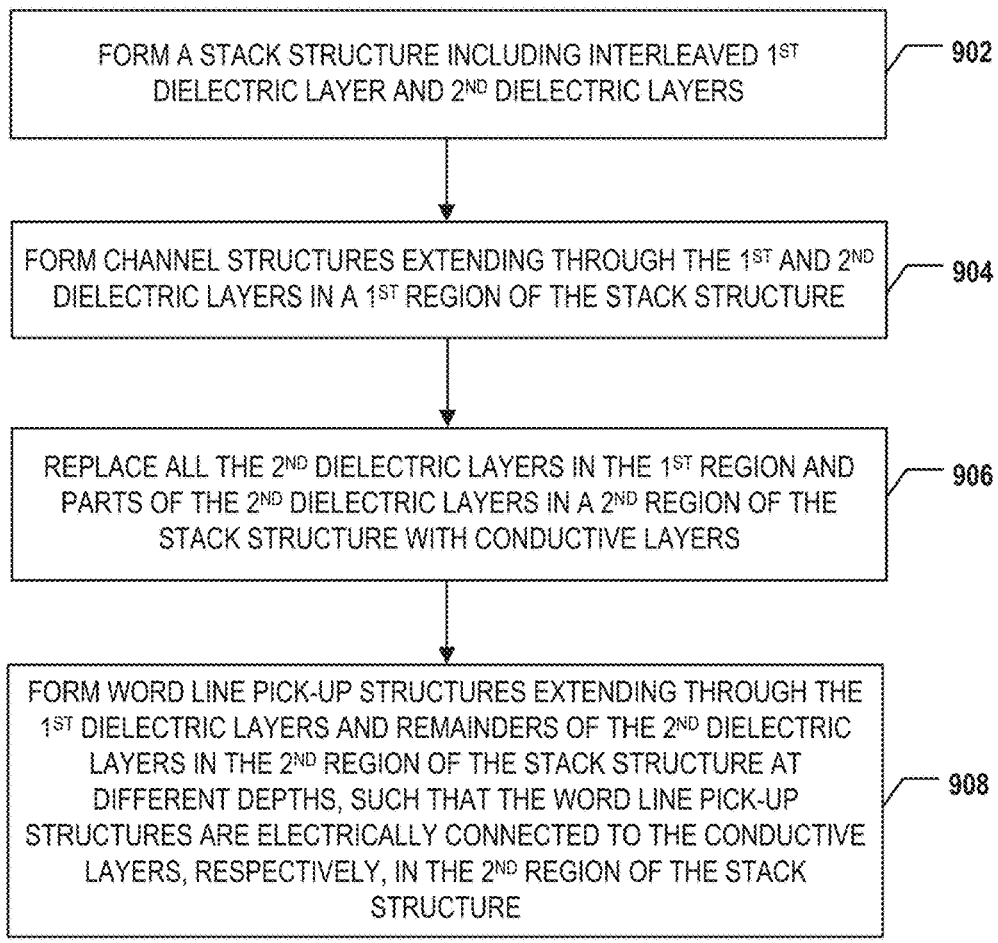
FIG. 9 is a flowchart of a method for forming a 3D memory device having word line pick-up structures, according to some aspects of the present disclosure.

FIGS. 7A-7P illustrate a fabrication process for forming a 3D memory device having word line pick-up structures, according to some aspects of the present disclosure. FIGS. 8A-8C illustrate a fabrication process for forming another 3D memory device having word line pick-up structures, according to some aspects of the present disclosure. FIG. 9 illustrates a flowchart of a method 900 for forming an exemplary 3D memory device having word line pick-up structures, according to some implementations of the present disclosure. Examples of the 3D memory device depicted in FIGS. 7A-7P, 8A-8C, and 9 include 3D memory devices 100 depicted in FIGS. 1-5, 6A, and 6B. FIGS. 7A-7P, 8A-8C, and 9 will be described together. It is understood that the operations shown in method 900 are not exhaustive and that other operations can be performed as well before, after, or between any of the illustrated operations. Further, some of the operations may be performed simultaneously, or in a different order than shown in FIG. 9.

Referring to FIG. 9, method 900 starts at operation 902, in which a stack structure including interleaved first dielectric layers and second dielectric layers is formed. The first dielectric layers can include silicon oxide, and the second dielectric layers can include silicon nitride. In some implementations, to form the stack structure, the first dielectric layers and the second dielectric layers are alternatingly deposited above a substrate. The substrate can be a silicon substrate.

As illustrated in FIG. 7A, a stack structure 704 including multiple pairs of a first dielectric layer 706 and a second dielectric layer 708 (a.k.a., a stack sacrificial layer) is formed above a silicon substrate 702. Stack structure 704 includes vertically interleaved first dielectric layers 706 and second dielectric layers 708, according to some implementations. First and second dielectric layers 706 and 708 can be alternatingly deposited above silicon substrate 702 to form stack structure 704. In some implementations, each first dielectric layer 706 includes a layer of silicon oxide, and each second dielectric layer 708 includes a layer of silicon nitride. Stack structure 704 can be formed by one or more thin film deposition processes including, but not limited to, chemical vapor deposition (CVD), physical vapor deposition (PVD), atomic layer deposition (ALD), or any combination thereof.

Method 900 proceeds to operation 904, as illustrated in FIG. 9, in which channel structures extending through the first dielectric layers and the second dielectric layers are formed in a first region of the stack structure. In some implementations, to form the channel structure, a channel hole extending vertically through the stack structure is formed, and a memory layer and a channel layer are sequentially formed over sidewalls of the channel hole. In some implementations, to form the channel structure, a channel hole extending vertically through the stack structure is formed, and a high-k gate dielectric layer, a memory layer, and a channel layer are sequentially formed over sidewalls of the channel hole. In some implementations, dummy channel structures extending through the first dielectric layers and the second dielectric layers are formed in the second region of the stack structure in the same process of forming the channel structures. That is, channel structures and dummy channel structures can be simultaneously formed through the first dielectric layers and the second dielectric layers in the first region and the second region of the stack structure, respectively.

As illustrated in FIG. 7B, channel structures 714 can be formed in a core array region 701 of stack structure 704, for example, corresponding to core array region 101 of stack structure 201 in FIGS. 1-3. To form each channel structure 714, as illustrated in FIG. 7A, a channel hole 710, which is an opening extending vertically through stack structure 704, can be formed first in core array region 701. In some implementations, a plurality of openings are formed, such that each opening becomes the location for growing an individual channel structure 714 in the later process. In some implementations, fabrication processes for forming channel hole 710 of channel structure 714 include wet etching and/or dry etching, such as deep-ion reactive etching (DRIE).

As illustrated in FIG. 7B, a memory layer (including a blocking layer, a storage layer, and a tunneling layer) and a channel layer are sequentially formed in this order along sidewalls and the bottom surface of channel hole 710, for example, corresponding to the example shown in FIG. 6A. In some implementations, the memory layer is first deposited along the sidewalls and bottom surface of channel hole 710, and the semiconductor channel is then deposited over the memory layer. The blocking layer, storage layer, and tunneling layer can be subsequently deposited in this order using one or more thin film deposition processes, such as ALD, CVD, PVD, any other suitable processes, or any combination thereof, to form the memory layer. The channel layer can then be formed by depositing a semiconductor material, such as polysilicon, over the tunneling layer of the memory layer using one or more thin film deposition processes, such as ALD, CVD, PVD, any other suitable processes, or any combination thereof. In some implementations, a first silicon oxide layer, a silicon nitride layer, a second silicon oxide layer, and a polysilicon layer (a "SONO" structure) are subsequently deposited to form the memory layer and the channel layer of channel structure 714.

In some implementations, a high-k gate dielectric layer is formed before the formation of the memory layer. That is, the high-k gate dielectric layer, memory layer (including the blocking layer, storage layer, and tunneling layer), and the channel layer can be sequentially formed in this order along sidewalls and the bottom surface of channel hole 710, for example, corresponding to the example shown in FIG. 6B. In some implementations, the high-k gate dielectric layer is first deposited along the sidewalls and bottom surfaces of channel hole 710, the memory layer is then deposited over the high-k gate dielectric layer, and the semiconductor channel is then deposited over the memory layer. The high-k gate dielectric layer can be formed by depositing high-k dielectric materials, such as aluminum oxide, using one or more thin film deposition processes, such as ALD, CVD, PVD, any other suitable processes, or any combination thereof. The blocking layer, storage layer, and tunneling layer can be subsequently deposited in this order using one or more thin film deposition processes, such as ALD, CVD, PVD, any other suitable processes, or any combination thereof, over the high-k gate dielectric layer to form the memory layer. The channel layer can then be formed by depositing a semiconductor material, such as polysilicon, over the tunneling layer of the memory layer using one or more thin film deposition processes, such as ALD, CVD, PVD, any other suitable processes, or any combination thereof. In some implementations, an aluminum oxide layer, a first silicon oxide layer, a silicon nitride layer, a second silicon oxide layer, and a polysilicon layer (a "SONO" structure) are subsequently deposited to form the high-k gate dielectric layer, the memory layer, and the channel layer of channel structure 714.

In some implementations, as illustrated in FIG. 7B, dummy channel structures 716 can be formed in a word line pick-up region 703 of stack structure 704, for example, corresponding to word line pick-up region 103 of stack structure 201 in FIGS. 1-3, in the same process of forming channel structures 714. To form each dummy channel structure 716, as illustrated in FIG. 7A, a dummy channel hole 712, which is another opening extending vertically through stack structure 704, can be formed in word line pick-up region 703 simultaneously as channel hole 710 by the same wet etching and/or dry etching, such as DRIE. As illustrated in FIG. 7B, dummy channel structure 716 can then be formed simultaneously as channel structure 714 by the same thin film deposition processes, such as ALD, CVD, PVD, any other suitable processes, or any combination thereof that deposit a memory layer (including a blocking layer, a storage layer, and a tunneling layer) and a channel layer, or a high-k gate dielectric layer, a memory layer (including a blocking layer, a storage layer, and a tunneling layer), and a channel layer. It is understood that in some examples, dummy channel structures 716 may be formed in a separate process from channel structures 714.

As illustrated in FIG. 7C, a DSG layer 718 and a stop layer 721 are formed on core array region 701 of stack structure 704. DSG layer 718 can include a semiconductor layer, such as a polysilicon layer, and stop layer 721 can include a silicon nitride layer. DSG layer 718 and stop layer 721 can be sequentially deposited on core array region 701, but not on word line pick-up region 703, of stack structure 704 using one or more thin film deposition processes including, but not limited to, CVD, PVD, ALD, or any combination thereof. DSG channel structures 719 can be formed extending vertically through DSG layer 718 and stop layer 721 to be in contact with the upper ends of channel structures 714, but not dummy channel structures 716, as shown in FIG. 7C. To form DSG channel structures 719, DSG holes can be etched through DSG layer 718 and stop layer 721 to expose the upper ends of channel structures 714, respectively, and a spacer (e.g., having silicon oxide) and a semiconductor layer (e.g., having polysilicon) can be sequentially deposited into the DSG holes using one or more thin film deposition processes, such as CVD, PVD, ALD, or any combination thereof, to fill the DSG holes.

Figure 10A:
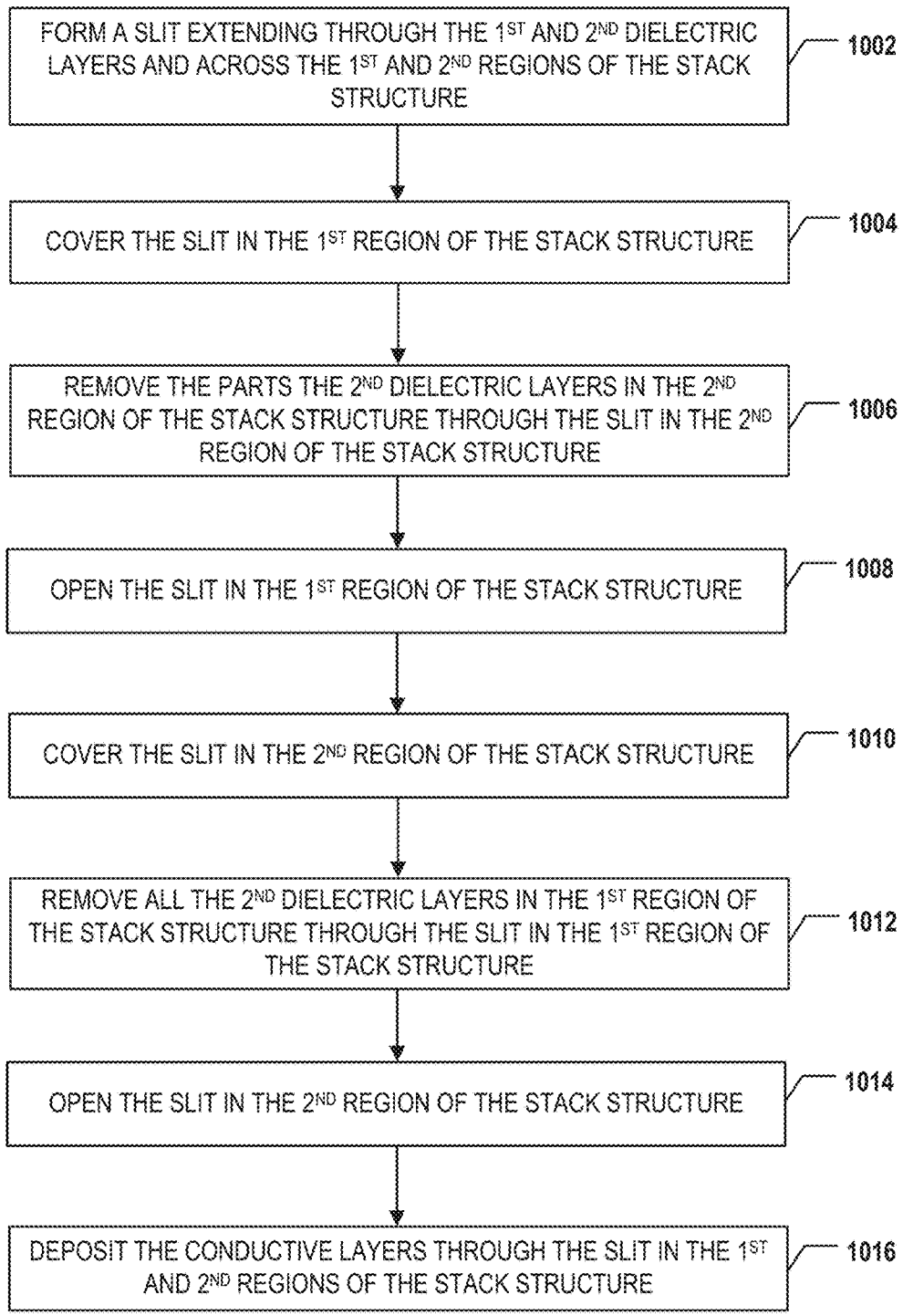
FIG. 10A is a flowchart of a method for a gate replacement, according to some aspects of the present disclosure.

Method 900 proceeds to operation 906, as illustrated in FIG. 9, in which all the second dielectric layers in the first region and parts of the second dielectric layers in a second region of the stack structure are replaced with conductive layers, for example, by a gate replacement process. The conductive layer can include a metal. FIG. 10A is a flowchart of method 906 for a gate replacement, according to some aspects of the present disclosure. At operation 1002, a slit extending through the first dielectric layers and the second dielectric layers and across the first region and the second region of the stack structure is formed. In some implementations, the slit extends vertically through the local contact layer as well.

As illustrated in FIG. 7D, a slit 720 is an opening that extends vertically through stop layer 721, DSG layer 718, and first dielectric layers 706 and second dielectric layers 708 (a.k.a., stack sacrificial layers) of stack structure 704 until silicon substrate 702. Slit 720 can also extend laterally across core array region 701 and word line pick-up region 703 in the x-direction (the word line direction), for example, corresponding to slit structure 108 in FIG. 1. In some implementations, fabrication processes for forming slit 720 include wet etching and/or dry etching, such as DRIE, of first dielectric layers 706 and second dielectric layers 708. The etching process through stack structure 704 may not stop at the top surface of silicon substrate 702 and may continue to etch part of silicon substrate 702 to ensure that slit 720 extends vertically all the way through all first dielectric layers 706 and second dielectric layers 708 of stack structure 704.

At operation 1004, the slit in the first region of the stack structure is covered. As illustrated in FIG. 7E, the part of slit 720 in core array region 701 is covered by a sacrificial layer 724. In some implementations, sacrificial layer 724 that is different from first dielectric layers 706 and second dielectric layers 708, such as a polysilicon layer or a carbon layer, is deposited into slit 720 using one or more thin film deposition processes, such as CVD, PVD, ALD, or any combination thereof, to at least partially fill slit 720 (covering the exposed first dielectric layers 706 and second dielectric layers 708 in slit 720). Sacrificial layer 724 can then be patterned using lithography and wet etching and/or dry etching to remove the part of sacrificial layer 724 in word line pick-up region 703, leaving only the part of sacrificial layer 724 in core array region 701 to cover only the part of slit 720 in core array region 701.

At operation 1006, the parts of the second dielectric layers in the second region of the stack structure are removed through the slit in the second region of the stack structure. As illustrated in FIG. 7E, parts of second dielectric layers 708 in a conductive portion 729 of word line pick-up region 703 are removed by wet etching to form lateral recesses 726, leaving the remainders of second dielectric layers 708 in a dielectric portion 727 of word line pick-up region 703 intact. In some implementations, the parts of second dielectric layers 708 are wet etched by applying a wet etchant through the part of slit 720 in word line pick-up region 703 that is uncovered by sacrificial layer 724, creating lateral recesses 726 interleaved between first dielectric layers 706. The wet etchant can include phosphoric acid for etching second dielectric layers 708 including silicon nitride. In some implementations, the etching rate and/or etching time are controlled to remove only the parts of second dielectric layers 708 in conductive portion 729, leaving the remainders of second dielectric layers 708 intact in dielectric portion 727. By controlling the etching time, the wet etchant does not travel all the way to completely remove second dielectric layers 708 in word line pick-up region 703, thereby defining two portions in word line pick-up region 703-dielectric portion 709 in which second dielectric layers 708 are removed, and dielectric portion 727 in which second dielectric layers 708 remain. As illustrated in FIG. 7E, since the part of slit 720 in core array region 701 is covered by sacrificial layer 724 that is resistant to the etchant for removing second dielectric layers 708, all second dielectric layers 708 remain intact in core array region 701 at operation 1006.

At operation 1008, the slit in the first region of the stack structure is opened. As illustrated in FIG. 7F, the part of slit 720 in core array region 701 is re-opened by removing sacrificial layer 724 (shown in FIG. 7E) to expose first dielectric layers 706 and second dielectric layers 708 (shown in FIG. 7E). In some implementations, sacrificial layer 724 is selectively etched away from the part of slit 720 in core array region 701, for example, using potassium hydroxide (KOH) for etching sacrificial layer 724 having polysilicon, to open the part of slit 720 in core array region 701.

At operation 1010, the slit in the second region of the stack structure is covered. As illustrated in FIG. 7F, lateral recesses 726 (shown in FIG. 7E) and the part of slit 720 in word line pick-up region 703 are covered by a sacrificial layer 728. In some implementations, sacrificial layer 728 that is different from first dielectric layers 706 and second dielectric layers 708, such as a polysilicon layer or a carbon layer, is deposited into lateral recesses 726 and slit 720 using one or more thin film deposition processes, such as CVD, PVD, ALD, or any combination thereof, to at least partially fill slit 720 (covering the exposed first dielectric layers 706 and second dielectric layers 708). Sacrificial layer 728 can then be patterned using lithography and wet etching and/or dry etching to remove the part of sacrificial layer 728 in core array region 701, leaving only the part of sacrificial layer 728 in word line pick-up region 703 to cover only lateral recesses 726 and the part of slit 720 in word line pick-up region 703, but not in core array region 701. It is understood that lateral recesses 726 may be considered as parts of slit 720 in word line pick-up region 703. Thus, even if only lateral recesses 726 are fully or partially filled by sacrificial layer 728 (e.g., as shown in FIG. 7F), the part of slit 720 in word line pick-up region 703 may still be considered as being covered.

At operation 1012, all the second dielectric layers in the first region of the stack structure are removed through the slit in the first region of the stack structure. As illustrated in FIG. 7F, all second dielectric layers 708 (as shown in FIG. 7E) in core array region 701 are fully removed by wet etching to form lateral recesses 730. In some implementations, second dielectric layers 708 are wet etched by applying a wet etchant through the part of slit 720 in core array region 701 that is uncovered by sacrificial layer 728, creating lateral recesses 730 interleaved between first dielectric layers 706. The wet etchant can include phosphoric acid for etching second dielectric layers 708 including silicon nitride. In some implementations, the etching rate and/or etching time are controlled to ensure that all second dielectric layers 708 in core array region 701 are completely etched away. As illustrated in FIG. 7F, since the part of slit 720 in word line pick-up region 703 is covered by sacrificial layer 728 that is resistant to the etchant for removing second dielectric layers 708, the remainders of second dielectric layers 708 in dielectric portion 727 of word line pick-up region 703 remain intact at operation 1012.

At operation 1014, the slit in the second region of the stack structure is opened. As illustrated in FIG. 7G, the part of slit 720 in word line pick-up region 703 is re-opened by removing sacrificial layer 728 (shown in FIG. 7F) to expose first dielectric layers 706 and the remainders of second dielectric layers 708 in word line pick-up region 703. In some implementations, sacrificial layer 728 is selectively etched away from the part of slit 720 in word line pick-up region 703, for example, using KOH for etching sacrificial layer 728 having polysilicon, to open the part of slit 720 (and lateral recesses 726) in word line pick-up region 703.

At operation 1016, the conductive layers are deposited through the slit in the first region and the second region of the stack structure. As illustrated in FIG. 7H, conductive layers 732 are deposited into lateral recesses 730 and 726 (shown in FIG. 7G) in core array region 701 and conductive portion 729 of word line pick-up region 703 through slit 720. In some implementations in which high-k gate dielectric layers are not formed in channel structures 714, high-k gate dielectric layers 733 are deposited into lateral recesses 726 and 730 prior to conductive layers 732, such that conductive layers 732 are deposited on and surrounded by high-k gate dielectric layers 733, for example, corresponding to the example shown in FIG. 6A. In some implementations in which high-k gate dielectric layers are formed in channel structures 714, high-k gate dielectric layers are not deposited into lateral recesses 726 and 730 prior to conductive layers 732, such that conductive layers 732 are deposited on and surrounded by first dielectric layers 706, for example, corresponding to the example shown in FIG. 6B. Conductive layers 732, such as metal layers, can be deposited using one or more thin film deposition processes, such as ALD, CVD, PVD, any other suitable processes, or any combination thereof.

Figure 10B:
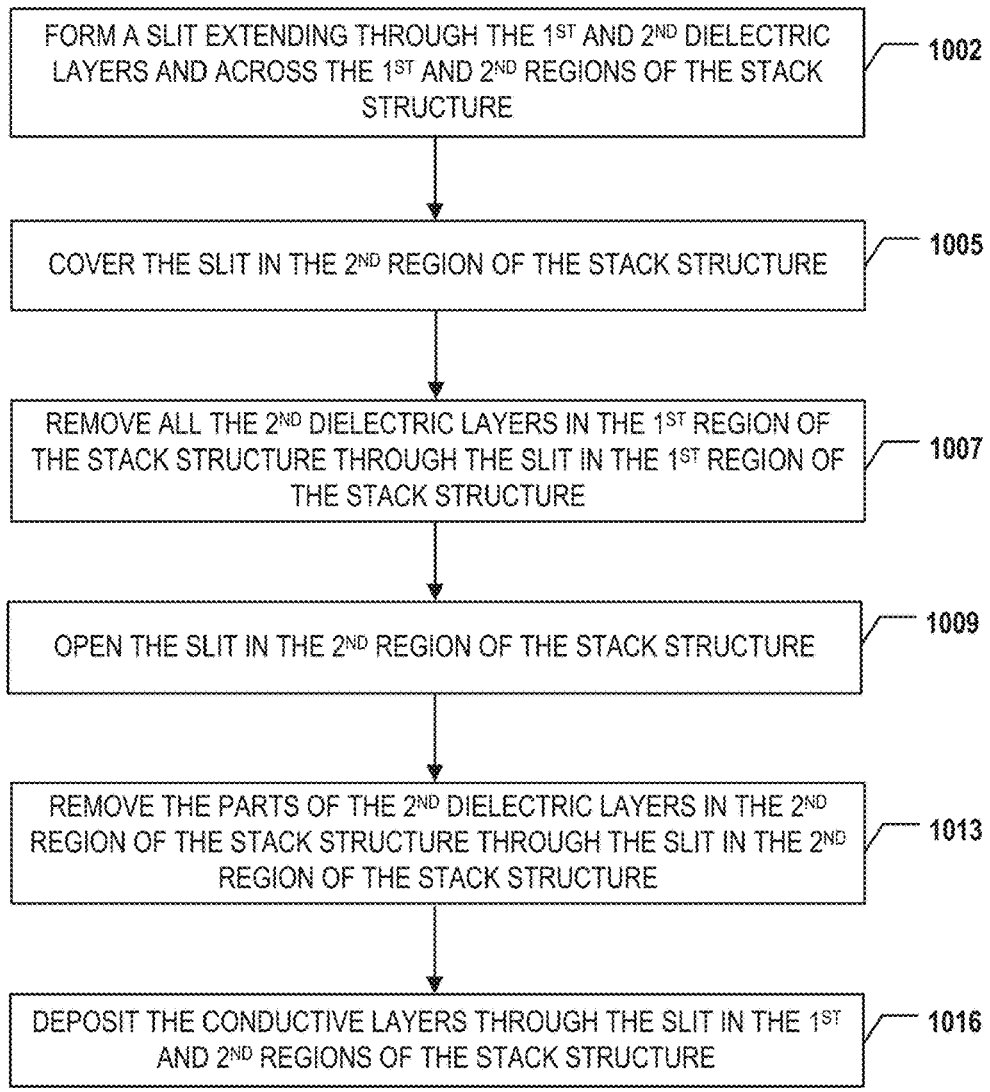
FIG. 10B is a flowchart of a method for another gate replacement, according to some aspects of the present disclosure

As described above, the removal of second dielectric layers 708 (stack sacrificial layers, e.g., having silicon nitride) can be performed separately in core array region 101 and word line pick-up region 103 by partially covering slit 720 in core array region 101 or word line pick-up region 103 to allow second dielectric layers 708 to be removed at different scopes (e.g., fully removal in core array region 101 and partial removal in word line pick-up region 103). In the gate replacement process described above with respect to FIG. 10A, the removal of second dielectric layers 708 is performed first in word line pick-up region 703, and then in core array region 701. It is understood that in another gate replace process, the removal of second dielectric layers 708 may be performed first in core array region 701, and then in word line pick-up region 703, for example, as shown in FIGS. 8A-8C and 10B. FIG. 10B is a flowchart of method 906 for another gate replacement, according to some aspects of the present disclosure. At operation 1002, a slit extending through the first dielectric layers and the second dielectric layers and across the first region and the second region of the stack structure is formed. In some implementations, the slit extends vertically through the local contact layer as well.

As illustrated in FIG. 7D, a slit 720 is an opening that extends vertically through stop layer 721, DSG layer 718, and first dielectric layers 706 and second dielectric layers 708 of stack structure 704 until silicon substrate 702. Slit 720 can also extend laterally across core array region 701 and word line pick-up region 703 in the x-direction (the word line direction), for example, corresponding to slit structure 108 in FIG. 1. In some implementations, fabrication processes for forming slit 720 include wet etching and/or dry etching, such as DRIE, of first dielectric layers 706 and second dielectric layers 708. The etching process through stack structure 704 may not stop at the top surface of silicon substrate 702 and may continue to etch part of silicon substrate 702 to ensure that slit 720 extends vertically all the way through all first dielectric layers 706 and second dielectric layers 708 of stack structure 704.

At operation 1005, the slit in the second region of the stack structure is covered. As illustrated in FIG. 8A, the part of slit 720 in word line pick-up region 703 is covered by a sacrificial layer 802. In some implementations, sacrificial layer 802 that is different from first dielectric layers 706 and second dielectric layers 708, such as a polysilicon layer or a carbon layer, is deposited into slit 720 using one or more thin film deposition processes, such as CVD, PVD, ALD, or any combination thereof, to at least partially fill slit 720 (covering the exposed first dielectric layers 706 and second dielectric layers 708 in slit 720). Sacrificial layer 802 can then be patterned using lithography and wet etching and/or dry etching to remove the part of sacrificial layer 802 in core array region 701, leaving only the part of sacrificial layer 802 in word line pick-up region 703 to cover only the part of slit 720 in word line pick-up region 703.

At operation 1007, all the second dielectric layers in the first region of the stack structure are removed through the slit in the first region of the stack structure. As illustrated in FIG. 8B, all second dielectric layers 708 (as shown in FIG. 8A) in core array region 701 are fully removed by wet etching to form lateral recesses 730. In some implementations, second dielectric layers 708 are wet etched by applying a wet etchant through the part of slit 720 in core array region 701 that is uncovered by sacrificial layer 802, creating lateral recesses 730 interleaved between first dielectric layers 706. The wet etchant can include phosphoric acid for etching second dielectric layers 708 including silicon nitride. In some implementations, the etching rate and/or etching time are controlled to ensure that all second dielectric layers 708 in core array region 701 are completely etched away. As illustrated in FIG. 8B, since the part of slit 720 in word line pick-up region 703 is covered by sacrificial layer 802 that is resistant to the etchant for removing second dielectric layers 708, second dielectric layers 708 in word line pick-up region 703 remain intact at operation 1007.

At operation 1009, the slit in the second region of the stack structure is opened. As illustrated in FIG. 8C, the part of slit 720 in word line pick-up region 703 is re-opened by removing sacrificial layer 802 (shown in FIG. 8B) to expose first dielectric layers 706 and second dielectric layers 708 in word line pick-up region 703. In some implementations, sacrificial layer 802 is selectively etched away from the part of slit 720 in word line pick-up region 703, for example, using KOH for etching sacrificial layer 802 having polysilicon, to open the part of slit 720 in word line pick-up region 703.

At operation 1013, the parts of the second dielectric layers in the second region of the stack structure are removed through the slit in the second region of the stack structure. As illustrated in FIG. 8C, parts of second dielectric layers 708 in conductive portion 729 of word line pick-up region 703 are removed by wet etching to form lateral recesses 726, leaving the remainders of second dielectric layers 708 in dielectric portion 727 of word line pick-up region 703 intact. In some implementations, the parts of second dielectric layers 708 are wet etched by applying a wet etchant through the part of slit 720 in word line pick-up region 703, creating lateral recesses 726 interleaved between first dielectric layers 706. The wet etchant can include phosphoric acid for etching second dielectric layers 708 including silicon nitride. In some implementations, the etching rate and/or etching time are controlled to remove only the parts of second dielectric layers 708 in conductive portion 729, leaving the remainders of second dielectric layers 708 intact in dielectric portion 727. By controlling the etching time, the wet etchant does not travel all the way to completely remove second dielectric layers 708 in word line pick-up region 703, thereby defining two portions in word line pick-up region 703-conductive portion 729 in which second dielectric layers 708 are removed, and dielectric portion 727 in which second dielectric layers 708 remain. As illustrated in FIG. 8C, since all second dielectric layers 708 in core array region 701 have already been removed at operation 1007, the part of slit 720 in core array region 701 may not need to be covered at operation 1013.

At operation 1016, the conductive layers are deposited through the slit in the first region and the second region of the stack structure. As illustrated in FIG. 7H, conductive layers 732 are deposited into lateral recesses 730 and 726 (shown in FIG. 8C) in core array region 701 and conductive portion 729 of word line pick-up region 703 through slit 720. In some implementations in which high-k gate dielectric layers are not formed in channel structures 714, high-k gate dielectric layers 733 are deposited into lateral recesses 726 and 730 prior to conductive layers 732, such that conductive layers 732 are deposited on and surrounded by high-k gate dielectric layers 733, for example, corresponding to the example shown in FIG. 6A. In some implementations in which high-k gate dielectric layers are formed in channel structures 714, high-k gate dielectric layers are not deposited into lateral recesses 726 and 730 prior to conductive layers 732, such that conductive layers 732 are deposited on and surrounded by first dielectric layers 706, for example, corresponding to the example shown in FIG. 6B. Conductive layers 732, such as metal layers, can be deposited using one or more thin film deposition processes, such as ALD, CVD, PVD, any other suitable processes, or any combination thereof.

After the gate replacement processes described above with respect to FIGS. 10A and 10B, stack structure 704 can be redefined into two stack structures—a conductive stack structure including interleaved conductive layers 732 and first dielectric layers 706 in core array region 701 as well as in conductive portion 729 of word line pick-up region 703, and a dielectric stack structure including interleaved first dielectric layers 706 and the remainders of second dielectric layers 708 in dielectric portion 727 of word line pick-up region 703. That is, all second dielectric layers 708 in core array region 701 and parts of second dielectric layers 708 in word line pick-up region 703 of stack structure 704 are replaced with conductive layers 732, according to some implementations. Moreover, in some examples, since the dielectric stack structure in dielectric portion 727 of word line pick-up region 703 remains intact during the gate replacement process (without removal of the remainders of second dielectric layers 708 therein), dummy channel structures 716 may not need to be formed in dielectric portion 727 of word line pick-up region 703 to provide mechanical support when removing second dielectric layer 708.

Referring back to FIG. 9, method 900 proceeds to operation 908, as illustrated in FIG. 9, in which word line pick-up structures extending through the first dielectric layers and remainders of the second dielectric layers in the second region of the stack structure are formed at different depths, such that the word line pick-up structures are electrically connected to the conductive layers, respectively, in the second region of the stack structure.

In some implementations, before forming the word line pick-up structures, a first spacer is formed in the slit. As illustrated in FIG. 7I, a slit spacer 737 is formed in slit 720 (shown in FIG. 7H) to form a slit structure 734 extending vertically through interleaved conductive layers 732 and first dielectric layers 706 of stack structure 704 and laterally across core array region 701 and conductive portion 729 of word line pick-up region 703. Slit spacer 737 can be formed by depositing dielectrics into slit 720 using one or more thin film deposition processes, such as ALD, CVD, PVD, any other suitable processes, or any combination thereof. In some implementations, conductive materials (e.g., as a source contact) are deposited into slit 720 after slit spacer 737 as part of slit structure 734.

In some implementations, to form the word line pick-up structures, word line pick-up openings extending through the first dielectric layers and the remainders of the second dielectric layers in the second region of the stack structure are formed at different depths to expose the remainders of the second dielectric layers in the second regions of the stack structure, respectively. As illustrated in FIG. 7J, an opening 736 extends vertically through a number of pairs of first and second dielectric layers 706 and 708 of the dielectric stack structure in dielectric portion 727 of word line pick-up region 703. In some implementations, a plurality of openings 736 are formed extending through different numbers of pairs of first and second dielectric layers 706 and 708 in dielectric portion 727, stopping at different depths, for example, corresponding to the examples shown in FIG. 4. Openings 736 can be formed using a chopping process. As used herein, a "chopping" process is a process that increases the depth of one or more openings extending through a dielectric stack structure including interleaved first and second dielectric layers by a plurality of etching cycles. Each etch cycle can include one or more dry etch and/or wet etch processes that etch one pair of first and second dielectric layers, i.e., reducing the depth by one dielectric layer pair. The purpose of the chopping process is to make multiple openings 736 at different depths. Accordingly, depending on the number of openings 736, a certain number of chopping processes, along with a number of chopping masks, may be needed. It is understood that the number of chopping masks, the sequence of the chopping masks, the design (e.g., the number and pattern of openings) of each chopping mask, and/or the reduced depth by each chopping process (e.g., the number of etching cycles) may affect the specific depth of each opening 736 after the chopping process. A detailed description of the chopping process can be referenced in U.S. patent application Ser. No. 16/881,168, filed on May 22, 2022, and U.S. patent application Ser. No. 16/881,339, filed on May 22, 2022, both of which are incorporated by reference in their entireties herein.

It is understood that the chopping process can be more easily performed through a dielectric stack structure including interleaved first and second dielectric layers (e.g., silicon oxide and silicon nitride), as opposed to a conductive stack structure including interleaved conductive layers and dielectric layers (e.g., metal and silicon oxide) due to the etching properties of the different materials. Thus, the dielectric stack structure remains after the gate replacement process in dielectric portion 727 of word line pick-up region 703 is suitable for forming openings 736 for word line pick-up structures at different depths using the chopping process, according to some implementations.

In some implementations, to form the word line pick-up structures, a second spacer is formed on sidewalls and a bottom of each of the word line pick-up openings. As illustrated in FIG. 7K, a contact spacer 738 is formed on the sidewalls and the bottom surface of opening 736, thereby covering first dielectric layers 706 and second dielectric layers 708 exposed from the sidewalls of opening 736. In some implementations, contact spacer 738 is formed by depositing dielectric materials, such as silicon oxide, using one or more thin film deposition processes, such as ALD, CVD, PVD, any other suitable processes, or any combination thereof, over the sidewalls and the bottom surface of opening 736.

In some implementations, to form the word line pick-up structures, the second spacer on the bottom of the word line pick-up opening is removed to expose the respective part of the remainder of the second dielectric layer. As illustrated in FIG. 7L, the part of contact spacer 738 on the bottom surface of opening 736 is removed, for example, by dry etching, to expose part of second dielectric layer 708 in dielectric portion 727 of word line pick-up region 703. In some implementations, the etching rate, direction, and/or duration of RIE are controlled to etch only the part of contact spacer 738 on the bottom surface, but not on the sidewalls, of opening 736, i.e., "punching" through contact spacer 738 in the z-direction to expose only a corresponding second dielectric layer 708 from the bottom, but not other second dielectric layers 708 from the sidewalls.

In some implementations, to form the word line pick-up structures, parts of the remainders of the second dielectric layers in the second region of the stack structure are replaced with interconnect lines, respectively, through the word line pick-up openings, such that the interconnect lines are in contact with the conductive layers, respectively, in the second region of the stack structure. In some implementations, to replace the parts of the second dielectric layers with the interconnect lines, the exposed part of the remainder of the second dielectric layer is etched through the word line pick-up opening to expose the respective conductive layer in the second region of the stack structure, and the respective interconnect line is deposited through the word line pick-up opening to be in contact with the exposed respective conductive layer in the second region of the stack structure.

As illustrated in FIG. 7M, part of second dielectric layer 708 exposed from the bottom of opening 736 is removed by wet etching to form a lateral recess 740, leaving the remainder of second dielectric layer 708 at the same level, as well as other second dielectric layers 708 at other levels, in dielectric portion 727 of word line pick-up region 703 intact. Lateral recess 740 can expose a corresponding conductive layer 732 at the same level in conductive portion 729 of word line pick-up region 703. In some implementations, the part of second dielectric layer 708 is wet etched by applying a wet etchant through opening 736, creating lateral recess 740 sandwiched between two first dielectric layers 706. The wet etchant can include phosphoric acid for etching second dielectric layer 708 including silicon nitride. In some implementations, the etching rate and/or etching time are controlled to remove only part of second dielectric layer 708 that is enough to expose corresponding conductive layer 732 at the same level in conductive portion 729. By controlling the etching time, the wet etchant does not travel all the way to completely remove second dielectric layer 708 in dielectric portion 727. As a result, dummy channel structures 716 may not need to be formed in dielectric portion 727 of word line pick-up region 703 to provide mechanical support when removing second dielectric layer 708. As illustrated in FIG. 7M, since the sidewalls of opening 736 are still covered by contact spacer 738 (e.g., silicon oxide) that is resistant to the etchant for removing second dielectric layers 708 (e.g., silicon nitride), second dielectric layers 708 at other levels remain intact in dielectric portion 727.

In some implementations in which high-k gate dielectric layers 733 are formed surrounding conductive layers 732, as opposed to in channel structures 714, as illustrated in FIG. 7N, once the exposed part of second dielectric layer 708 is etched from opening 736, the corresponding high-k gate dielectric layer 733 surrounding the corresponding conductive layer 732 at the same level is exposed. The exposed part of the corresponding high-k gate dielectric layer 733 can then be etched, for example, using wet etching, to expose the corresponding conductive layer 732 at the same level. It is understood that in some examples in which high-k gate dielectric layers 733 are formed in channel structures 714, as opposed to surrounding conductive layers 732, the etching of high-k gate dielectric layer 733 may be skipped as the etching of second dielectric layer 708 may expose the corresponding conductive layer 732 at the same level directly.

As illustrated in FIG. 7O, an interconnect line 743 is formed by depositing a conductive layer through opening 736 to fill lateral recess 740. The conductive layer, such as a metal layer, can be deposited using one or more thin film deposition processes, such as ALD, CVD, PVD, any other suitable processes, or any combination thereof. The deposition rate and/or duration may be controlled to ensure that interconnect line 743 can be in contact with the exposed corresponding conductive layer 732 at the same level as lateral recess 740. In other words, second dielectric layer 708 exposed from the bottom of the corresponding opening 736 can be partially replaced with a corresponding interconnect line 743 in dielectric portion 727 of word line pick-up region 703, while other second dielectric layers 708 at other levels in dielectric portion 727 remain intact.

In some implementations, to form the word line pick-up structures, vertical contacts are formed in the word line pick-up openings in contact with the interconnect lines, respectively. As illustrated in FIG. 7O, a vertical contact 742 is formed on the sidewalls of opening 736 and is in contact with interconnect line 743. vertical contact 742 can be formed in the same process of forming interconnect line 743 by depositing the conductive layer not only into lateral recess 740, but also on the sidewalls and the bottom surface of opening 736, using one or more thin film deposition processes, such as ALD, CVD, PVD, any other suitable processes, or any combination thereof.

In some implementations, to form the word line pick-up structures, a filler is formed in the word line pick-up opening after forming the respective vertical contact. As illustrated in FIG. 7P, a filler 744 is formed in opening 736 (shown in FIG. 7O) to fully or partially fill opening 736. Filler 744, such as a dielectric layer, can be deposited using one or more thin film deposition processes, such as ALD, CVD, PVD, any other suitable processes, or any combination thereof. The excess portions of the conductive layer and dielectric layer for forming vertical contact 742 and filler 744 can be removed by using chemical mechanical polishing (CMP).

As described above, the fabrication processes for forming 3D memory devices having word line pick-up structures involve two major processes-gate replacement and word line pick-up structure formation. In method 900, the gate replacement process is performed before the word line pick-up structure formation process. It is understood that in other examples, the gate replacement process may be performed after the word line pick-up structure formation process. For example, FIGS. 11A-11L illustrate another fabrication process for forming a 3D memory device having word line pick-up structures, according to some aspects of the present disclosure. FIG. 12 illustrates a flowchart of another method 1200 for forming an exemplary 3D memory device having word line pick-up structures, according to some implementations of the present disclosure. Examples of the 3D memory device depicted in 11A-11L and 12 include 3D memory devices 100 depicted in FIGS. 1-5, 6A, and 6B. FIGS. 11A-11L and 12 will be described together. It is understood that the operations shown in method 1200 are not exhaustive and that other operations can be performed as well before, after, or between any of the illustrated operations. Further, some of the operations may be performed simultaneously, or in a different order than shown in FIG. 12.

Referring to FIG. 12, method 1200 starts at operation 1202, in which a stack structure including interleaved first dielectric layers and second dielectric layers is formed. The first dielectric layers can include silicon oxide, and the second dielectric layers can include silicon nitride. In some implementations, to form the stack structure, the first dielectric layers and the second dielectric layers are alternatingly deposited above a substrate. The substrate can be a silicon substrate.

Figure 11A:
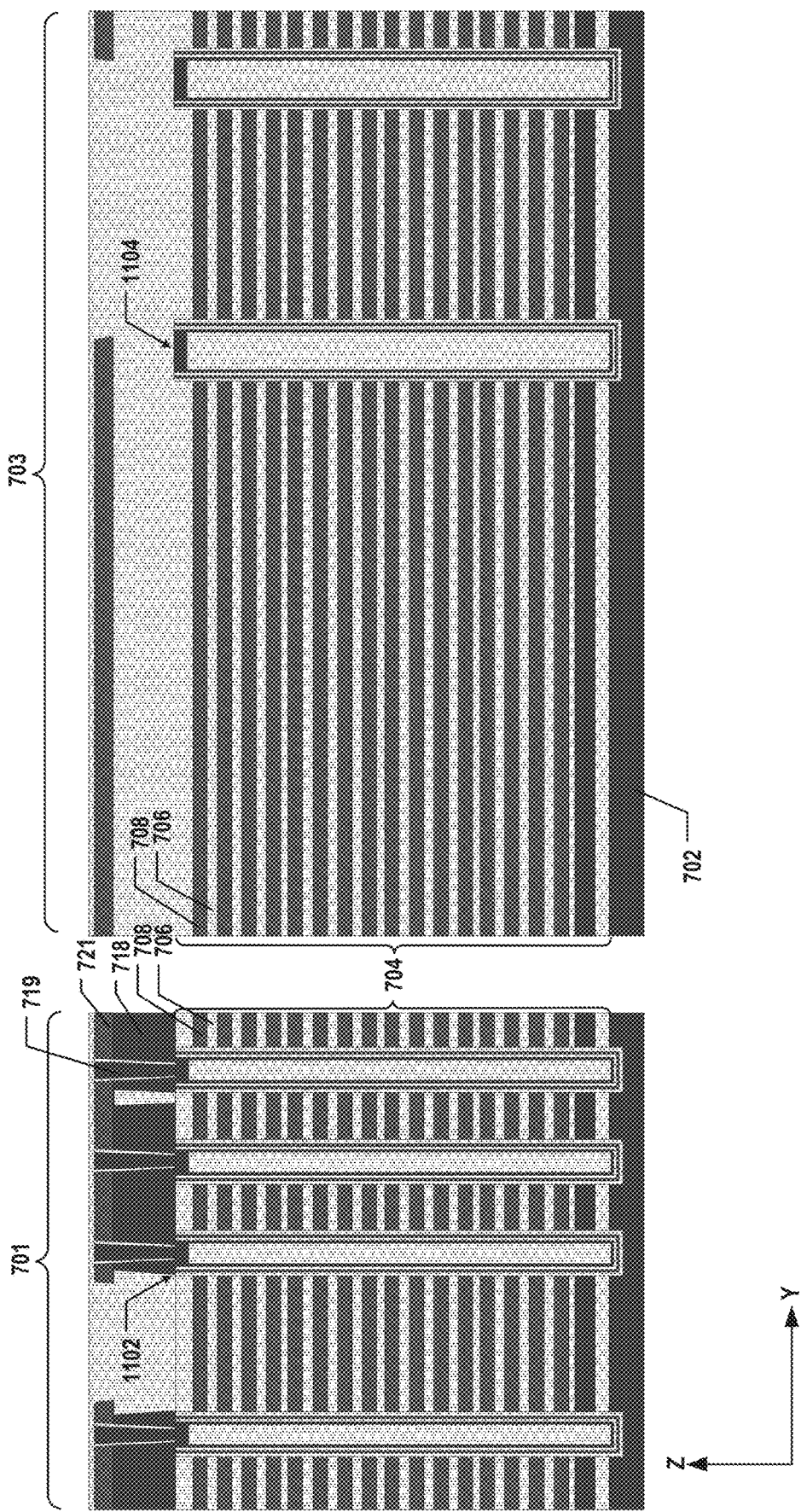
FIGS. 11A-11L illustrate a fabrication process for forming still another 3D memory device having word line pick-up structures, according to some aspects of the present disclosure.
Figure 12:
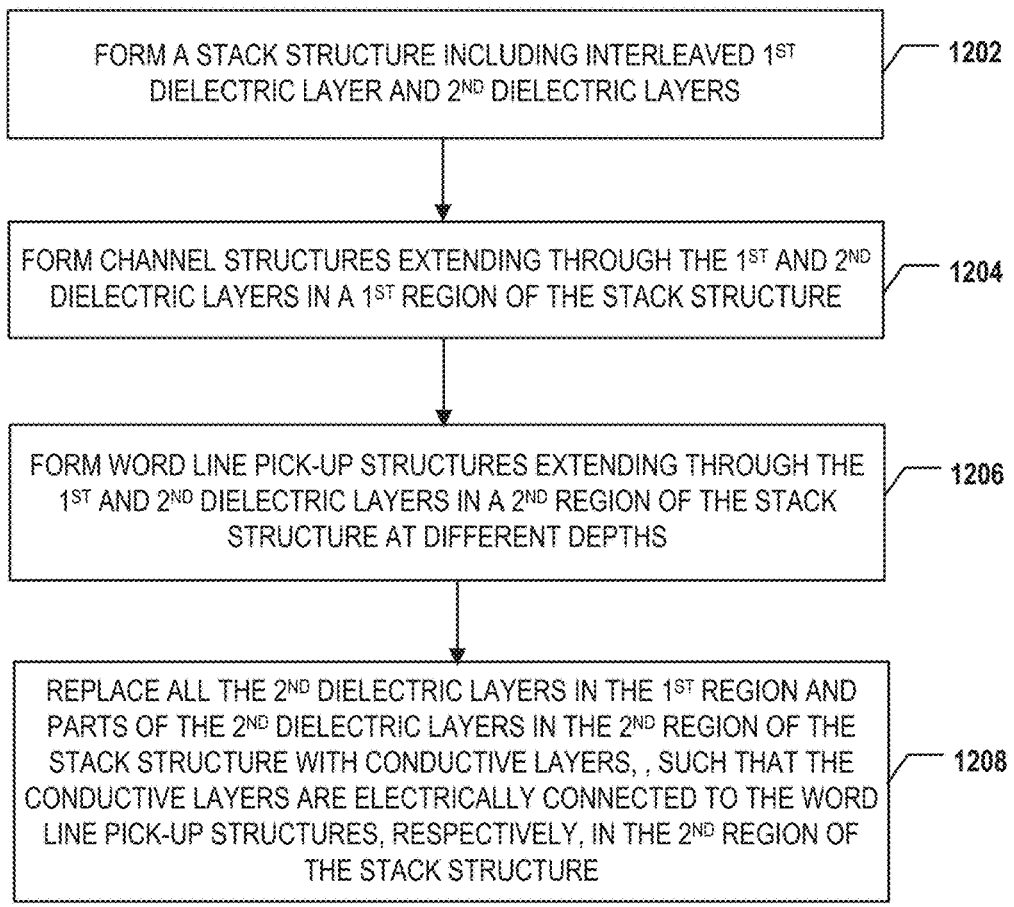
FIG. 12 is a flowchart of a method for forming another 3D memory device having word line pick-up structures, according to some aspects of the present disclosure.

As illustrated in FIG. 11A, a stack structure 704 including multiple pairs of first dielectric layer 706 and second dielectric layer 708 (a.k.a., a stack sacrificial layer) is formed above silicon substrate 702. Stack structure 704 includes vertically interleaved first dielectric layers 706 and second dielectric layers 708, according to some implementations. First and second dielectric layers 706 and 708 can be alternatingly deposited above silicon substrate 702 to form stack structure 704. In some implementations, each first dielectric layer 706 includes a layer of silicon oxide, and each second dielectric layer 708 includes a layer of silicon nitride. Stack structure 704 can be formed by one or more thin film deposition processes including, but not limited to, CVD, PVD, ALD, or any combination thereof.

Method 1200 proceeds to operation 1204, as illustrated in FIG. 12, in which channel structures extending through the first dielectric layers and the second dielectric layers are formed in a first region of the stack structure. In some implementations, to form the channel structure, a channel hole extending vertically through the stack structure is formed, and a high-k gate dielectric layer, a memory layer, and a channel layer are sequentially formed over sidewalls of the channel hole. In some implementations, dummy channel structures extending through the first dielectric layers and the second dielectric layers are formed in the second region of the stack structure in the same process of forming the channel structures. That is, channel structures and dummy channel structures can be simultaneously formed through the first dielectric layers and the second dielectric layers in the first region and the second region of the stack structure, respectively.

As illustrated in FIG. 11A, channel structures 1102 can be formed in core array region 701 of stack structure 704, for example, corresponding to core array region 101 of stack structure 201 in FIGS. 1-3. To form each channel structure 1102, a channel hole, which is an opening extending vertically through stack structure 704, can be formed first in core array region 701. In some implementations, a plurality of openings are formed, such that each opening becomes the location for growing an individual channel structure 1102 in the later process. In some implementations, fabrication processes for forming the channel hole of channel structure 1102 include wet etching and/or dry etching, such as DRIE.

As illustrated in FIG. 11A, a high-k gate dielectric layer, a memory layer (including a blocking layer, a storage layer, and a tunneling layer), and a channel layer can be sequentially formed in this order along sidewalls and the bottom surface of the channel hole, for example, corresponding to the example shown in FIG. 6B. In some implementations, the high-k gate dielectric layer is first deposited along the sidewalls and bottom surfaces of the channel hole, the memory layer is then deposited over the high-k gate dielectric layer, and the semiconductor channel is then deposited over the memory layer. The high-k gate dielectric layer can be formed by depositing high-k dielectric materials, such as aluminum oxide, using one or more thin film deposition processes, such as ALD, CVD, PVD, any other suitable processes, or any combination thereof. The blocking layer, storage layer, and tunneling layer can be subsequently deposited in this order using one or more thin film deposition processes, such as ALD, CVD, PVD, any other suitable processes, or any combination thereof, over the high-k gate dielectric layer to form the memory layer. The channel layer can then be formed by depositing a semiconductor material, such as polysilicon, over the tunneling layer of the memory layer using one or more thin film deposition processes, such as ALD, CVD, PVD, any other suitable processes, or any combination thereof. In some implementations, an aluminum oxide layer, a first silicon oxide layer, a silicon nitride layer, a second silicon oxide layer, and a polysilicon layer (a "SONO" structure) are subsequently deposited to form the high-k gate dielectric layer, the memory layer, and the channel layer of channel structure 1102.

In some implementations, as illustrated in FIG. 11A, dummy channel structures 1104 can be formed in word line pick-up region 703 of stack structure 704, for example, corresponding to word line pick-up region 103 of stack structure 201 in FIGS. 1-3, in the same process of forming channel structures 1102. To form each dummy channel structure 1104, a dummy channel hole, which is another opening extending vertically through stack structure 704, can be formed in word line pick-up region 703 simultaneously as the channel hole for channel structure 1102 by the same wet etching and/or dry etching, such as DRIE. As illustrated in FIG. 11A, dummy channel structure 1104 can then be formed simultaneously as channel structure 1102 by the same thin film deposition processes, such as ALD, CVD, PVD, any other suitable processes, or any combination thereof that deposit a high-k gate dielectric layer, a memory layer (including a blocking layer, a storage layer, and a tunneling layer), and a channel layer. It is understood that in some examples, dummy channel structures 1104 may be formed in a separate process from channel structures 1102.

As illustrated in FIG. 11A, DSG layer 718 and stop layer 721 are formed on core array region 701 of stack structure 704. DSG layer 718 can include a semiconductor layer, such as a polysilicon layer, and stop layer 721 can include a silicon nitride layer. DSG layer 718 and stop layer 721 can be sequentially deposited on core array region 701, but not on word line pick-up region 703, of stack structure 704 using one or more thin film deposition processes including, but not limited to, CVD, PVD, ALD, or any combination thereof. DSG channel structures 719 can be formed extending vertically through DSG layer 718 and stop layer 721 to be in contact with the upper ends of channel structures 1102, but not dummy channel structures 1104, as shown in FIG. 11A. To form DSG channel structures 719, DSG holes can be etched through DSG layer 718 and stop layer 721 to expose the upper ends of channel structures 1102, respectively, and a spacer (e.g., having silicon oxide) and a semiconductor layer (e.g., having polysilicon) can be sequentially deposited into the DSG holes using one or more thin film deposition processes, such as CVD, PVD, ALD, or any combination thereof, to fill the DSG holes.

Method 1200 proceeds to operation 1206, as illustrated in FIG. 12, in which word line pick-up structures extending through the first dielectric layers and the second dielectric layers in a second region of the stack structure are formed at different depths.

Figure 11B:
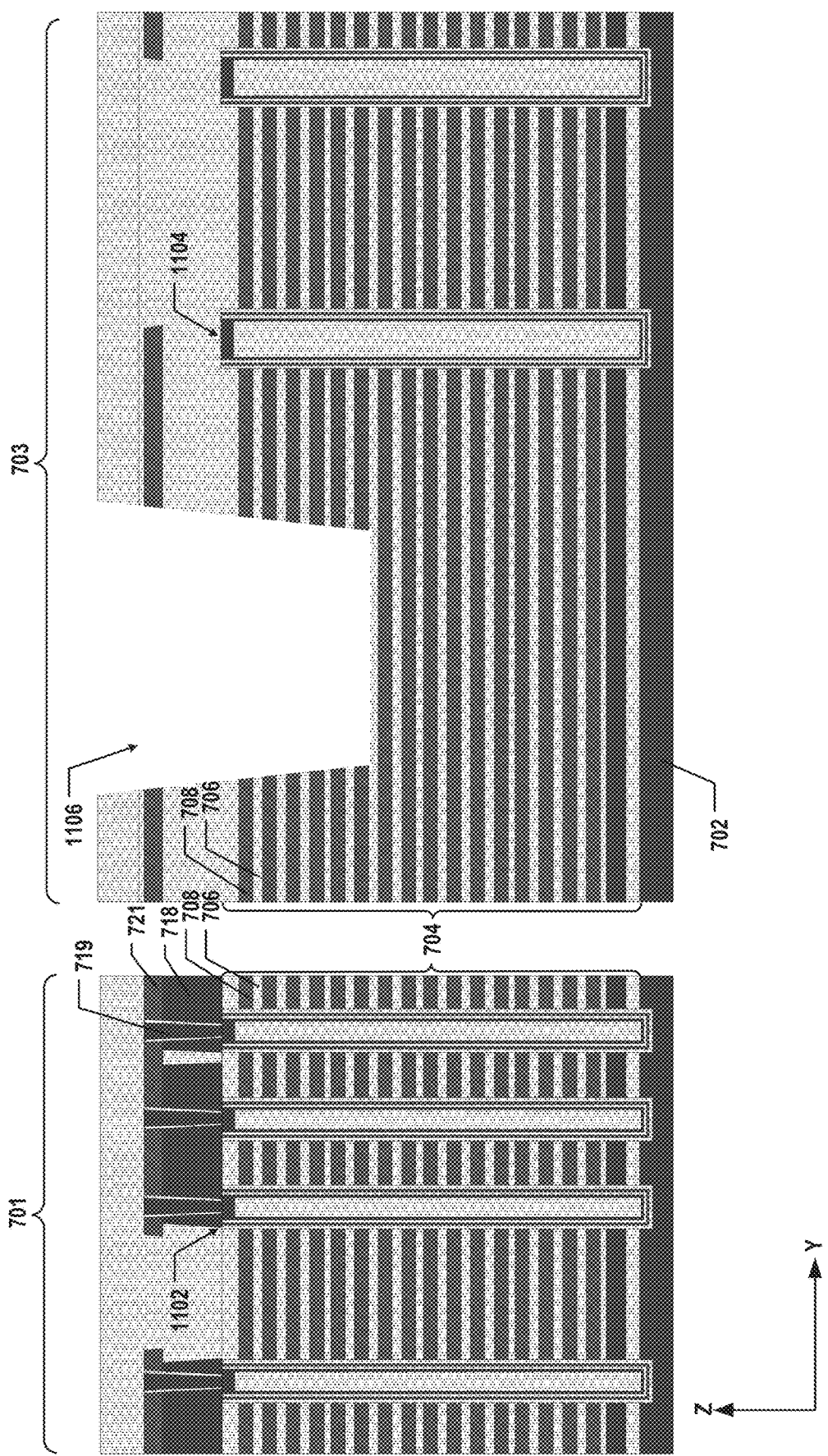

In some implementations, to form the word line pick-up structures, word line pick-up openings extending through the first dielectric layers and the second dielectric layers in the second region of the stack structure are formed at different depths to expose the second dielectric layers in the second regions of the stack structure, respectively. As illustrated in FIG. 11B, an opening 1106 extends vertically through a number of pairs of first and second dielectric layers 706 and 708 of stack structure 704 in word line pick-up region 703. In some implementations, a plurality of openings 1106 are formed extending through different numbers of pairs of first and second dielectric layers 706 and 708 in word line pick-up region 703, stopping at different depths, for example, corresponding to the examples shown in FIG. 4. Openings 1106 can be formed using the same chopping process as described above in detail with respect to openings 736.

Figure 11C:
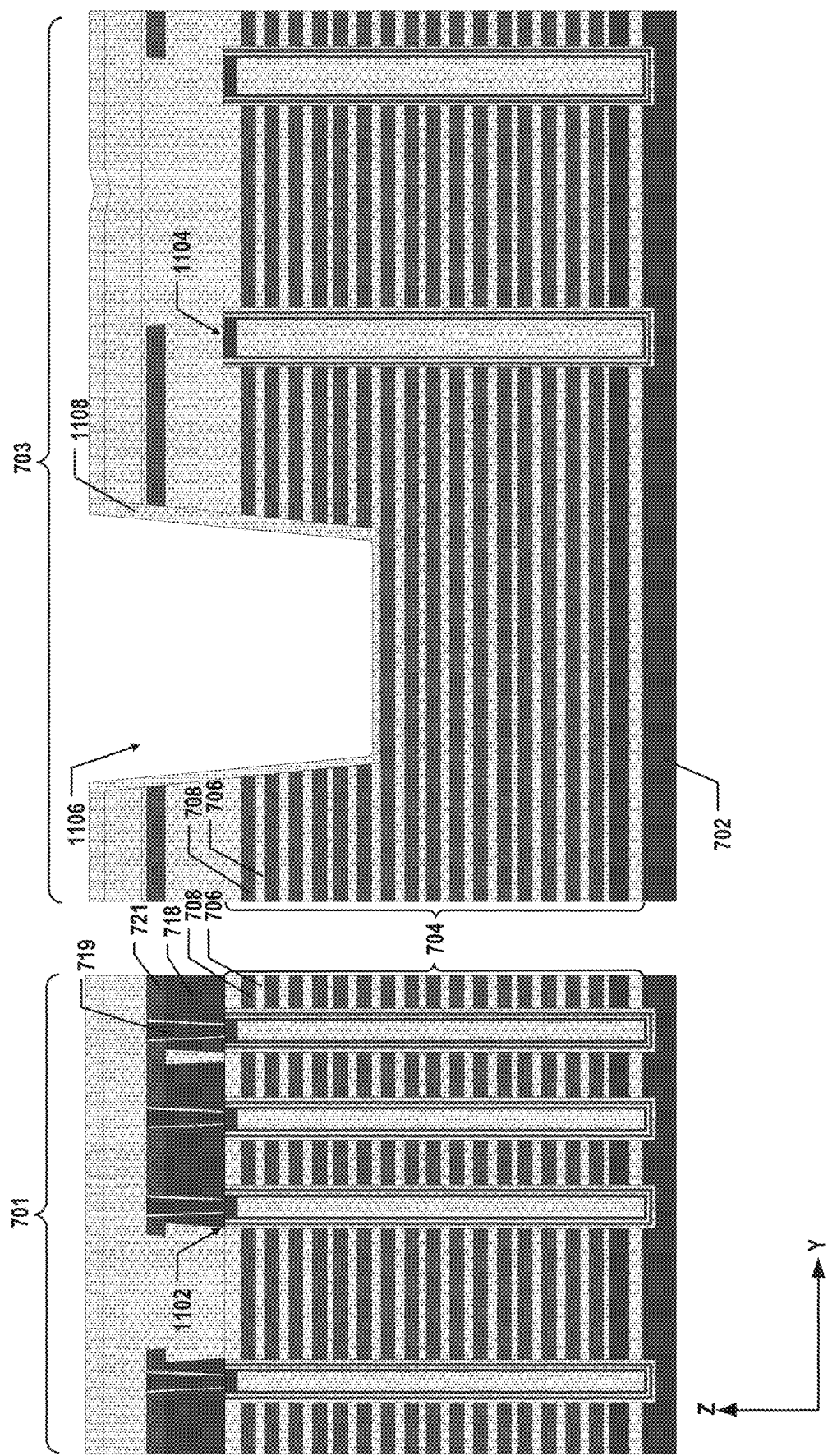

In some implementations, to form the word line pick-up structures, a second spacer is formed on sidewalls and a bottom of each of the word line pick-up openings. As illustrated in FIG. 11C, a contact spacer 1108 is formed on the sidewalls and the bottom surface of opening 1106, thereby covering first dielectric layers 706 and second dielectric layers 708 exposed from the sidewalls of opening 1106. In some implementations, contact spacer 1108 is formed by depositing dielectric materials, such as silicon oxide, using one or more thin film deposition processes, such as ALD, CVD, PVD, any other suitable processes, or any combination thereof, over the sidewalls and the bottom surface of opening 1106.

Figure 11D:
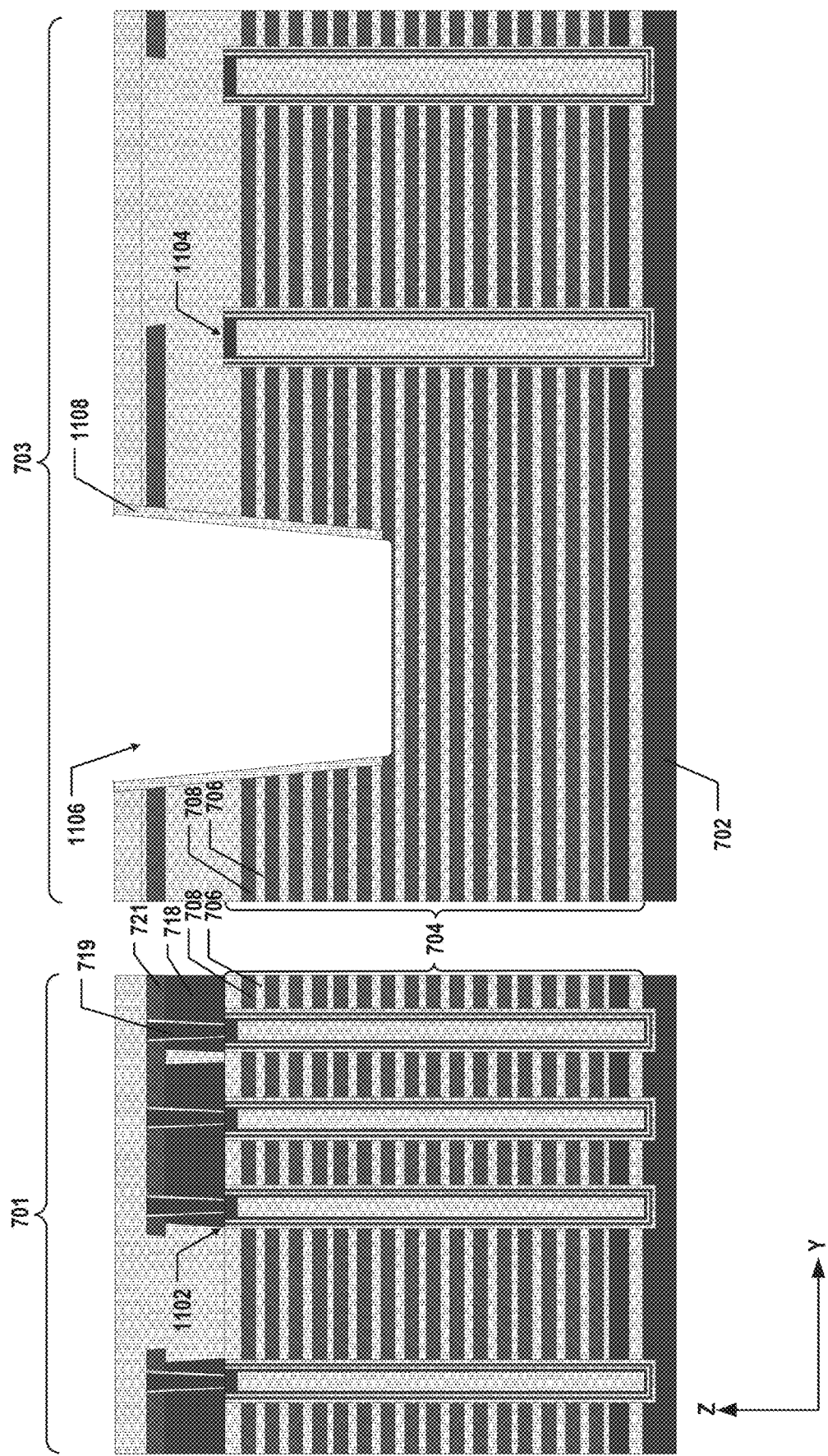

In some implementations, to form the word line pick-up structures, the second spacer on the bottom of the word line pick-up opening is removed to expose the respective part of the second dielectric layer. As illustrated in FIG. 11D, the part of contact spacer 1108 on the bottom surface of opening 1106 is removed, for example, by dry etching, to expose part of second dielectric layer 708 in word line pick-up region 703. In some implementations, the etching rate, direction, and/or duration of RIE are controlled to etch only the part of contact spacer 1108 on the bottom surface, but not on the sidewalls, of opening 1106, i.e., "punching" through contact spacer 1108 in the z-direction to expose only a corresponding second dielectric layer 708 from the bottom, but not other second dielectric layers 708 from the sidewalls.

In some implementations, to form the word line pick-up structures, parts of the second dielectric layers in the second region of the stack structure are replaced with interconnect lines, respectively, through the word line pick-up openings. In some implementations, to replace the parts of the second dielectric layers with the interconnect lines, the exposed part of the remainder of the second dielectric layer is etched through the word line pick-up opening, and the respective interconnect line is deposited through the word line pick-up opening.

Figure 11E:
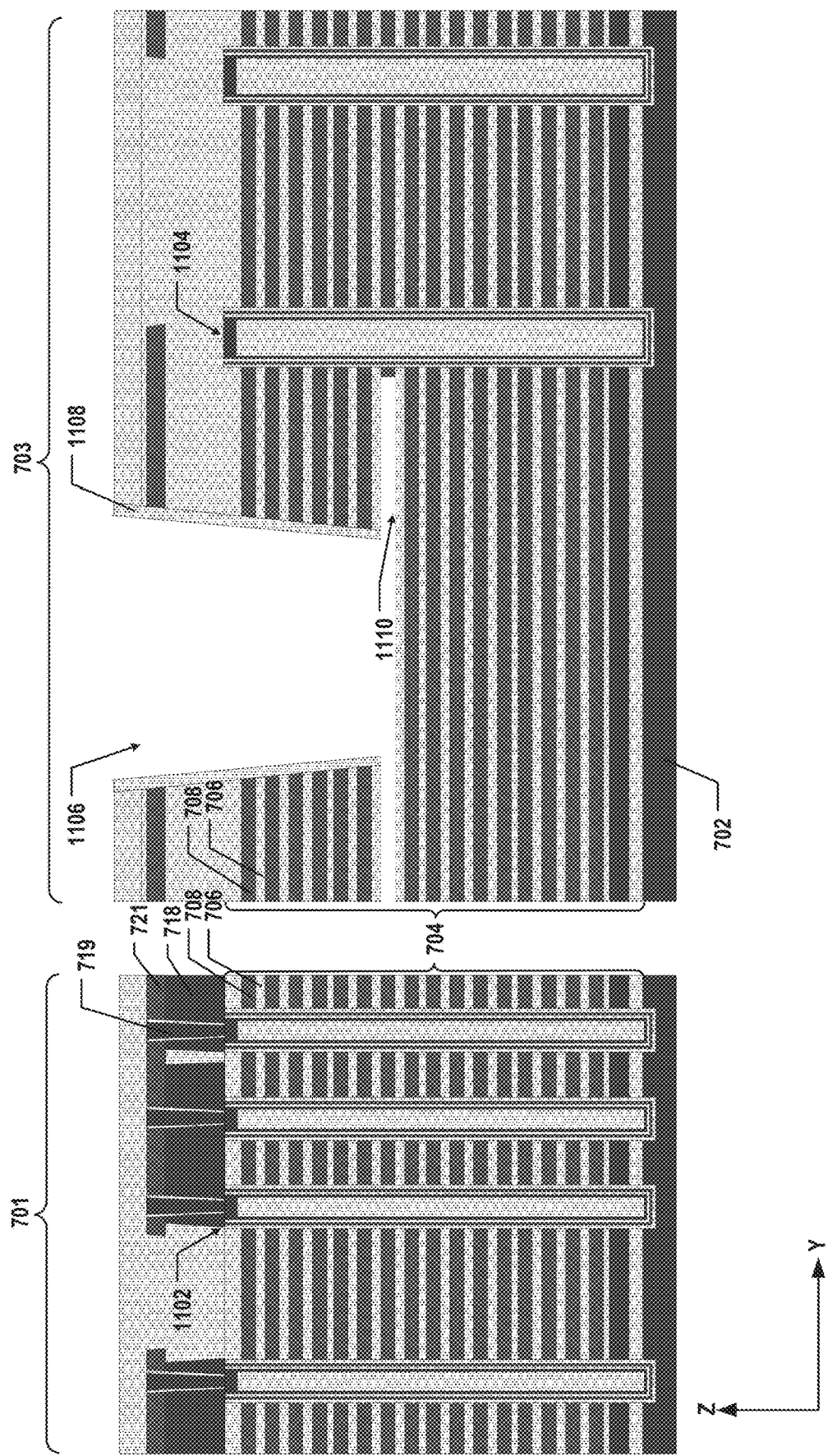

As illustrated in FIG. 11E, part of second dielectric layer 708 exposed from the bottom of opening 1106 is removed by wet etching to form a lateral recess 1110, leaving the remainder of second dielectric layer 708 at the same level, as well as other second dielectric layers 708 at other levels, in word line pick-up region 703 intact. In some implementations, the part of second dielectric layer 708 is wet etched by applying a wet etchant through opening 1106, creating lateral recess 1110 sandwiched between two first dielectric layers 706. The wet etchant can include phosphoric acid for etching second dielectric layer 708 including silicon nitride. In some implementations, the etching rate and/or etching time are controlled to remove only part of second dielectric layer 708. By controlling the etching time, the wet etchant does not travel all the way to completely remove second dielectric layer 708 in word line pick-up region 703. As illustrated in FIG. 11E, since the sidewalls of opening 1106 are still covered by contact spacer 1108 (e.g., silicon oxide) that is resistant to the etchant for removing second dielectric layers 708 (e.g., silicon nitride), second dielectric layers 708 at other levels remain intact.

Figure 11F:
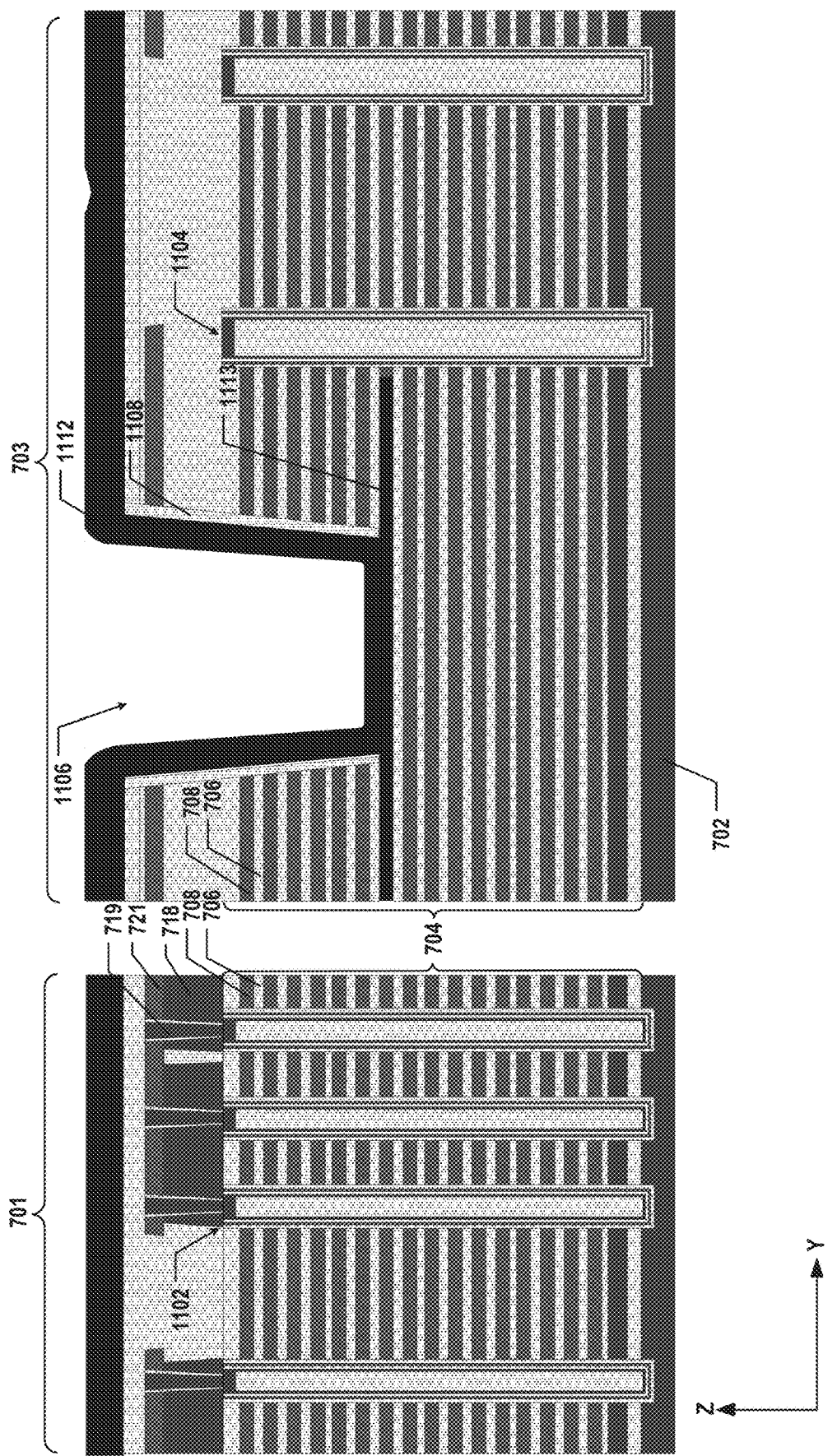

As illustrated in FIG. 11F, an interconnect line 1113 is formed by depositing a conductive layer through opening 736 to fill lateral recess 740. The conductive layer, such as a metal layer, can be deposited using one or more thin film deposition processes, such as ALD, CVD, PVD, any other suitable processes, or any combination thereof. In other words, second dielectric layer 708 exposed from the bottom of the corresponding opening 1106 can be partially replaced with a corresponding interconnect line 1113 in word line pick-up region 703, while other second dielectric layers 708 at other levels remain intact.

In some implementations, to form the word line pick-up structures, vertical contacts are formed in the word line pick-up openings in contact with the interconnect lines, respectively. As illustrated in FIG. 11F, a vertical contact 1112 is formed on the sidewalls of opening 1106 and is in contact with interconnect line 1113. Vertical contact 1112 can be formed in the same process of forming interconnect line 1113 by depositing the conductive layer not only into lateral recess 1110, but also on the sidewalls and the bottom surface of opening 1106, using one or more thin film deposition processes, such as ALD, CVD, PVD, any other suitable processes, or any combination thereof.

Figure 11G:
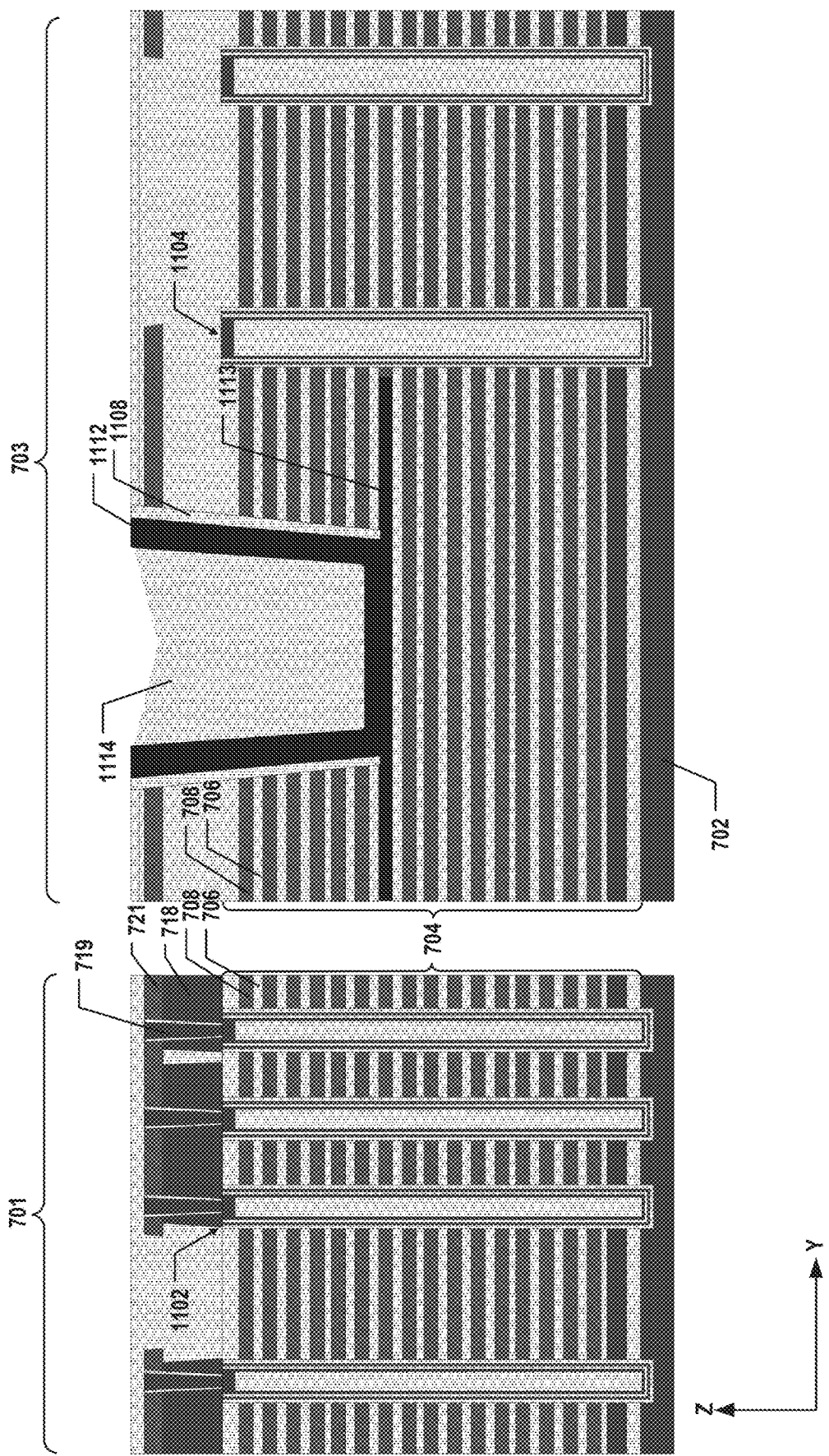

In some implementations, to form the word line pick-up structures, a filler is formed in the word line pick-up opening after forming the respective vertical contact. As illustrated in FIG. 11G, a filler 1114 is formed in opening 1106 (shown in FIG. 11F) to fully or partially fill opening 1106. Filler 1114, such as a dielectric layer, can be deposited using one or more thin film deposition processes, such as ALD, CVD, PVD, any other suitable processes, or any combination thereof. The excess portions of the conductive layer and dielectric layer for forming vertical contact 1112 and filler 1114 can be removed by using CMP.

Method 1200 proceeds to operation 1208, as illustrated in FIG. 12, in which all the second dielectric layers in the first region and parts of the second dielectric layers in the second region of the stack structure are replaced with conductive layers, for example, by a gate replacement process, such that the conductive layers are electrically connected to the word line pick-up structures, respectively, in the second region of the stack structure. The conductive layer can include a metal.

Figure 11H:
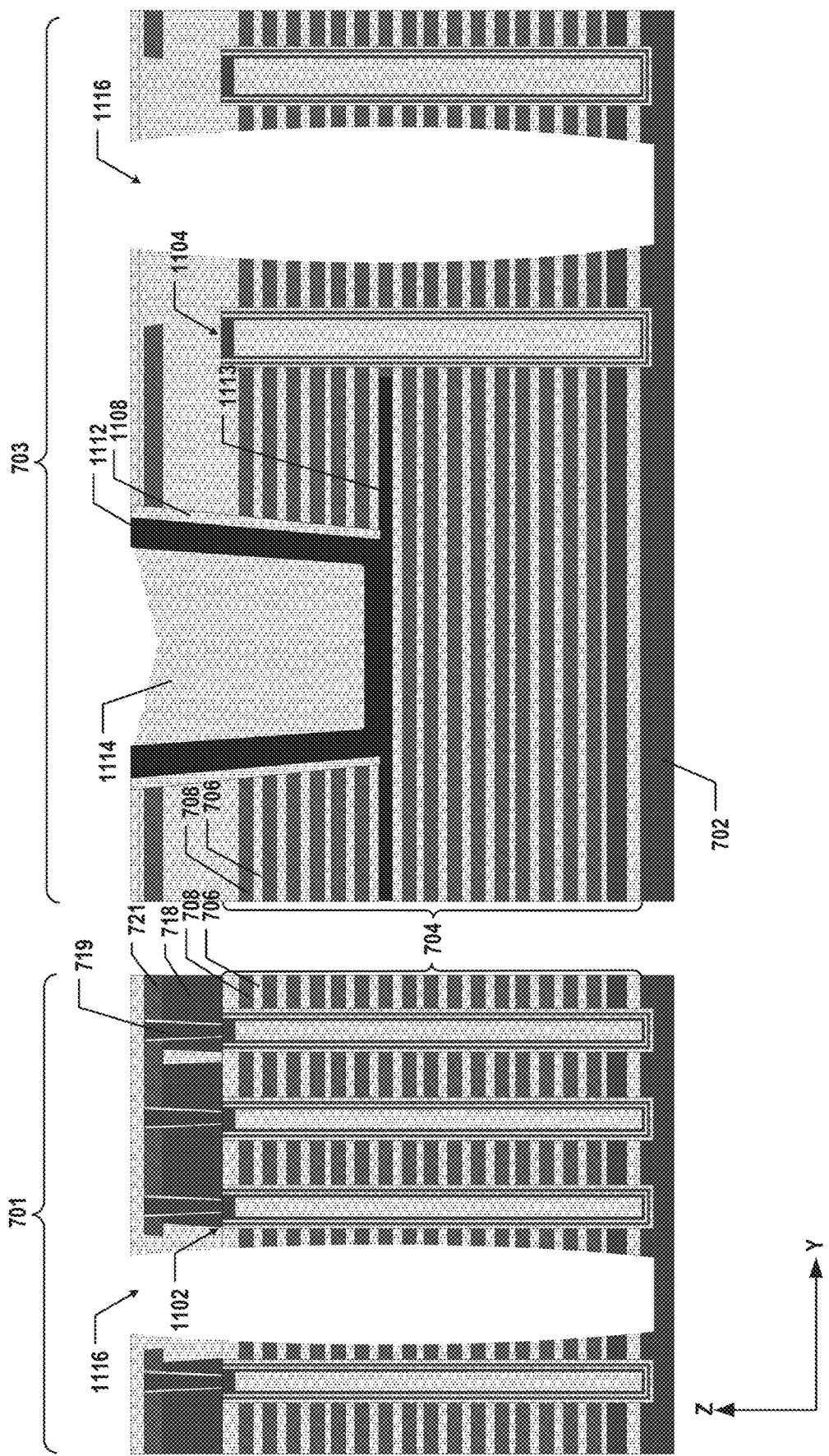

In some implantations, to perform the gate replacement process, a slit extending through the first dielectric layers and the second dielectric layers and across the first region and the second region of the stack structure is formed after forming the word line pick-up structures. In some implementations, the slit extends vertically through the local contact layer as well. As illustrated in FIG. 11H, a slit 1116 is an opening that extends vertically through stop layer 721, DSG layer 718, and first dielectric layers 706 and second dielectric layers 708 of stack structure 704 until silicon substrate 702. Slit 1116 can also extend laterally across core array region 701 and word line pick-up region 703 in the x-direction (the word line direction), for example, corresponding to slit structure 108 in FIG. 1. In some implementations, fabrication processes for forming slit 1116 include wet etching and/or dry etching, such as DRIE, of first dielectric layers 706 and second dielectric layers 708. The etching process through stack structure 704 may not stop at the top surface of silicon substrate 702 and may continue to etch part of silicon substrate 702 to ensure that slit 1116 extends vertically all the way through all first dielectric layers 706 and second dielectric layers 708 of stack structure 704.

Figure 11I:
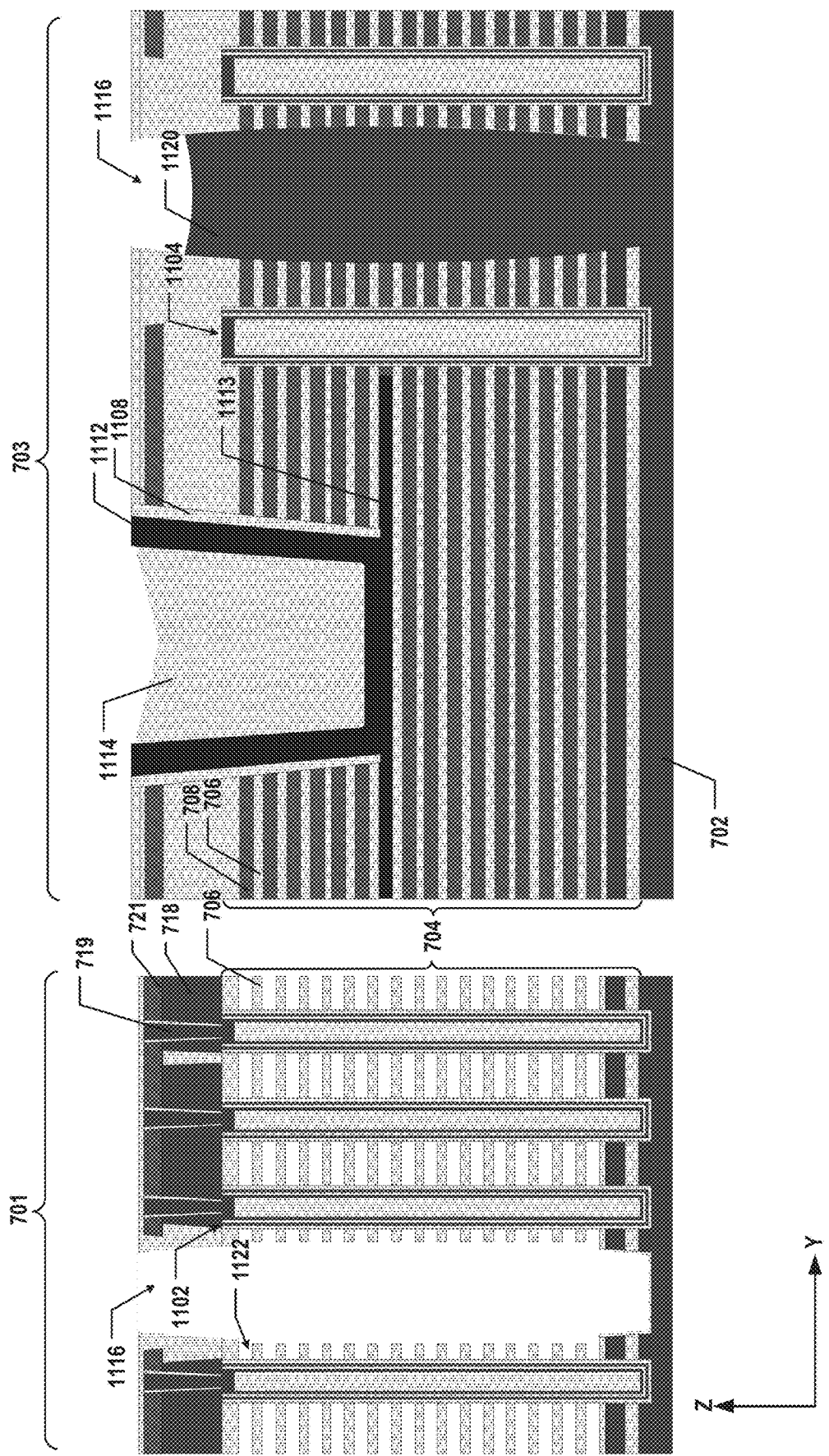

In some implantations, to perform the gate replacement process, the slit in the second region of the stack structure is covered. As illustrated in FIG. 11I, the part of slit 1116 in word line pick-up region 703 is covered by a sacrificial layer 1120. In some implementations, sacrificial layer 1120 that is different from first dielectric layers 706 and second dielectric layers 708, such as a polysilicon layer or a carbon layer, is deposited into slit 1116 using one or more thin film deposition processes, such as CVD, PVD, ALD, or any combination thereof, to at least partially fill slit 1116 (covering the exposed first dielectric layers 706 and second dielectric layers 708 in slit 1116). Sacrificial layer 1120 can then be patterned using lithography and wet etching and/or dry etching to remove the part of sacrificial layer 1120 in core array region 701, leaving only the part of sacrificial layer 1120 in word line pick-up region 703 to cover only the part of slit 1116 in word line pick-up region 703.

In some implantations, to perform the gate replacement process, all the second dielectric layers in the first region of the stack structure are removed through the slit in the first region of the stack structure. As illustrated in FIG. 11I, all second dielectric layers 708 (as shown in FIG. 11H) in core array region 701 are fully removed by wet etching to form lateral recesses 1122. In some implementations, second dielectric layers 708 are wet etched by applying a wet etchant through the part of slit 1116 in core array region 701 that is uncovered by sacrificial layer 1120, creating lateral recesses 1122 interleaved between first dielectric layers 706. The wet etchant can include phosphoric acid for etching second dielectric layers 708 including silicon nitride. In some implementations, the etching rate and/or etching time are controlled to ensure that all second dielectric layers 708 in core array region 701 are completely etched away. As illustrated in FIG. 11I, since the part of slit 1116 in word line pick-up region 703 is covered by sacrificial layer 1120 that is resistant to the etchant for removing second dielectric layers 708, second dielectric layers 708 in word line pick-up region 703 remain intact.

Figure 11J:
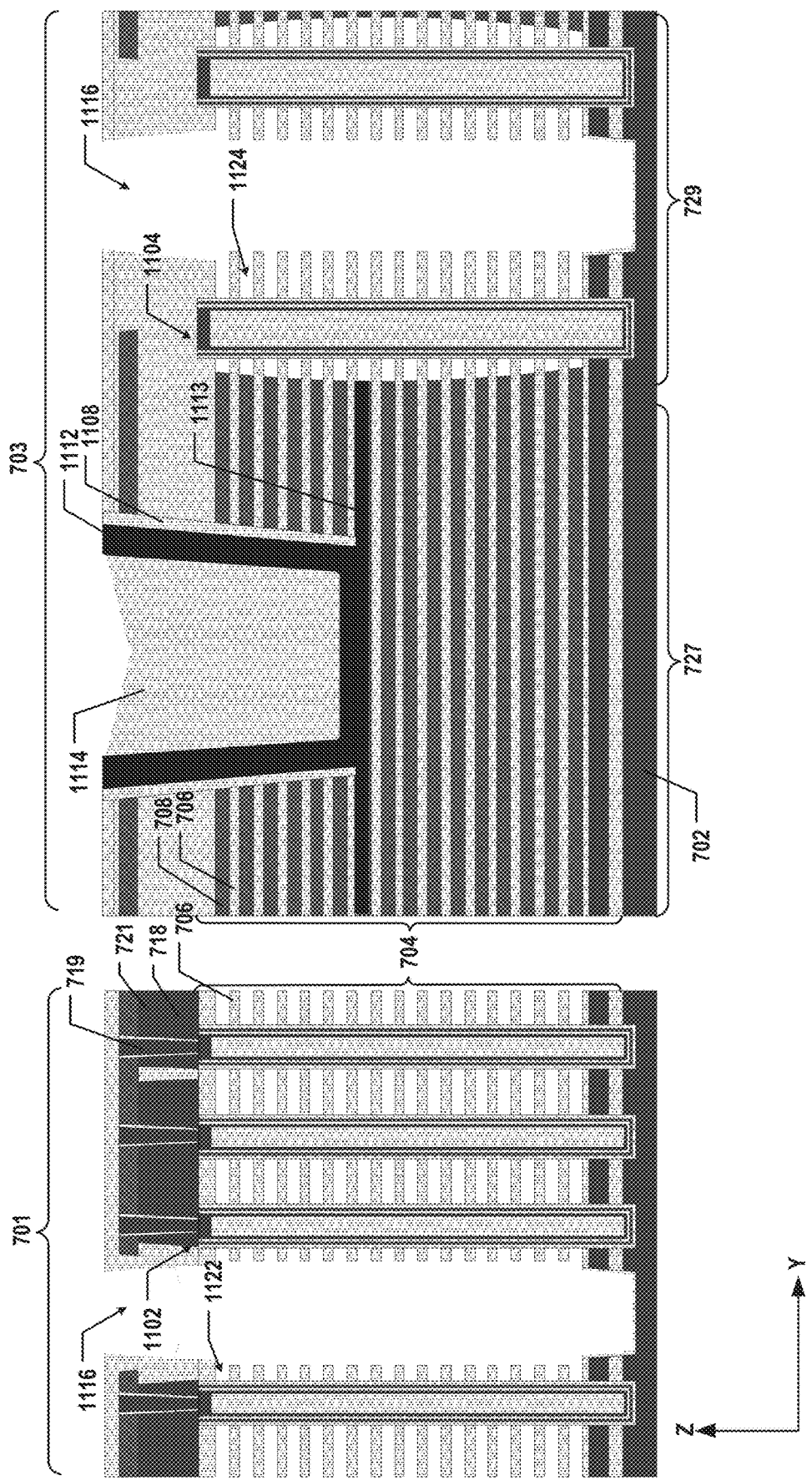

In some implantations, to perform the gate replacement process, the slit in the second region of the stack structure is opened. As illustrated in FIG. 11J, the part of slit 1116 in word line pick-up region 703 is re-opened by removing sacrificial layer 1120 (shown in FIG. 11I) to expose first dielectric layers 706 and second dielectric layers 708 in word line pick-up region 703. In some implementations, sacrificial layer 1120 is selectively etched away from the part of slit 1116 in word line pick-up region 703, for example, using KOH for etching sacrificial layer 1120 having polysilicon, to open the part of slit 1116 in word line pick-up region 703.

In some implantations, to perform the gate replacement process, the parts of the second dielectric layers in the second region of the stack structure are removed through the slit in the second region of the stack structure to expose the interconnect lines of the word line pick-up structures. As illustrated in FIG. 11J, parts of second dielectric layers 708 in conductive portion 729 of word line pick-up region 703 are removed by wet etching to form lateral recesses 1124, leaving the remainders of second dielectric layers 708 in dielectric portion 727 of word line pick-up region 703 intact. In some implementations, the parts of second dielectric layers 708 are wet etched by applying a wet etchant through the part of 1116 in word line pick-up region 703, creating lateral recesses 1124 interleaved between first dielectric layers 706. The wet etchant can include phosphoric acid for etching second dielectric layers 708 including silicon nitride. In some implementations, the etching rate and/or etching time are controlled to remove only the parts of second dielectric layers 708 in conductive portion 729, leaving the remainders of second dielectric layers 708 intact in dielectric portion 727. By controlling the etching time, the wet etchant does not travel all the way to completely remove second dielectric layers 708 in word line pick-up region 703, thereby defining two portions in word line pick-up region 703-conductive portion 729 in which second dielectric layers 708 are removed, and dielectric portion 727 in which second dielectric layers 708 remain. On the other hand, the etching rate and/or etching time are controlled to also ensure that interconnect line 1113 is exposed by a corresponding lateral recess 1124 at the same level. That is, the remainder of second dielectric layer 708 at the same level as interconnect line 1113 may be removed enough to expose interconnect line 1113 from corresponding lateral recess 1124 and slit 1116. As illustrated in FIG. 11J, since all second dielectric layers 708 in core array region 701 have already been removed, the part of slit 1116 in core array region 701 may not need to be covered when removing parts of second dielectric layers 708 in word line pick-up region 703.

Figure 11K:
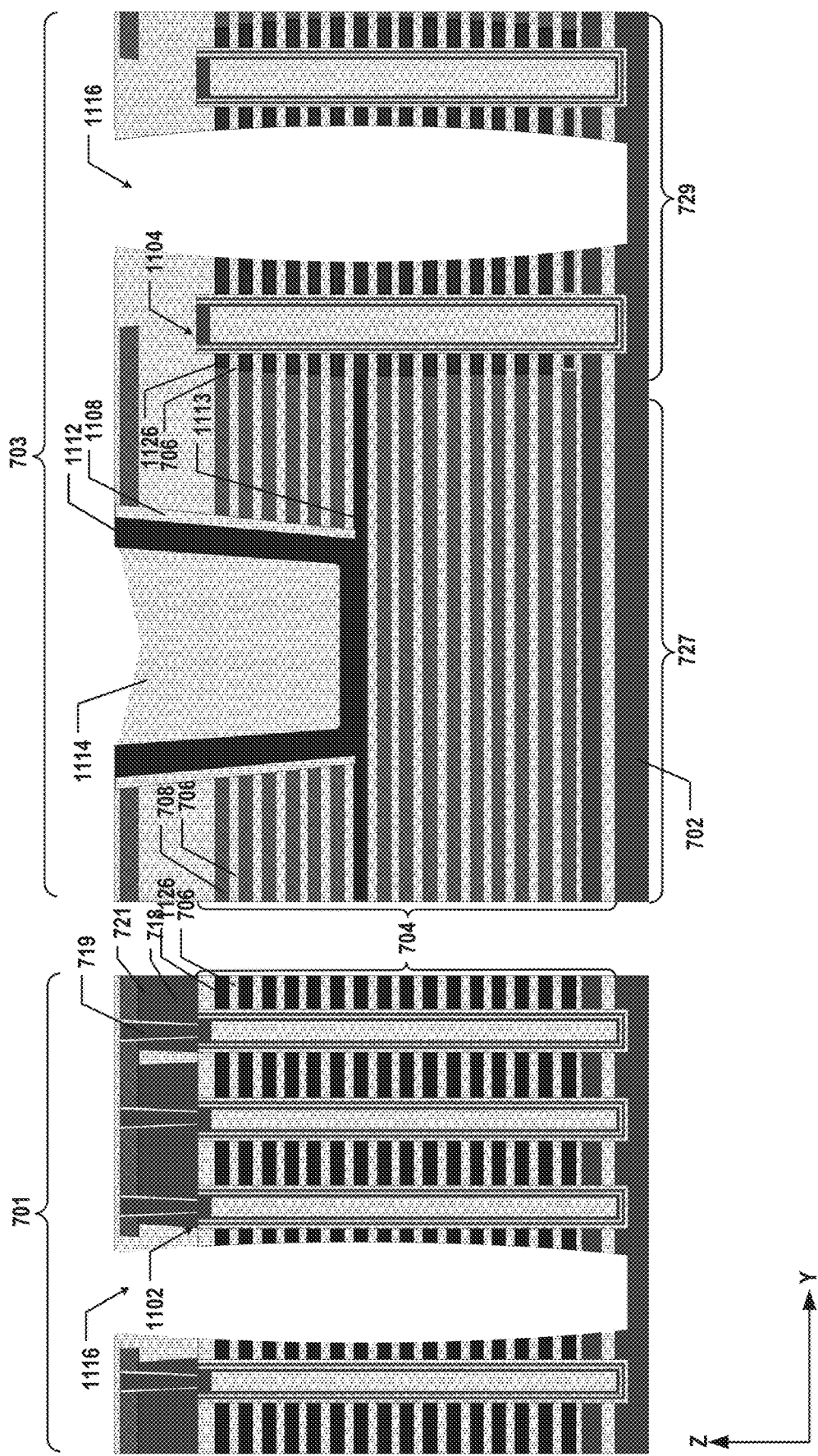

In some implantations, to perform the gate replacement process, the conductive layers are deposited through the slit in the first region and the second region of the stack structure to be in contact with the interconnect lines of the word line pick-up structures, respectively, in the second region of the stack structure. As illustrated in FIG. 11K, conductive layers 1126 are deposited into lateral recesses 1122 and 1124 (shown in FIG. 11J) in core array region 701 and conductive portion 729 of word line pick-up region 703 through slit 1116. It is understood that the high-k gate dielectric layers have already been formed in channel structures 1102, and may not be deposited into lateral recesses 1122 and 1124 prior to conductive layers 1126, such that conductive layers 1126 are deposited on and surrounded by first dielectric layers 706, for example, corresponding to the example shown in FIG. 6B. Conductive layers 1126, such as metal layers, can be deposited using one or more thin film deposition processes, such as ALD, CVD, PVD, any other suitable processes, or any combination thereof. The deposition rate and/or duration can be controlled to ensure that conductive layer 1126 at the same level as interconnect line 1113 is in contact with interconnect line 1113 in word line pick-up region 703.

After the gate replacement processes described above, stack structure 704 can be redefined into two stack structures—a conductive stack structure including interleaved conductive layers 732 and first dielectric layers 706 in core array region 701 as well as in conductive portion 729 of word line pick-up region 703, and a dielectric stack structure including interleaved first dielectric layers 706 and the remainders of second dielectric layers 708 in dielectric portion 727 of word line pick-up region 703. That is, all second dielectric layers 708 in core array region 701 and parts of second dielectric layers 708 in word line pick-up region 703 of stack structure 704 are replaced with conductive layers 732, according to some implementations. Moreover, in some examples, since the dielectric stack structure in dielectric portion 727 of word line pick-up region 703 remains intact during the gate replacement process (without removal of the remainders of second dielectric layers 708 therein), dummy channel structures 716 may not need to be formed in dielectric portion 727 of word line pick-up region 703 to provide mechanical support when removing second dielectric layer 708.

Figure 11L:
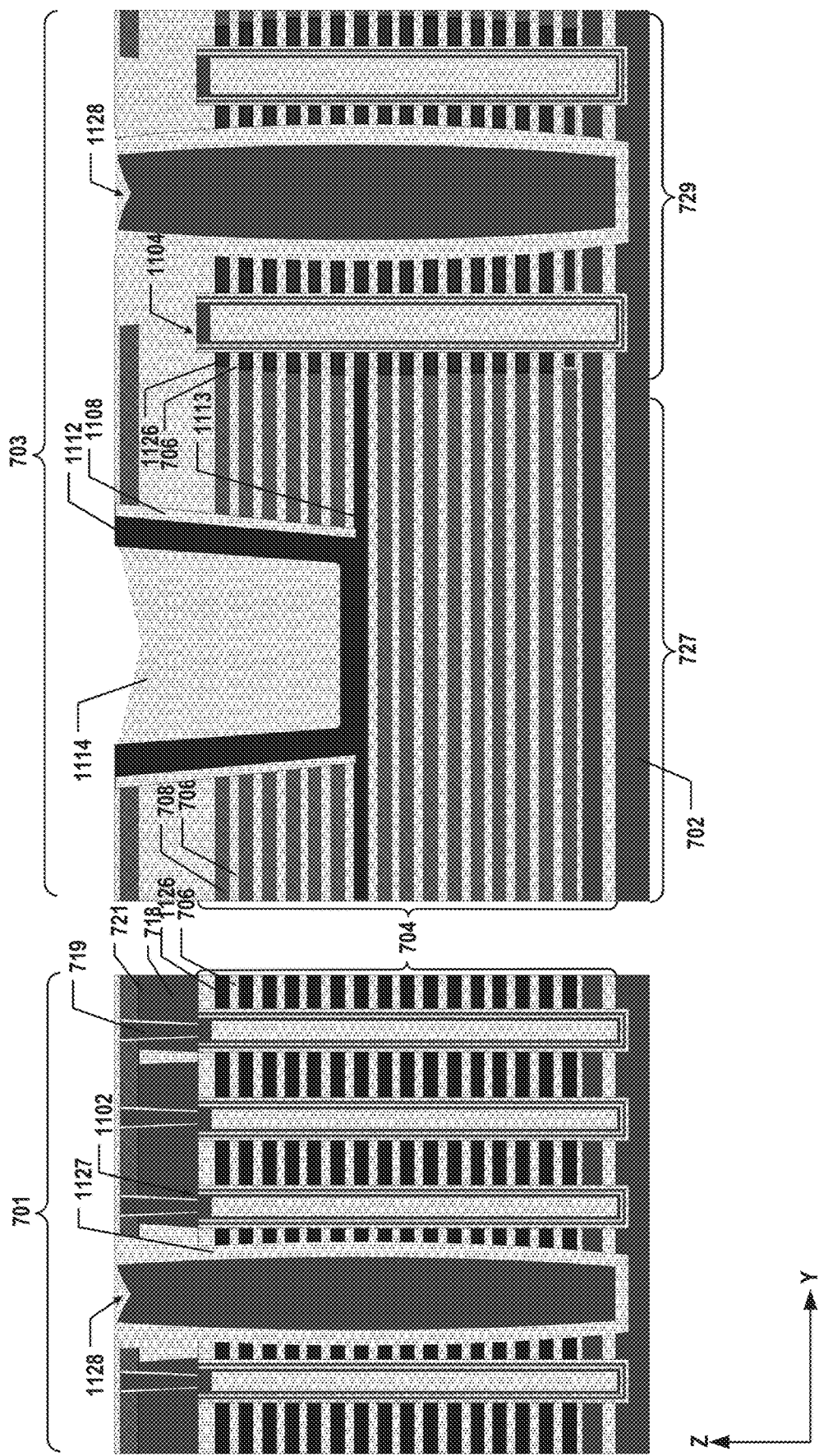

In some implementations, after forming the word line pick-up structures and the gate replacement process, a first spacer is formed in the slit. As illustrated in FIG. 11L, a slit spacer 1127 is formed in slit 1116 (shown in FIG. 11K) to form a slit structure 1128 extending vertically through interleaved conductive layers 732 and first dielectric layers 706 of stack structure 704 and laterally across core array region 701 and conductive portion 729 of word line pick-up region 703. Slit spacer 1127 can be formed by depositing dielectrics into slit 1116 using one or more thin film deposition processes, such as ALD, CVD, PVD, any other suitable processes, or any combination thereof. In some implementations, conductive materials (e.g., as a source contact) are deposited into slit 1116 after slit spacer 1127 as part of slit structure 1128.

As described above with respect to FIGS. 10A and 10B, during the gate replacement process, the removal of second dielectric layers 708 may be performed first in core array region 701, and then in word line pick-up region 703 (e.g., shown in FIGS. 11I and 11J), or vice versa. Thus, the operations described with respect to FIGS. 11I and 11J may be replaced with similar operations described with respect to FIGS. 7E-7G, such that the gate replacement process may be performed after the word line pick-up structure formation process, and during the gate replacement process, the removal of second dielectric layers 708 may be performed first in word line pick-up region 703, and then in core array region 701. In some implementations, to perform the gate replacement process, the slit in the first region of the stack structure is covered, the parts of the second dielectric layers in the second region of the stack structure in the second region of the stack structure are removed through the slit, the slit in the first region of the stack structure is opened, the slit in the second region of the stack structure is covered, all the second dielectric layers in the first region of the stack structure are removed through the slit in the first region of the stack structure, the slit in the second region of the stack structure is opened, and the conductive layers are deposited through the slit in the first region and the second region of the stack structure.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A method for forming a three-dimensional (3D) memory device, comprising:
   forming a stack structure comprising interleaved first dielectric layers and second dielectric layers;
   forming channel structures extending through the first dielectric layers and the second dielectric layers in a first region of the stack structure;
   replacing all the second dielectric layers in the first region and parts of the second dielectric layers in a second region of the stack structure with conductive layers; and
   forming word line pick-up structures extending through the first dielectric layers and remainders of the second dielectric layers in the second region of the stack structure at different depths, such that the word line pick-up structures are electrically connected to the conductive layers, respectively, in the second region of the stack structure.

2. The method of claim 1, further comprising forming dummy channel structures extending through the first dielectric layers and the second dielectric layers in the second region of the stack structure in a same process of forming the channel structures.

3. The method of claim 1, wherein replacing comprises forming a slit extending through the first dielectric layers and the second dielectric layers and across the first region and the second region of the stack structure before forming the word line pick-up structures.

4. The method of claim 3, wherein replacing further comprises:
   covering the slit in the second region of the stack structure;
   removing all the second dielectric layers in the first region of the stack structure through the slit in the first region of the stack structure;
   opening the slit in the second region of the stack structure;
   removing the parts of the second dielectric layers in the second region of the stack structure through the slit in the second region of the stack structure; and
   depositing the conductive layers through the slit in the first region and the second region of the stack structure.

5. The method of claim 3, wherein replacing further comprises:
   covering the slit in the first region of the stack structure;
   removing the parts the second dielectric layers in the second region of the stack structure through the slit in the second region of the stack structure;
   opening the slit in the first region of the stack structure;
   covering the slit in the second region of the stack structure;
   removing all the second dielectric layers in the first region of the stack structure through the slit in the first region of the stack structure;
   opening the slit in the second region of the stack structure; and
   depositing the conductive layers through the slit in the first region and the second region of the stack structure.

6. The method of claim 3, further comprising forming a first spacer in the slit before forming the word line pick-up structures.

7. The method of claim 1, wherein forming the word line pick-up structures comprises:
   forming word line pick-up openings extending through the first dielectric layers and the remainders of the second dielectric layers in the second region of the stack structure at different depths to expose the remainders of the second dielectric layers in the second regions of the stack structure, respectively;
   replacing, through the word line pick-up openings, parts of the remainders of the second dielectric layers in the second region of the stack structure with interconnect lines, respectively, such that the interconnect lines are in contact with the conductive layers, respectively, in the second region of the stack structure; and
   forming vertical contacts in the word line pick-up openings in contact with the interconnect lines, respectively.

8. The method of claim 7, wherein forming the word line pick-up structures further comprises:
   forming a second spacer on sidewalls and a bottom of each of the word line pick-up openings;
   removing the second spacer on the bottom of the word line pick-up opening to expose the respective part of the remainder of the second dielectric layer; and
   forming a filler in the word line pick-up opening after forming the respective vertical contact.

9. The method of claim 8, wherein replacing the parts of the second dielectric layers with the interconnect lines comprises:
   etching the exposed part of the remainder of the second dielectric layer through the word line pick-up opening to expose the respective conductive layer in the second region of the stack structure; and
   depositing the respective interconnect line through the word line pick-up opening to be in contact with the exposed respective conductive layer in the second region of the stack structure.

10. The method of claim 9, wherein
   replacing all the second dielectric layers and the parts of the second dielectric layers with the conductive layers comprises depositing high dielectric constant (high-k) gate dielectric layers, such that the conductive layers are surrounded by the high-k gate dielectric layers, respectively; and
   replacing the parts of the second dielectric layers with the interconnect lines further comprises:
      etching the exposed part of the remainder of the second dielectric layer to expose the respective high-k gate dielectric layer;
      etching the exposed high-k gate dielectric layer to expose the respective conductive layer; and
      depositing the respective interconnect line to be in contact with the exposed respective conductive layer.

11. A method for forming a three-dimensional (3D) memory device, comprising:
   forming a stack structure comprising interleaved first dielectric layers and second dielectric layers;
   forming channel structures extending through the first dielectric layers and the second dielectric layers in a first region of the stack structure;
   forming word line pick-up structures extending through the first dielectric layers and the second dielectric layers in a second region of the stack structure at different depths; and
   replacing all the second dielectric layers in the first region and parts of the second dielectric layers in the second region of the stack structure with conductive layers, such that the conductive layers are electrically connected to the word line pick-up structures, respectively, in the second region of the stack structure.

12. The method of claim 11, further comprising forming dummy channel structures extending through the first dielectric layers and the second dielectric layers in the second region of the stack structure in a same process of forming the channel structures.

13. The method of claim 11, wherein forming the word line pick-up structures comprises:
   forming word line pick-up openings extending through the first dielectric layers and the second dielectric layers in the second region of the stack structure at different depths to expose the second dielectric layers in the second regions of the stack structure, respectively;
   replacing, through the word line pick-up openings, parts of the second dielectric layers in the second region of the stack structure with interconnect lines, respectively; and forming vertical contacts in the word line pick-up openings in contact with the interconnect lines, respectively.

14. The method of claim 13, wherein forming the word line pick-up structures further comprises:
   forming a second spacer on sidewalls and a bottom of each of the word line pick-up openings;
   removing the second spacer on the bottom of the word line pick-up opening to expose the respective part of the second dielectric layer; and
   forming a filler in the word line pick-up opening after forming the respective vertical contact.

15. The method of claim 14, wherein replacing the parts of the second dielectric layers with the interconnect lines comprises:
   etching the exposed part of the second dielectric layer through the word line pick-up opening; and
   depositing the respective interconnect line through the word line pick-up opening.

16. The method of claim 13, wherein replacing all the second dielectric layers and the parts of the second dielectric layers with the conductive layers comprises forming a slit extending through the first dielectric layers and the second dielectric layers and across the first region and the second region of the stack structure after forming the word line pick-up structures.

17. The method of claim 16, wherein replacing all the second dielectric layers and the parts of the second dielectric layers with the conductive layers further comprises:
   covering the slit in the second region of the stack structure;
   removing all the second dielectric layers in the first region of the stack structure through the slit in the first region of the stack structure;
   opening the slit in the second region of the stack structure;
   removing the parts of the second dielectric layers in the second region of the stack structure through the slit in the second region of the stack structure to expose the interconnect lines of the word line pick-up structures; and
   depositing the conductive layers through the slit in the first region and the second region of the stack structure to be in contact with the interconnect lines of the word line pick-up structures, respectively, in the second region of the stack structure.

18. The method of claim 16, wherein replacing all the second dielectric layers and the parts of the second dielectric layers with the conductive layers further comprises:
   covering the slit in the first region of the stack structure;
   removing the parts of the second dielectric layers in the second region of the stack structure through the slit in the second region of the stack structure to expose the interconnect lines of the word line pick-up structures;
   opening the slit in the first region of the stack structure;
   covering the slit in the second region of the stack structure;
   removing all the second dielectric layers in the first region of the stack structure through the slit in the first region of the stack structure;
   opening the slit in the second region of the stack structure; and
   depositing the conductive layers through the slit in the first region and the second region of the stack structure to be in contact with the interconnect lines of the word line pick-up structures, respectively, in the second region of the stack structure.

19. The method of claim 16, further comprising forming a first spacer in the slit after replacing all the second dielectric layers and the parts of the second dielectric layers with the conductive layers.

20. The method of claim 11, wherein forming the channel structures comprises sequentially forming a high dielectric constant (high-k) gate dielectric layer, a memory layer, and a channel layer.

* * * * *